(12) United States Patent
Miyauchi et al.

(10) Patent No.: US 7,388,525 B2
(45) Date of Patent: Jun. 17, 2008

(54) DECODING DEVICE AND METHOD, PROGRAM RECORDING MEDIUM, AND PROGRAM USING MODULATION CODE ENCODED IN ACCORDANCE WITH A VARIABLE LENGTH TABLE

(75) Inventors: Toshiyuki Miyauchi, Tokyo (JP); Yasuhiro Iida, Tokyo (JP); Yuji Shinohara, Tokyo (JP)

(73) Assignee: Sony Corporation, Tokyo (JP)

(*) Notice: Subject to any disclaimer, the term of this patent is extended or adjusted under 35 U.S.C. 154(b) by 272 days.

(21) Appl. No.: 10/532,858

(22) PCT Filed: Jul. 5, 2004

(86) PCT No.: PCT/JP2004/009877

§ 371 (c)(1),
(2), (4) Date: Nov. 21, 2005

(87) PCT Pub. No.: WO2005/022756

PCT Pub. Date: Mar. 10, 2005

(65) Prior Publication Data

US 2006/0120244 A1    Jun. 8, 2006

(30) Foreign Application Priority Data

Aug. 28, 2003  (JP) .............................. 2003-303963
Oct. 15, 2003  (JP) .............................. 2003-355532

(51) Int. Cl.
  *H03M 7/40*  (2006.01)
(52) U.S. Cl. ............................ 341/67; 341/50; 360/53
(58) Field of Classification Search ............ 341/50–70; 360/53, 40, 59.2; 714/752
See application file for complete search history.

(56) References Cited

U.S. PATENT DOCUMENTS

| 6,744,580 | B2* | 6/2004 | Hattori et al. ................. 360/40 |
| 6,798,593 | B2* | 9/2004 | Hattori et al. ................. 360/53 |
| 6,826,722 | B2* | 11/2004 | Miyauchi et al. ............ 714/752 |
| 7,196,999 | B2* | 3/2007 | Hattori et al. ............ 369/59.22 |
| 2001/0048564 | A1 | 12/2001 | Hattori et al. |
| 2001/0050889 | A1 | 12/2001 | Hattori et al. |

(Continued)

FOREIGN PATENT DOCUMENTS

EP  0 707 313 A2  4/1996

(Continued)

*Primary Examiner*—Lam T. Mai
(74) *Attorney, Agent, or Firm*—Sonnenschein Nath & Rosenthal LLP

(57) ABSTRACT

The present invention relates to a decoding apparatus and method, a program storage medium, and a program, which allow high-performance decoding of a modulation code encoded in accordance with a variable-length table. A 17PP-SISO decoder 181 performs SISO decoding on a signal supplied from a PR-SISO decoder 81 by using a Viterbi decoding algorithm or a BCJR decoding algorithm in accordance with a trellis represented by paths corresponding, in a one-to-one fashion, to overall transitions in an entire encoding process in accordance with an encoding table 201 of a 17PP code. A resultant SISO-decoded signal is supplied to a turbo decoder 84 via a deinterleaver 83. The turbo decoder 84 performs turbo decoding on the signal output from the 17PP-SISO decoder 181. The present invention can be applied to a recording/reproducing apparatus for recording/reproducing a signal on/from a storage medium such as a high-density optical disk.

11 Claims, 30 Drawing Sheets

U.S. PATENT DOCUMENTS

| | | |
|---|---|---|
| 2001/0052098 A1 | 12/2001 | Miyauchi et al. |
| 2002/0057640 A1 | 5/2002 | Hattori et al. |

FOREIGN PATENT DOCUMENTS

| | | |
|---|---|---|
| EP | 1 137 001 A1 | 9/2001 |
| EP | 1 137 002 A1 | 9/2001 |
| EP | 1 137 006 A2 | 9/2001 |
| EP | 1 143 440 A2 | 10/2001 |
| EP | 1 137 006 A3 | 12/2003 |
| JP | 08-167251 | 6/1996 |
| JP | 2000-68847 | 3/2000 |
| JP | 2001-266498 | 9/2001 |
| JP | 2001-266499 | 9/2001 |
| JP | 2001-266500 | 9/2001 |
| JP | 2001-266501 | 9/2001 |

* cited by examiner

FIG. 3

| PREVIOUS-TIME STATE | PREVIOUS-TIME OUTPUT | PREVIOUS-TIME INPUT | CURRENT-TIME OUTPUT | CURRENT-TIME INPUT | CURRENT-TIME STATE |
|---|---|---|---|---|---|
| S0 | 0 | 00 | 001 | 00 | S4 |
|  | 0 | 00 | 001 | 01 | S5 |
|  | 0 | 00 | 000 | 10 | S2 |
|  | 0 | 00 | 000 | 11 | S3 |
| S1 | 0 | 01 | 001 | 00 | S4 |
|  | 0 | 01 | 001 | 01 | S5 |
|  | 0 | 01 | 000 | 10 | S2 |
|  | 0 | 01 | 000 | 11 | S3 |
| S2 | 0 | 10 | 101 | 00 | S4 |
|  | 0 | 10 | 101 | 01 | S5 |
|  | 0 | 10 | 010 | 10 | S2 |
|  | 0 | 10 | 010 | 11 | S3 |
| S3 | 0 | 11 | 010 | 00 | S0 |
|  | 0 | 11 | 100 | 01 | S1 |
|  | 0 | 11 | 100 | 10 | S2 |
|  | 0 | 11 | 100 | 11 | S3 |
| S4 | 1 | 00 | 001 | 00 | S4 |
|  | 1 | 00 | 001 | 01 | S5 |
|  | 1 | 00 | 010 | 10 | S2 |
|  | 1 | 00 | 010 | 11 | S3 |
| S5 | 1 | 01 | 010 | 00 | S0 |
|  | 1 | 01 | 000 | 01 | S1 |
|  | 1 | 01 | 000 | 10 | S2 |
|  | 1 | 01 | 000 | 11 | S3 |

FIG. 6

| INPUT BIT STRING | OUTPUT BIT STRING | CONDITION |
|---|---|---|
| 00 00 00 00 | 010 100 100 100 | |
| 00 00 10 00 | 000 100 100 100 | |
| 00 00 00 | 010 100 000 | |
| 00 00 01 | 010 100 100 | |
| 00 00 10 | 000 100 000 | |
| 00 00 11 | 000 100 100 | |
| 00 01 | 000 100 | |
| 00 10 | 010 000 | |
| 00 11 | 010 100 | |
| 01 | 010 | |
| 10 | 001 | |
| 11 | 000 | FINAL PREVIOUS-TIME OUTPUT = 1 |
|  | 101 | FINAL PREVIOUS-TIME OUTPUT = 0 |

| INPUT BIT STRING TO BE REPLACED | BIT STRING OUTPUT AS A RESULT OF REPLACEMENT | CONDITION FOR REPLACEMENT |
|---|---|---|
| 11 01 11 | 001 000 000 | NEXT-TIME OUTPUT BIT STRING = 010 |

FIG. 7

| CURRENT-TIME STATE | CURRENT-TIME INPUT | NEXT-TIME STATE | CURRENT-TIME OUTPUT |
|---|---|---|---|
| S0 | 01 | S1 | 010 |
| S0 | 10 | S0 | 001 |
| S0 | 00 | S4 | 000 |
| S0 | 00 | S5 | 010 |
| S0 | 00 | S8 | 010 |
| S0 | 00 | S6 | 010 |
| S0 | 00 | S9 | 000 |
| S0 | 00 | S7 | 000 |
| S0 | 11 | S3 | 000 |
| S0 | 11 | S16 | 001 |
| S1 | 01 | S1 | 010 |
| S1 | 10 | S0 | 001 |
| S1 | 00 | S4 | 000 |
| S1 | 00 | S5 | 010 |
| S1 | 00 | S8 | 010 |
| S1 | 00 | S6 | 010 |
| S1 | 00 | S9 | 000 |
| S1 | 00 | S7 | 000 |
| S1 | 11 | S2 | 101 |
| S1 | 11 | S16 | 001 |
| S2 | 01 | S17 | 010 |
| S2 | 10 | S0 | 001 |
| S2 | 00 | S4 | 000 |
| S2 | 00 | S5 | 010 |
| S2 | 00 | S8 | 010 |
| S2 | 00 | S6 | 010 |
| S2 | 00 | S9 | 000 |
| S2 | 00 | S7 | 000 |
| S2 | 11 | S3 | 000 |
| S2 | 11 | S16 | 001 |

FIG. 8

| CURRENT-TIME STATE | CURRENT-TIME INPUT | NEXT-TIME STATE | CURRENT-TIME OUTPUT |
|---|---|---|---|
| S3 | 01 | S17 | 010 |
| S3 | 10 | S0 | 001 |
| S3 | 00 | S4 | 000 |
| S3 | 00 | S5 | 010 |
| S3 | 00 | S8 | 010 |
| S3 | 00 | S6 | 010 |
| S3 | 00 | S9 | 000 |
| S3 | 00 | S7 | 000 |
| S3 | 11 | S2 | 101 |
| S3 | 11 | S16 | 001 |
| S4 | 01 | S1 | 100 |
| S5 | 10 | S1 | 000 |
| S5 | 11 | S1 | 100 |
| S6 | 00 | S10 | 100 |
| S7 | 00 | S11 | 100 |
| S8 | 00 | S12 | 100 |
| S9 | 00 | S13 | 100 |
| S10 | 01 | S1 | 100 |
| S11 | 11 | S1 | 100 |
| S12 | 00 | S14 | 100 |
| S12 | 00 | S15 | 000 |
| S13 | 10 | S14 | 100 |
| S13 | 10 | S15 | 000 |
| S14 | 00 | S1 | 100 |
| S15 | 01 | S1 | 010 |
| S15 | 10 | S0 | 001 |
| S15 | 11 | S2 | 101 |
| S15 | 11 | S16 | 001 |
| S16 | 01 | S18 | 000 |

FIG. 9

| CURRENT-TIME STATE | CURRENT-TIME INPUT | NEXT-TIME STATE | CURRENT-TIME OUTPUT |
|---|---|---|---|
| S17 | 01 | S1  | 010 |
| S17 | 10 | S0  | 001 |
| S17 | 11 | S19 | 101 |
| S17 | 00 | S4  | 000 |
| S17 | 00 | S5  | 010 |
| S17 | 00 | S8  | 010 |
| S17 | 00 | S6  | 010 |
| S17 | 00 | S9  | 000 |
| S17 | 00 | S7  | 000 |
| S18 | 11 | S20 | 000 |
| S19 | 10 | S0  | 001 |
| S19 | 00 | S4  | 000 |
| S19 | 00 | S9  | 000 |
| S19 | 00 | S7  | 000 |
| S19 | 11 | S3  | 000 |
| S19 | 11 | S16 | 001 |
| S20 | 01 | S1  | 010 |
| S20 | 00 | S5  | 010 |
| S20 | 00 | S8  | 010 |
| S20 | 00 | S6  | 010 |

FIG. 12

| CURRENT-TIME STATE | CURRENT-TIME INPUT | NEXT-TIME STATE | CURRENT-TIME OUTPUT |
|---|---|---|---|
| S0 | 01 | S1 | 010 |
| S0 | 10 | S0 | 001 |
| S0 | 00 | S5 | 000 |
| S0 | 00 | S4 | 010 |
| S0 | 11 | S3 | 000 |
| S0 | 11 | S10 | 001 |
| S1 | 01 | S1 | 010 |
| S1 | 10 | S0 | 001 |
| S1 | 00 | S5 | 000 |
| S1 | 00 | S4 | 010 |
| S1 | 11 | S2 | 101 |
| S1 | 11 | S10 | 001 |
| S2 | 01 | S11 | 010 |
| S2 | 10 | S0 | 001 |
| S2 | 00 | S5 | 000 |
| S2 | 00 | S4 | 010 |
| S2 | 11 | S3 | 000 |
| S2 | 11 | S10 | 001 |
| S3 | 01 | S11 | 010 |
| S3 | 10 | S0 | 001 |
| S3 | 00 | S5 | 000 |
| S3 | 00 | S4 | 010 |
| S3 | 11 | S2 | 101 |
| S3 | 11 | S10 | 001 |
| S4 | 00 | S6 | 100 |
| S4 | 10 | S1 | 000 |
| S4 | 11 | S1 | 100 |

FIG. 13

| CURRENT-TIME STATE | CURRENT-TIME INPUT | NEXT-TIME STATE | CURRENT-TIME OUTPUT |
|---|---|---|---|
| S5 | 00 | S7 | 100 |
| S5 | 01 | S1 | 100 |
| S6 | 01 | S1 | 100 |
| S6 | 00 | S8 | 100 |
| S6 | 00 | S9 | 000 |
| S7 | 11 | S1 | 100 |
| S7 | 10 | S8 | 100 |
| S7 | 10 | S9 | 000 |
| S8 | 00 | S1 | 100 |
| S9 | 01 | S1 | 010 |
| S9 | 10 | S0 | 001 |
| S9 | 11 | S2 | 101 |
| S9 | 11 | S10 | 001 |
| S10 | 01 | S12 | 000 |
| S11 | 01 | S1 | 010 |
| S11 | 10 | S0 | 001 |
| S11 | 11 | S13 | 101 |
| S11 | 00 | S5 | 000 |
| S11 | 00 | S4 | 010 |
| S12 | 11 | S14 | 000 |
| S13 | 10 | S0 | 001 |
| S13 | 00 | S5 | 000 |
| S13 | 11 | S3 | 000 |
| S13 | 11 | S10 | 001 |
| S14 | 01 | S1 | 010 |
| S14 | 00 | S4 | 010 |

FIG. 22

| CURRENT-TIME STATE | CURRENT-TIME INPUT | NEXT-TIME STATE | CURRENT-TIME OUTPUT | CURRENT-TIME STATE | CURRENT-TIME INPUT | NEXT-TIME STATE | CURRENT-TIME OUTPUT |
|---|---|---|---|---|---|---|---|
| (0, 1) | 01 | (1, 3) | 0,2,0 | (1, 5) | 01 | (1, 3) | 6,4,0 |
| (0, 1) | 10 | (0, 4) | 0,4,4 | (1, 5) | 10 | (0, 4) | 6,6,4 |
| (0, 1) | 00 | (5, 5) | 0,4,6 | (1, 5) | 00 | (5, 5) | 6,6,6 |
| (0, 1) | 00 | (4, 3) | 0,2,0 | (1, 5) | 00 | (4, 3) | 6,4,0 |
| (0, 1) | 11 | (3, 5) | 0,4,6 | (1, 5) | 11 | (2, 1) | 4,0,-2 |
| (0, 1) | 11 | (10, 4) | 0,4,4 | (1, 5) | 11 | (10, 4) | 6,6,4 |
| (0, 4) | 01 | (1, 2) | 0,-2,0 | (2, 1) | 01 | (11, 3) | 0,2,0 |
| (0, 4) | 10 | (0, 1) | 0,-4,-4 | (2, 1) | 10 | (0, 4) | 0,4,4 |
| (0, 4) | 00 | (5, 0) | 0,-4,-6 | (2, 1) | 00 | (5, 5) | 0,4,6 |
| (0, 4) | 00 | (4, 2) | 0,-2,0 | (2, 1) | 00 | (4, 3) | 0,2,0 |
| (0, 4) | 11 | (3, 0) | 0,-4,-6 | (2, 1) | 11 | (3, 5) | 0,4,6 |
| (0, 4) | 11 | (10, 1) | 0,-4,-4 | (2, 1) | 11 | (10, 4) | 0,4,4 |
| (1, 0) | 01 | (1, 2) | -6,-4,0 | (2, 4) | 01 | (11, 2) | 0,-2,0 |
| (1, 0) | 10 | (0, 1) | -6,-6,-4 | (2, 4) | 10 | (0, 1) | 0,-4,-4 |
| (1, 0) | 00 | (5, 0) | -6,-6,-6 | (2, 4) | 00 | (5, 0) | 0,-4,-6 |
| (1, 0) | 00 | (4, 2) | -6,-4,0 | (2, 4) | 00 | (4, 2) | 0,-2,0 |
| (1, 0) | 11 | (2, 4) | -4,0,2 | (2, 4) | 11 | (3, 0) | 0,-4,-6 |
| (1, 0) | 11 | (10, 1) | -6,-6,-4 | (2, 4) | 11 | (10, 1) | 0,-4,-4 |
| (1, 2) | 01 | (1, 3) | 4,4,0 | (3, 0) | 01 | (11, 2) | -6,-4,0 |
| (1, 2) | 10 | (0, 4) | 4,6,4 | (3, 0) | 10 | (0, 1) | -6,-6,-4 |
| (1, 2) | 00 | (5, 5) | 4,6,6 | (3, 0) | 00 | (5, 0) | -6,-6,-6 |
| (1, 2) | 00 | (4, 3) | 4,4,0 | (3, 0) | 00 | (4, 2) | -6,-4,0 |
| (1, 2) | 11 | (2, 1) | 2,0,-2 | (3, 0) | 11 | (2, 4) | -4,0,2 |
| (1, 2) | 11 | (10, 4) | 4,6,4 | (3, 0) | 11 | (10, 1) | -6,-6,-4 |
| (1, 3) | 01 | (1, 2) | -4,-4,0 | (3, 5) | 01 | (11, 3) | 6,4,0 |
| (1, 3) | 10 | (0, 1) | -4,-6,-4 | (3, 5) | 10 | (0, 4) | 6,6,4 |
| (1, 3) | 00 | (5, 0) | -4,-6,-6 | (3, 5) | 00 | (5, 5) | 6,6,6 |
| (1, 3) | 00 | (4, 2) | -4,-4,0 | (3, 5) | 00 | (4, 3) | 6,4,0 |
| (1, 3) | 11 | (2, 4) | -2,0,2 | (3, 5) | 11 | (2, 1) | 4,0,-2 |
| (1, 3) | 11 | (10, 1) | -4,-6,-4 | (3, 5) | 11 | (10, 4) | 6,6,4 |

FIG. 23

| CURRENT-TIME STATE | CURRENT-TIME INPUT | NEXT-TIME STATE | CURRENT-TIME OUTPUT | CURRENT-TIME STATE | CURRENT-TIME INPUT | NEXT-TIME STATE | CURRENT-TIME OUTPUT |
|---|---|---|---|---|---|---|---|
| (4, 2) | 00 | (6, 0) | 2,0,-4 | (9, 5) | 10 | (0, 4) | 6,6,4 |
| (4, 2) | 10 | (1, 5) | 4,6,6 | (9, 5) | 11 | (2, 1) | 4,0,-2 |
| (4, 2) | 11 | (1, 0) | 2,0,-4 | (9, 5) | 11 | (10, 4) | 6,6,4 |
| (4, 3) | 00 | (6, 5) | -2,0,4 | (10, 1) | 01 | (12, 5) | 0,4,6 |
| (4, 3) | 10 | (1, 0) | -4,-6,-6 | (10, 4) | 01 | (12, 0) | 0,-4,-6 |
| (4, 3) | 11 | (1, 5) | -2,0,4 | (11, 2) | 01 | (1, 3) | 4,4,0 |
| (5, 0) | 00 | (7, 5) | -4,0,4 | (11, 2) | 10 | (0, 4) | 4,6,4 |
| (5, 0) | 01 | (1, 5) | -4,0,4 | (11, 2) | 11 | (13, 1) | 2,0,-2 |
| (5, 5) | 00 | (7, 0) | 4,0,-4 | (11, 2) | 00 | (5, 5) | 4,6,6 |
| (5, 5) | 01 | (1, 0) | 4,0,-4 | (11, 2) | 00 | (4, 3) | 4,4,0 |
| (6, 0) | 01 | (1, 5) | -4,0,4 | (11, 3) | 01 | (1, 2) | -4,-4,0 |
| (6, 0) | 00 | (8, 5) | -4,0,4 | (11, 3) | 10 | (0, 1) | -4,-6,-4 |
| (6, 0) | 00 | (9, 0) | -6,-6,-6 | (11, 3) | 11 | (13, 4) | -2,0,2 |
| (6, 5) | 01 | (1, 0) | 4,0,-4 | (11, 3) | 00 | (5, 0) | -4,-6,-6 |
| (6, 5) | 00 | (8, 0) | 4,0,-4 | (11, 3) | 00 | (4, 2) | -4,-4,0 |
| (6, 5) | 00 | (9, 5) | 6,6,6 | (12, 0) | 11 | (14, 0) | -6,-6,-6 |
| (7, 0) | 11 | (1, 5) | -4,0,4 | (12, 5) | 11 | (14, 5) | 6,6,6 |
| (7, 0) | 10 | (8, 5) | -4,0,4 | (13, 1) | 10 | (0, 4) | 0,4,4 |
| (7, 0) | 10 | (9, 0) | -6,-6,-6 | (13, 1) | 00 | (5, 5) | 0,4,6 |
| (7, 5) | 11 | (1, 0) | 4,0,-4 | (13, 1) | 11 | (3, 5) | 0,4,6 |
| (7, 5) | 10 | (8, 0) | 4,0,-4 | (13, 1) | 11 | (10, 4) | 0,4,4 |
| (7, 5) | 10 | (9, 5) | 6,6,6 | (13, 4) | 10 | (0, 1) | 0,-4,-4 |
| (8, 0) | 00 | (1, 5) | -4,0,4 | (13, 4) | 00 | (5, 0) | 0,-4,-6 |
| (8, 5) | 00 | (1, 0) | 4,0,-4 | (13, 4) | 11 | (3, 0) | 0,-4,-6 |
| (9, 0) | 01 | (1, 2) | -6,-4,0 | (13, 4) | 11 | (10, 1) | 0,-4,-4 |
| (9, 0) | 10 | (0, 1) | -6,-6,-4 | (14, 0) | 01 | (1, 2) | -6,-4,0 |
| (9, 0) | 11 | (2, 4) | -4,0,2 | (14, 0) | 00 | (4, 2) | -6,-4,0 |
| (9, 0) | 11 | (10, 1) | -6,-6,-4 | (14, 5) | 01 | (1, 3) | 6,4,0 |
| (9, 5) | 01 | (1, 3) | 6,4,0 | (14, 5) | 00 | (4, 3) | 6,4,0 |

FIG. 28

| CURRENT-TIME STATE | CURRENT-TIME INPUT | NEXT-TIME STATE | CURRENT-TIME OUTPUT | CURRENT-TIME STATE | CURRENT-TIME INPUT | NEXT-TIME STATE | CURRENT-TIME OUTPUT |
|---|---|---|---|---|---|---|---|
| (0, 1) | 01 | (1, 0) | 2,2,-2 | (3, 0) | 01 | (11, 3) | -4,-2,2 |
| (0, 1) | 10 | (0, 2) | 2,4,2 | (3, 0) | 10 | (0, 1) | -4,-4,-2 |
| (0, 1) | 00 | (5, 3) | 2,4,4 | (3, 0) | 00 | (5, 0) | -4,-4,-4 |
| (0, 1) | 00 | (4, 0) | 2,2,-2 | (3, 0) | 00 | (4, 3) | -4,-2,2 |
| (0, 1) | 11 | (3, 3) | 2,4,4 | (3, 0) | 11 | (2, 2) | -2,2,2 |
| (0, 1) | 11 | (10, 2) | 2,4,2 | (3, 0) | 11 | (10, 1) | -4,-4,-2 |
| (0, 2) | 01 | (1, 3) | -2,-2,2 | (3, 3) | 01 | (11, 0) | 4,2,-2 |
| (0, 2) | 10 | (0, 1) | -2,-4,-2 | (3, 3) | 10 | (0, 2) | 4,4,2 |
| (0, 2) | 00 | (5, 0) | -2,-4,-4 | (3, 3) | 00 | (5, 3) | 4,4,4 |
| (0, 2) | 00 | (4, 3) | -2,-2,2 | (3, 3) | 00 | (4, 0) | 4,2,-2 |
| (0, 2) | 11 | (3, 0) | -2,-4,-4 | (3, 3) | 11 | (2, 1) | 2,-2,-2 |
| (0, 2) | 11 | (10, 1) | -2,-4,-2 | (3, 3) | 11 | (10, 2) | 4,4,2 |
| (1, 0) | 01 | (1, 3) | -4,-2,2 | (4, 0) | 00 | (6, 3) | -2,2,4 |
| (1, 0) | 10 | (0, 1) | -4,-4,-2 | (4, 0) | 10 | (1, 0) | -4,-4,-4 |
| (1, 0) | 00 | (5, 0) | -4,-4,-4 | (4, 0) | 11 | (1, 3) | -2,2,4 |
| (1, 0) | 00 | (4, 3) | -4,-2,2 | (4, 3) | 00 | (6, 0) | 2,-2,-4 |
| (1, 0) | 11 | (2, 2) | -2,2,2 | (4, 3) | 10 | (1, 3) | 4,4,4 |
| (1, 0) | 11 | (10, 1) | -4,-4,-2 | (4, 3) | 11 | (1, 0) | 2,-2,-4 |
| (1, 3) | 01 | (1, 0) | 4,2,-2 | (5, 0) | 00 | (7, 3) | -2,2,4 |
| (1, 3) | 10 | (0, 2) | 4,4,2 | (5, 0) | 01 | (1, 3) | -2,2,4 |
| (1, 3) | 00 | (5, 3) | 4,4,4 | (5, 3) | 00 | (7, 0) | 2,-2,-4 |
| (1, 3) | 00 | (4, 0) | 4,2,-2 | (5, 3) | 01 | (1, 0) | 2,-2,-4 |
| (1, 3) | 11 | (2, 1) | 2,-2,-2 | (6, 0) | 01 | (1, 3) | -2,2,4 |
| (1, 3) | 11 | (10, 2) | 4,4,2 | (6, 0) | 00 | (8, 3) | -2,2,4 |
| (2, 1) | 01 | (11, 0) | 2,2,-2 | (6, 0) | 00 | (9, 0) | -4,-4,-4 |
| (2, 1) | 10 | (0, 2) | 2,4,2 | (6, 3) | 01 | (1, 0) | 2,-2,-4 |
| (2, 1) | 00 | (5, 3) | 2,4,4 | (6, 3) | 00 | (8, 0) | 2,-2,-4 |
| (2, 1) | 00 | (4, 0) | 2,2,-2 | (6, 3) | 00 | (9, 3) | 4,4,4 |
| (2, 1) | 11 | (3, 3) | 2,4,4 | (7, 0) | 11 | (1, 3) | -2,2,4 |
| (2, 1) | 11 | (10, 2) | 2,4,2 | (7, 0) | 10 | (8, 3) | -2,2,4 |
| (2, 2) | 01 | (11, 3) | -2,-2,2 | (7, 0) | 10 | (9, 0) | -4,-4,-4 |
| (2, 2) | 10 | (0, 1) | -2,-4,-2 | (7, 3) | 11 | (1, 0) | 2,-2,-4 |
| (2, 2) | 00 | (5, 0) | -2,-4,-4 | (7, 3) | 10 | (8, 0) | 2,-2,-4 |
| (2, 2) | 00 | (4, 3) | -2,-2,2 | (7, 3) | 10 | (9, 3) | 4,4,4 |
| (2, 2) | 11 | (3, 0) | -2,-4,-4 | (8, 0) | 00 | (1, 3) | -2,2,4 |
| (2, 2) | 11 | (10, 1) | -2,-4,-2 | (8, 3) | 00 | (1, 0) | 2,-2,-4 |

FIG. 29

| CURRENT-TIME STATE | CURRENT-TIME INPUT | NEXT-TIME STATE | CURRENT-TIME OUTPUT |
|---|---|---|---|
| (9, 0) | 01 | (1, 3) | -4,-2,2 |
| (9, 0) | 10 | (0, 1) | -4,-4,-2 |
| (9, 0) | 11 | (2, 2) | -2,2,2 |
| (9, 0) | 11 | (10, 1) | -4,-4,-2 |
| (9, 3) | 01 | (1, 0) | 4,2,-2 |
| (9, 3) | 10 | (0, 2) | 4,4,2 |
| (9, 3) | 11 | (2, 1) | 2,-2,-2 |
| (9, 3) | 11 | (10, 2) | 4,4,2 |
| (10, 1) | 01 | (12, 3) | 2,4,4 |
| (10, 2) | 01 | (12, 0) | -2,-4,-4 |
| (11, 0) | 01 | (1, 3) | -4,-2,2 |
| (11, 0) | 10 | (0, 1) | -4,-4,-2 |
| (11, 0) | 11 | (13, 2) | -2,2,2 |
| (11, 0) | 00 | (5, 0) | -4,-4,-4 |
| (11, 0) | 00 | (4, 3) | -4,-2,2 |
| (11, 3) | 01 | (1, 0) | 4,2,-2 |
| (11, 3) | 10 | (0, 2) | 4,4,2 |
| (11, 3) | 11 | (13, 1) | 2,-2,-2 |
| (11, 3) | 00 | (5, 3) | 4,4,4 |
| (11, 3) | 00 | (4, 0) | 4,2,-2 |
| (12, 0) | 11 | (14, 0) | -4,-4,-4 |
| (12, 3) | 11 | (14, 3) | 4,4,4 |
| (13, 1) | 10 | (0, 2) | 2,4,2 |
| (13, 1) | 00 | (5, 3) | 2,4,4 |
| (13, 1) | 11 | (3, 3) | 2,4,4 |
| (13, 1) | 11 | (10, 2) | 2,4,2 |
| (13, 2) | 10 | (0, 1) | -2,-4,-2 |
| (13, 2) | 00 | (5, 0) | -2,-4,-4 |
| (13, 2) | 11 | (3, 0) | -2,-4,-4 |
| (13, 2) | 11 | (10, 1) | -2,-4,-2 |
| (14, 0) | 01 | (1, 3) | -4,-2,2 |
| (14, 0) | 00 | (4, 3) | -4,-2,2 |
| (14, 3) | 01 | (1, 0) | 4,2,-2 |
| (14, 3) | 00 | (4, 0) | 4,2,-2 |

DECODING DEVICE AND METHOD, PROGRAM RECORDING MEDIUM, AND PROGRAM USING MODULATION CODE ENCODED IN ACCORDANCE WITH A VARIABLE LENGTH TABLE

TECHNICAL FIELD

The present invention relates to a decoding apparatus and method, a program storage medium, and a program, and more particularly to a decoding apparatus and method, a program storage medium, and a program, which allow high-performance decoding of a modulation code encoded in accordance with a variable-length table.

BACKGROUND ART

When a signal is recorded on a storage medium such as a magnetic disk or an optical disk, the signal is modulation-encoded before it is recorded such that when the recorded signal is reproduced, the amplitude of the read signal can be controlled and a clock signal can be correctly reproduced. In the reproduction process, the original waveform is reproduced taking into account the fact that the signal reproduced from a medium is influenced by an immediately previous signal, and most likelihood data is determined from the reproduced signal on the basis of the characteristic of the recorded signal by means of a PRML (Partial Response Maximum-Likelihood) scheme or the like.

FIG. 1 shows an example of a conventional recording/reproducing apparatus 1 using the PRML technique. The recording/reproducing apparatus 1 includes a modulation encoder 11, a PR communication channel 12, and decoder 13.

The modulation encoder 11 includes an encoding table 41-1 of modulation codes used in encoding of an input signal under a particular restriction. The modulation encoder 11 encodes an input signal into a particular modulation code in accordance with the encoding table 41-1 and outputs a resultant encoded signal produced under the particular restriction to a PR (Partial Response) communication channel 12. A specific example of the restriction is a DC free restriction. Use of the DC free restriction causes numbers of occurrences of 0s and 1s to become substantially equal for a sufficiently long period. Another example of the restriction is a (d, k) restriction that requires that the minimum and maximum numbers of successive 0s be d and k, respectively.

The PR communication channel 12 includes a recording/reproducing unit 21 and an equalizer 22. In the PR communication channel 12, recording/reproducing is performed, for example, in a PR2 (Partial Response Class 2) recording/reproducing channel. The recording/reproducing unit 21 converts the encoded signal received from the modulation encoder 11 into a NRZI (non return to zero inverted) coded signal and stores the resultant NRZI-coded signal on a storage medium mounted on or embedded in the recording/reproducing unit 21 by means of a mark edge recording method. On the other hand, in the reproduction operation, the recording/reproducing unit 21 reads the encoded signal from the storage medium via the PR-2 channel and supplies the read encoded signal to the equalizer 22. The equalizer 22 performs PR equalization using waveform interference on the received encoded signal so as to achieve a target equalization characteristic. The resultant equalized signal is supplied to the decoder 13.

The decoder 13 includes a PR-Viterbi decoder 31 and a modulation decoder 32 and serves to decode the signal supplied from the equalizer 22. From the signal received from the PR communication channel 12, the PR-Viterbi decoder 31 determines, based on NRZI encoding and the PR-2 channel, the trellis representation indicating time-to-time state transitions associated with the encoding process and performs Viterbi decoding in accordance with the determined trellis representation of the NRZI encoding and the PR-2 channel. A resultant Viterbi-decoded signal to the modulation decoder 32. The modulation decoder 32 includes an encoding table 41-2 that is the same as the encoding table 41-1 disposed in the modulation encoder 11 (hereinafter, encoding tables 41-1 and 41-2 will be generically referred to as encoding tables 41, if it is not necessary to distinguish them from each other). The modulation decoder 32 performs modulation decoding on the signal supplied from the PR-Viterbi decoder 31 and outputs a resultant modulation-decoded signal to a following stage (not shown).

In recent years, it has become popular to use a high-performance error-correction code such as a turbo code or an LDPC (Low Density Parity Check) code in various applications of communications and broadcasting. There is an increasing need for using such a high-performance error-correction code also in applications associated with storage media. For example, when a turbo code is used in the recording/reproducing apparatus 1 described above, a turbo encoder is additionally disposed at a stage in front of the modulation encoder 11, and a turbo decoder for decoding the turbo code is additionally disposed at a stage following the modulation decoder 32. In this structure, not only information taking a value of 0 or 1 (hard information but also information (soft information or soft decision information) indicating the degree of likelihood of the hard information is input to the turbo decoder located at the stage following the modulation decoder 32. That is, it is necessary that soft input be supplied to the decoder of the turbo code or the LDPC code. This means that when a modulation code is decoded by the modulation decoder 32 located at the stage in front of the turbo encoder or the LDPC encoder, it is necessary to determine soft output.

In general, a soft output associated with a code is determined by using a trellis representation indicating time-sequential transitions corresponding to a state transition table indicating a time-to-time encoding process by means of a BCJR (Bhal-Cocke-Jeinek-Raviv) algorithm or a SOVA (Soft-Output Viterbi Algorithm). The trellis representation can be easily determined when an input signal is decoded using a convolution code. However, when decoding is performed using a non-linear modulation code, it is not necessarily easy to determine the trellis representation. Recent researches have revealed that a trellis representation is possible for some types of modulation codes using a simple encoding table, such as a (1, 7) RLL (Run Length Limited) code (according to the standard of ECMA (Electronic Computer Manufacturers Association)-195) used in recording/reproducing on or from a magnetooptical disk, and thus a turbo decoder may be concatenated with a modulation decoder using a (1, 7) RLL code ("Turbo Decoding with Run Length Limited Code for Optical Stage" (E. Yamada et al., The Japan Society of Applied Physics, Vol. 41, pp. 1753-1756, March, 2002 (hereinafter referred to as Non-Patent Document 1). In RLL codes, the number of "0s" between a "1" and a next "1" in a modulation code is limited, and a particular RLL code with a minimum run length d indicating the minimum number of "0s" between adjacent "1s" and a maximum run length k is represented by (d, k)RLL.

FIG. 2 shows an example of a configuration of a conventional recording/reproducing apparatus 51 using an RLL code concatenated with a turbo code. In this example shown in FIG. 2, the modulation encoder 11 shown in FIG. 1 is replaced with an encoder 61 and the decoder 13 is replaced with a decoder 62. FIGS. 1 and 2 will also be referred to when the present invention is described later.

The encoder 61 includes a turbo encoder 71, an interleaver 72, and an RLL (Run Length Limited) encoder 73. The turbo encoder 71 includes an element encoder 91, an interleaver 92, an element encoder 93, and a decimator 94. The turbo encoder 71 performs turbo encoding on an input signal and supplies a resultant turbo-coded signal to the interleaver 72.

A signal input from the outside is simultaneously applied to the element encoder 91 and the interleaver 92. The element encoder 91 generates a parity bit string 1 from the input signal and supplies the resultant parity bit string 1 to the decimator 94. The interleaver 92 interleaves the signal that was also input to the element encoder 91 and supplies a resultant interleaved signal to the element encoder 93. The element encoder 93 generates a parity bit string 2 from the interleaved signal supplied from the interleaver 92 and supplies the resultant parity bit string 1 to the decimator 94. The decimator 94 decimates the parity bit string 1 and the parity bit string 2 and multiplexes the resultant decimated parity string 1 and parity bit string 2 thereby generating a turbo-coded signal. The resultant turbo-coded signal is supplied to the interleaver 72.

The interleaver 72 interleaves a turbo-coded signal supplied from the turbo encoder 71 and supplies the resultant interleaved signal to the RLL encoder 73. The PLL encoder 73 has a (1, 7) RLL encoding table 101. The PLL encoder 73 performs (1, 7) RLL encoding on the signal received from the interleaver 72 in accordance with the RLL encoding table 101 and outputs the resultant signal over the PR communication channel 12.

The decoder 62 includes a PR-SISO (Soft-Input Soft-Output) decoder 81, an RLL-SISO decoder 82, a deinterleaver 83, and a turbo decoder 84, and serves to decode the signal supplied from the equalizer 22. From the signal received from the PR communication channel 12, the PR-SISO decoder 81 determines, based on NRZI encoding and the PR-2 channel, the trellis representation indicating time-sequential state transitions in the time-to-time encoding process represented in the state transition table and then performs SISO (Soft-Input Soft-Output) decoding based on the determined trellis representation of the NRZI encoding and the PR-2 channel. The resultant SISO-decoded signal (soft information) is supplied to the RLL-SISO decoder 82.

The RLL-SISO decoder 82 determines, based on (1, 7) RLL encoding table 101 disposed in the PLL encoder 73, the trellis representation indicating time-sequential state transitions in the time-to-time encoding process represented in the state transition table and performs SISO decoding on the signal received from PR-SISO decoder 81 in accordance with the determined trellis representation of (1, 7) RLL. The resultant SISO-decoded signal is supplied to the deinterleaver 83.

Referring to FIGS. 3 and 4, a trellis representation of (1, 7) RLL encoding is described below. FIG. 3 shows an example of a state transition table of (1, 7) RLL encoding, and FIG. 4 shows an example of a trellis representation, that is, a representation of time-sequential transitions indicated in the state transition table shown in FIG. 3. In the example shown in FIG. 3, the state transition table represents an encoding process in a period from a current time and a next time. In this state transition table shown in FIG. 3, for a better understanding, state information indicating "previous-time state" and "current-time state" are added to the (1, 7) RLL encoding table 101.

In the state transition table shown in FIG. 3, previous-time state", "previous-time output", "previous-time input", "current-time output", "current-time input", and "current-time state" are described from right to left in each row, and from top to bottom, a transition from a "previous-time state" of S0 in which the "previous-time output" is 0 and the "previous-time input" is 00, a transition from a "previous-time state" of S1 in which the "previous-time output" is 0 and the "previous-time input" is 01, a transition from a "previous-time state" of S2 in which the "previous-time output" is 0 and the "previous-time input" is 10, a transition from a "previous-time state" of S3 in which the "previous-time output" is 0 and the "previous-time input" is 11, a transition from a "previous-time state" of S4 in which the "previous-time output" is 1 and the "previous-time input" is 00, and a transition from a "previous-time state" of S5 in which the "previous-time output" is 1 and the "previous-time input" is 01, are described.

In the trellis representation shown in FIG. 4, circles on the left-hand side indicate "states at the previous time" shown in FIG. 3, arrows indicate transitions from the respective "states at the previous time" to "states at the current time", symbols to the right and left of a slash of each label on each arrow indicate a corresponding "current-time input" and "current-time output" shown in FIG. 3, circles to the right of the heads of respective arrows indicate "states at the current time" shown in FIG. 3.

Thus, in the examples shown in FIGS. 3 and 4, when the "state at the previous time" is S0, a transition occurs depending on the given input as follows. If 00 is input as the "input at the current time" then the "output at the current time" is given by 001 and the "state at the current time" becomes S4. If 01 is input as the "input at the current time" then the "output at the current time" is given by 001 and the "state at the current time" becomes 5. If 10 is input as the "input at the current time" then the "output at the current time" is given by 000 and the "state at the current time" becomes S2. If 11 is input as the "input at the current time" then the "output at the current time" is given by 000 and the "state at the current time" becomes S3. When the state at the previous time is S1, a transition occurs depending on the given input as follows. If 00 is input as the "input at the current time" then the "output at the current time" is given by 001 and the "state at the current time" becomes S4. If 01 is input as the "input at the current time" then the "output at the current time" is given by 001 and the "state at the current time" becomes S5. If 10 is input as the "input at the current time" then the "output at the current time" is given by 000 and the "state at the current time" becomes S2. If 11 is input as the "input at the current time" then the "output at the current time" is given by 000 and the "state at the current time" becomes S3.

When the state at the previous time is S2, a transition occurs depending on the given input as follows. If 00 is input as the "input at the current time" then the "output at the current time" is given by 101 and the "state at the current time" becomes S4. If 01 is input as the "input at the current time" then the "output at the current time" is given by 101 and the "state at the current time" becomes S5. If 10 is input as the "input at the current time" then the "output at the current time" is given by 010 and the "state at the current time" becomes S2. If 11 is input as the "input at the current time" then the "output at the current time" is given by 010 and the "state at the current time" becomes S3. When the state at the previous time is S3, a transition occurs depending on the given input as follows. If 00 is input as the "input at the current time" then the "output at the current time" is given by 010 and the "state at the current time" becomes S0. If 01 is input as the "input at the current time" then the "output at the current time" is given by 100 and the "state at the current time" becomes S1. If 10 is input as the "input at the current time" then the "output at the current time" is given by 100 and the "state at the current time" becomes S2. If 11 is input as the "input at the current time" then the "output at the current time" is given by 100 and the "state at the current time" becomes S3.

When the state at the previous time is S4, a transition occurs depending on the given input as follows. If 00 is input as the "input at the current time" then the "output at the current time" is given by 001 and the "state at the current time" becomes S4. If 01 is input as the "input at the current time" then the "output at the current time" is given by 001 and the "state at the current time" becomes S5. If 10 is input as the "input at the current time" then the "output at the current time" is given by 010 and the "state at the current time" becomes S2. If 11 is input as the "input at the current time" then the "output at the current time" is given by 010 and the "state at the current time" becomes S3. When the state at the previous time is S5, a transition occurs depending on the given input as follows. If 00 is input as the "input at the current time" then the "output at the current time" is given by 010 and the "state at the current time" becomes S0. If 01 is input as the "input at the current time" then the "output at the current time" is given by 000 and the "state at the current time" becomes S1. If 10 is input as the "input at the current time" then the "output at the current time" is given by 000 and the "state at the current time" becomes S2. If 11 is input as the "input at the current time" then the "output at the current time" is given by 000 and the "state at the current time" becomes S3.

As described above, in the trellis representation (state transition table) of the (1, 7) RLL encoding, possible transitions at a particular time are represented for respective six states S0 to S5. In any state, if an input signal is given, an output signal is uniquely determined. Thus, the RLL-SISO decoder 82 can correctly perform SISO decoding in accordance with the (1, 7) RLL trellis representation.

Referring again to FIG. 2, the RLL-SISO decoder 82 supplies the SISO-decoded signal to the deinterleaver 83. The deinterleaver 83 deinterleaves the signal supplied from the RLL-SISO decoder 82 in a manner reverse to the interleaving performed by the interleaver 72, and the deinterleaver 83 supplies the resultant deinterleaved signal to the turbo decoder 84.

The turbo decoder 84 includes an interpolator 111, an element decoder 112, an interleaver 113, an element decoder 114, and a deinterleaver 115. The turbo decoder 84 performs turbo decoding on the signal (soft information) received from the deinterleaver 83 and outputs a resultant decoded signal to the outside (not shown). The interpolator 111 performs interpolation on the signal received from the deinterleaver 83 and supplies a resultant signal to the element decoder 112 and the element decoder 114. The element decoder 112 performs SISO decoding on the signal received from the interpolator 111 and supplies the resultant SISO-decoded signal together with reliability information to the element decoder 114 via the interleaver 113. The element decoder 114 performs SISO decoding on the signal received from the interpolator 111 by using the reliability information received from the element decoder 112. The resultant SISO-decoded signal and reliability information are supplied to the element decoder 112 via the deinterleaver 115. The above element decoding process is iterated several times. After the iteration of the element decoding process, the element decoder 114 performs a final decision and outputs a decision result to a following stage (not shown).

Note that the BCJR algorithm or the SOVA is used in the SISO decoding in the PR-SISO decoder 81, the RLL-SISO decoder 82, the element decoder 112 and the element decoder 114 shown in FIG. 2.

In the recording/reproducing apparatus 51, as described above, the RLL-SISO decoder 82 determines the trellis representation of (1, 7) RLL encoding in accordance with the (1, 7) RLL encoding table 101, and soft information is easily obtained. This allows the turbo decoder 84 to be located at the stage following the RLL-SISO decoder 82.

In recent years, a 17PP (Parity Preserve/Prohibit RMTR (Repeated Minimum Transition Runlength) code has been used in recording/reproducing on high-density optical disks. In the 17PP code, a complicated variable-length encoding table is used, as described, for example in U.S. Pat. No. 6,496,541B1.

In the variable-length encoding table associated with the 17PP code, the bit length of an "input" is not fixed unlike in the (1, 7) RLL code in which the input has a fixed bit length such as "00" or "01". This means that when an "input" such as 00 is given, an "output" is not necessarily uniquely determined. Thus, unlike the (1, 7) RLL code, it is difficult to determine the trellis representation of the 17PP code from the variable-length encoding table of the 17PP code, because the bit length of the input is not fixed. Even if it is possible to determine the trellis representation directly from the state transition table indicting time-to-time encoding process, the resultant trellis representation becomes very complicated and includes a huge number of states. Thus, SISO decoding of a modulation code using a variable-length table such as a 17PP code is practically impossible.

DISCLOSURE OF INVENTION

In view of the above, it is an object of the present invention to improve decoding performance of a modulation code encoded in accordance with a variable-length table.

The present invention provides a decoding apparatus comprising code input means for inputting a modulation code, and decoding means for decoding the modulation code input via the code input means, wherein the decoding means decodes the modulation code on the basis of a modulation code trellis represented by paths corresponding in a one-to-one fashion to overall state transitions in the encoding process of the modulation code in accordance with the variable-length table.

The modulation code may be a 17PP (Parity Preserve/ Prohibit Repeated Minimum Transition Runlength) modulation code.

The decoding means may perform the decoding using a soft input.

The decoding means may perform the decoding using a soft-decision Viterbi algorithm.

The decoding means may perform soft output decoding.

The decoding means may perform the decoding using a BCJR (Bahl-Cocke-Jeinek-Raviv) algorithm.

The decoding means may perform the decoding using a SOVA (Soft-Output Viterbi Algorithm).

The code input means may input a PR (Partial Response)-equalized modulation code, and the decoding means may decode the modulation code in accordance with a combined trellis obtained by combining a PR trellis and a modulation code trellis.

The present invention also provides a decoding method comprising the steps of inputting a modulation code, and decoding the modulation code input in the code input step, wherein in the decoding step, the modulation code is decoded based on a modulation code trellis represented by paths corresponding in a one-to-one fashion to overall state transitions in the encoding process of the modulation code in accordance with the variable-length table.

The present invention also provides a program storage including a program stored therein, the program including the steps of inputting a modulation code, and decoding the modulation code input in the code input step, wherein in the decoding step, the modulation code is decoded based on a modulation code trellis represented by paths corresponding in a one-to-one fashion to overall state transitions in the encoding process of the modulation code in accordance with the variable-length table.

The present invention also provides a program comprising the steps of inputting a modulation code, and decoding the modulation code input in the code input step, wherein in the decoding step, the modulation code is decoded based on a modulation code trellis represented by paths corresponding in a one-to-one fashion to overall state transitions in the encoding process of the modulation code in accordance with the variable-length table.

In the present invention, as described above, the modulation code is decoded based on the modulation code trellis represented by paths corresponding in a one-to-one fashion to overall state transitions in the encoding process of the modulation code in accordance with the variable-length table.

The decoding apparatus may be a decoding apparatus in an independent form or may be a block responsible for decoding disposed in a recording/reproducing apparatus or a communication device.

BRIEF DESCRIPTION OF THE DRAWINGS

FIG. 3 is a diagram showing an example of a state transition table used in the recording/reproducing apparatus shown in FIG. 2;

FIG. 6 is a diagram showing an example of an encoding table used in the recording/reproducing apparatus shown in FIG. 5;

FIG. 7 is a diagram showing an example of a state transition table corresponding to the encoding table shown in FIG. 6;

FIG. 8 is a diagram showing another example of a state transition table corresponding to the encoding table shown in FIG. 6;

FIG. 9 is a diagram showing still another example of a state transition table corresponding to the encoding table shown in FIG. 6;

FIG. 12 is a diagram showing another example of a state transition table corresponding to the encoding table shown in FIG. 6;

FIG. 13 is a diagram showing another example of a state transition table corresponding to the encoding table shown in FIG. 6;

FIG. 22 is a diagram showing a state transition table indicating, in the form of a table, a combined trellis representation of a 17PP code and a PR1221 channel;

FIG. 23 is a diagram showing a state transition table indicating, in the form of a table, a combined trellis representation of a 17PP code and a PR1221 channel;

FIG. 28 is a diagram showing a state transition table indicating, in the form of a table, a combined trellis representation of a 17PP code and a PR121 channel;

FIG. 29 is a diagram showing a state transition table indicating, in the form of a table, a combined trellis representation of a 17PP code and a PR121 channel.

BEST MODE FOR CARRYING OUT THE INVENTION

Embodiments of the present invention are described below with reference to the drawings.

Figure 5:
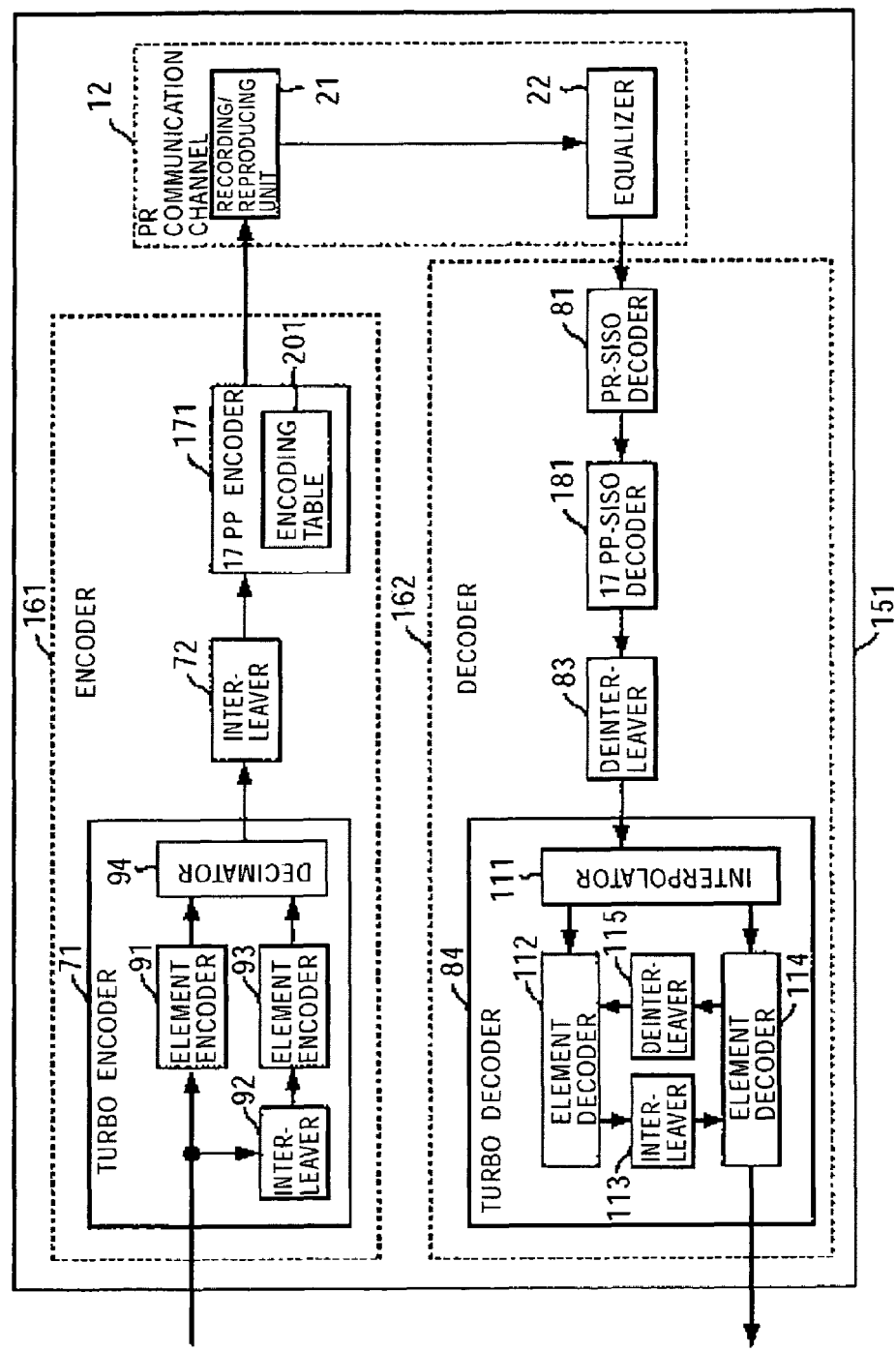
FIG. 5 is a block diagram showing an embodiment of a recording/reproducing apparatus according to the present invention.

FIG. 5 shows an embodiment of a recording/reproducing apparatus 151 according to the present invention. The recording/reproducing apparatus 151 records and reproduces a signal on or from a storage medium such as an optical disk by using a 17PP (Parity Preserve/Prohibit RMTR (Repeated Minimum Transition Runlength)) code as a modulation code.

Figure 2:
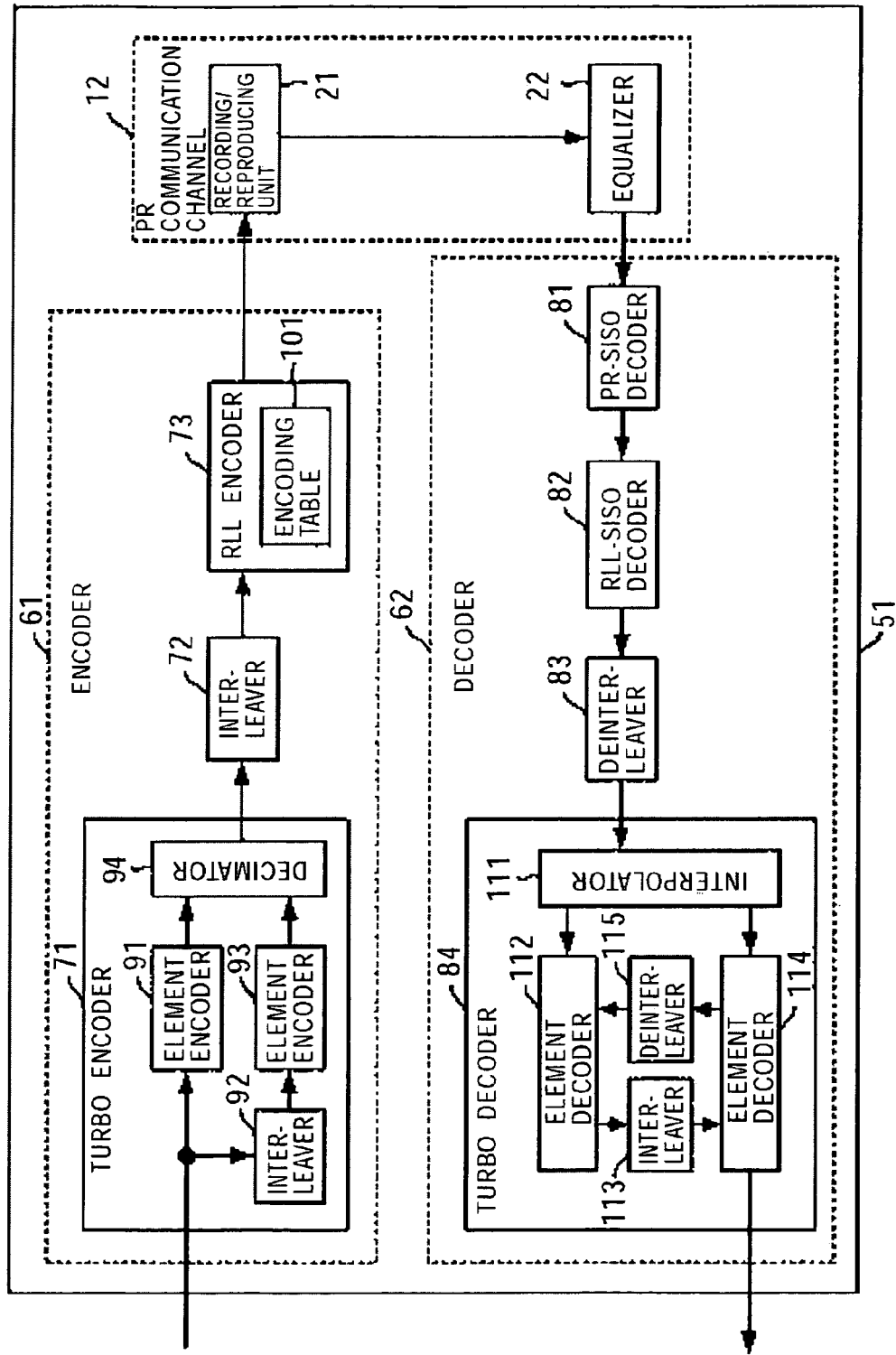
FIG. 2 is a block diagram showing another example of a conventional recording/reproducing apparatus.
Figure 4:
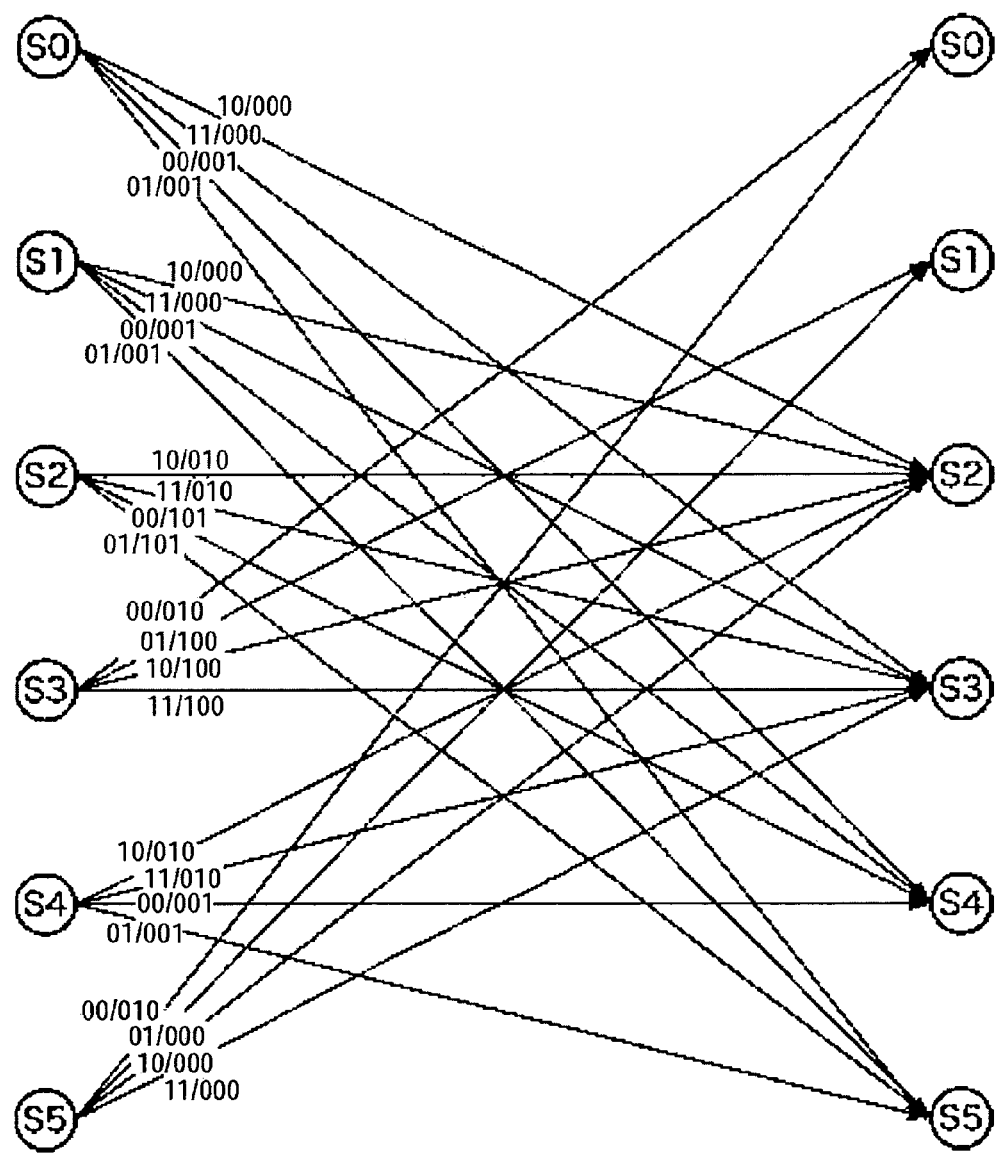
FIG. 4 is a diagram showing an example of a trellis representation corresponding to the state transition table shown in FIG. 3.

In FIG. 5, similar parts to those in FIG. 2 are denoted by similar reference symbols and a duplicate description thereof is omitted.

The encoder 161 and the decoder 162 of the recording/reproducing apparatus 151 shown in FIG. 5 are similar to the encoder 61 and the decoder 62, respectively, of the recording/reproducing apparatus 51 described above with reference to FIG. 2 except that the encoder 161 has a 17PP encoder 171 instead of the RLL encoder 73 and the decoder 162 has a 17PP-SISO decoder 181 instead of the RLL-SISO decoder 82.

In this recording/reproducing apparatus 151 having the above-described structure, the interleaver 72 interleaves a turbo-coded signal supplied from the turbo encoder 71 and supplies the resultant interleaved signal to the 17PP encoder 171. The 17PP encoder 171 has an encoding table 201 associated with the variable-length 17PP code such as that shown in FIG. 6. The 17PP encoder 171 performs 17PP encoding on a signal received from the interleaver 72 in accordance with the 17PP encoding table 201 and outputs the resultant signal over the PR communication channel 12.

FIG. 6 shows an example of a 17PP encoding table 201. In the example shown in FIG. 6, the 17PP encoding table 201 includes an encoding table 211 for use in normal encoding and an encoding table 212 for use in replacement.

In the encoding table 211 for use in the normal encoding, an "input bit string", an "output bit string", and a "condition" are described from left to right in each row. The condition is applied only to a case in which the input bit string is "11", as described in the bottom row.

The encoding table 211 describes from the top row to the bottom row that the "output bit string" is given by "010100100100" when the "input bit string" is "00000000", and the "output bit string" is given by "000100100100" when the "input bit string" is "00001000". It is also described that the "output bit string" is given by "010100100" when the "input bit string" is "000000", the "output bit string" is given by "010100100" when the "input bit string" is "000001", the "output bit string" is given by "000100000" when the "input bit string" is "000010", and the "output bit string" is given by "000100100" when the "input bit string" is "000011".

In the encoding table 211, it is also described that the "output bit string" is given by "000100" when the "input bit string" is "0001", the "output bit string" is given by "010100" when the "input bit string" is "0010", the "output bit string" is given by "010100" when the "input bit string" is "0011", the "output bit string" is given by "010" when the "input bit string" is "01", and the "output bit string" is given by "001" when the "input bit string" is "10". On the other hand, when the "input bit string" is "11", if the "final previous-time output" is "1", the "output bit string" is given by "000", but if the "final previous-time output" is "0", the "output bit string" is given by "101".

In the encoding table 212 for use in replacement, an "input bit to be replaced", a "bit string to be output as a result of replacement", and a "condition for replacement" are described from left to right. More specifically, in this encoding table 212, it is described that when the "input bit to be replaced" is "110111", if the condition for replacement is met, that is, if the "next-time output bit string" is "010", then the "bit string to be output as a result of replacement" is given by "001000000".

Thus, the 17PP encoder 171 performs 17PP encoding in accordance with the encoding table 211 except for a special case in which the condition for replacement is met for a particular input bit string. In the special case, that is, when the "input bit string" is "110111", if the "next-time output bit string" is "010", the 17PP encoder 171 performs 17PP encoding in accordance with the encoding table 212 for use in replacement.

As described above, in the encoding table 201, the number of bits subjected to examination in the encoding is not constant but varies in the range from 1 to 4 (that is, the code length is variable), and it is impossible to know the number of bits encoded until a specific given input is encoded.

Referring again to FIG. 5, the decoder 162 includes a PR-SISO decoder 81, a 17PP-SISO decoder 181, a deinterleaver 83, and a turbo decoder 84. From the signal received from the PR communication channel 12, the PR-SISO decoder 81 determines, based on NRZI encoding and the PR-2 channel, the trellis representation indicating time-sequential state transitions associated with the time-to-time encoding process, and then performs SISO decoding based on the determined trellis representation of the NRZI encoding and the PR-2 channel. The resultant SISO-decoded signal (soft information) is supplied to the 17PP-SISO decoder 181.

The 17PP-SISO decoder 181 determines (generates) the trellis representation of the 17PP code in accordance with the 17PP encoding table 201 disposed in the 17PP encoder 171 and performs the SISO decoding on the signal supplied from the PR-SISO decoder 81 on the basis of the determined trellis representation of the 17PP code using the BCJR algorithm or the SOVA. The resultant SISO-decoded signal is supplied to the deinterleaver 83.

Note that a decoding apparatus or a reproducing apparatus for reading an encoded signal from a storage medium and decoding the encoded signal may be realized using the PR communication channel 12 and the decoder 162 shown in FIG. 5.

Figure 10:
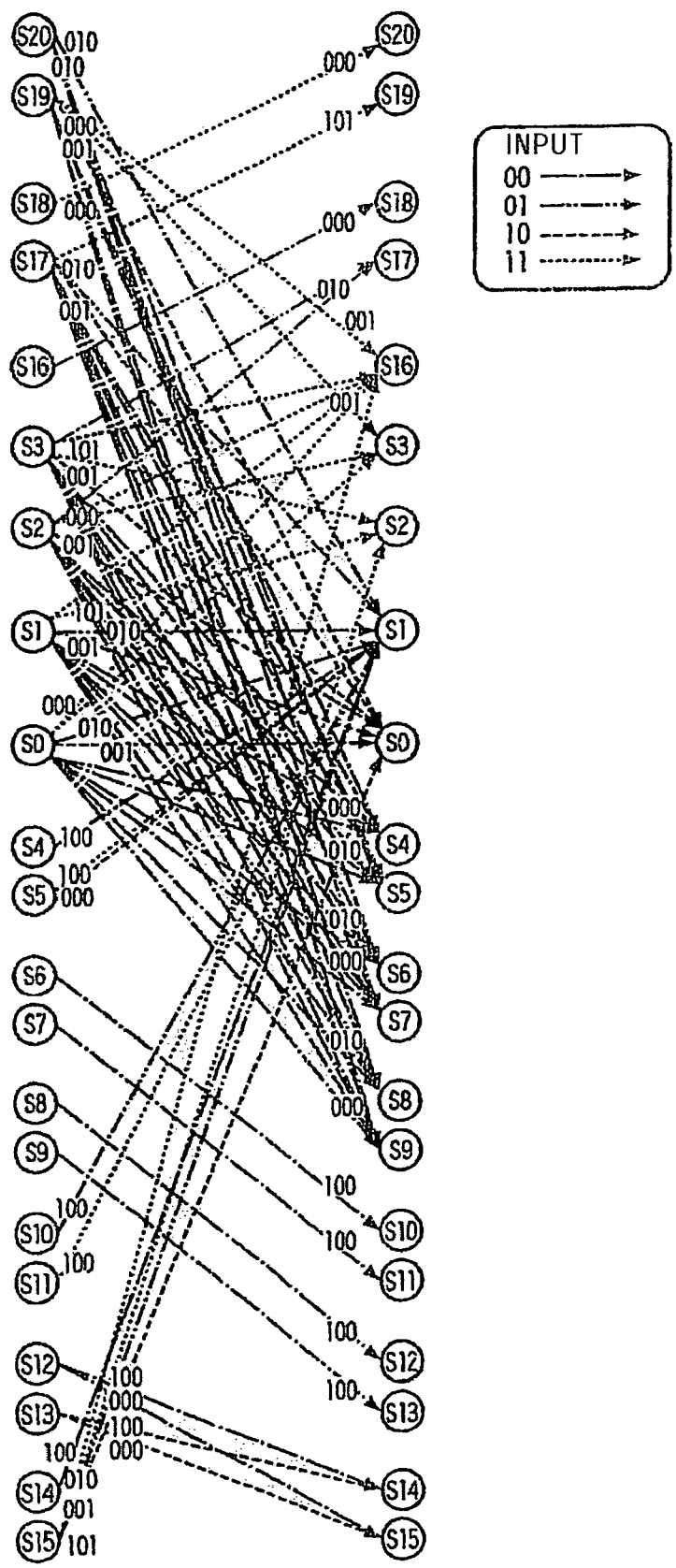
FIG. 10 is a diagram showing an example of a trellis representation of the state transition table shown, on a part-by-part basis, in FIGS. 7 to 9.

The trellis representation of the 17PP code is described below with reference to FIGS. 7 to 10. FIGS. 7 to 9 show an example of a set of state transition tables represented in the 17PP code encoding table 201 shown in FIG. 6 so as to indicate whole possible transitions that can occur in a period from a current time to a next time. FIG. 10 shows an example of a trellis representation indicating time-sequential transitions in the set of state transition tables shown in FIGS. 7 to 9.

In FIGS. 7 to 9, current-time state", "current-time input", "current-time output", "next-time state", and "next-time state" are described from right to left in each row. In the state transition table shown in FIG. 7, state transitions are described for "current-time states" of S0 to S2 from the top row to the bottom row. In the state transition table shown in FIG. 8, state transitions are described for "current-time states" of S3 to S16 from the top row to the bottom row. In the state transition table shown in FIG. 9, state transitions are described for "current-time states" of S17 to S20 from the top row to the bottom row. That is, the 17PP code encoding table 201 shown in FIG. 6 is converted into the state transition tables in which transitions are described for 21 "current-time states" of S0 to S20.

In this 17PP encoding, according to the "condition" described in the encoding table 201 shown in FIG. 6, if the final previous-time output is 1, encoding starts from state of S0, but if the final previous-time output is 0, encoding starts from state of S1.

In the example of the state transition table shown in FIG. 7, it is described that when the "state at the current time" is S0, if the "input at the current time" is 01 then the "output at the current time" is given by 010 and the "state at the next time" becomes S1, but if the "input at the current time" is 10 then the "output at the current time" is given by 001 and the "state at the next time" becomes S0. On the other hand, when the "state at the current time" is S0, if the "input at the current time" is 00 then the "output at the current time" is given by 000 and the "state at the next time" becomes S4, or the "output at the current time" is given by 010 and the "state at the next time" becomes S5, or the "output at the current time" is given by 010 and the "state at the next time" becomes S8, or the "output at the current time" is given by 010 and the "state at the next time" becomes S6, or the "output at the current time" is given by 000 and the "state at the next time" becomes S9, or the "output at the current time" is given by 000 and the "state at the next time" becomes S7. When the "state at the current time" is S0, if the "input at the current time" is 11 then the "output at the current time" is given by 000 and the "state at the next time" becomes S3, or the "output at the current time" is given by 001 and the "state at the next time" becomes S16.

When the "state at the current time" is S1, if the "input at the current time" is 01 then the "output at the current time" is given by 010 and the "state at the next time" becomes S, but if the "input at the current time" is 10 then the "output at the current time" is given by 001 and the "state at the next time" becomes S0. When the "state at the current time" is S1, if the "input at the current time" is 00 then the "output at the current time" is given by 000 and the "state at the next time" becomes S4, or the "output at the current time" is given by 010 and the "state at the next time" becomes S5, or the "output at the current time" is given by 010 and the "state at the next time" becomes S8, or the "output at the current time" is given by 010 and the "state at the next time" becomes S6, or the "output at the current time" is given by 000 and the "state at the next time" becomes S9, or the "output at the current time" is given by 000 and the "state at the next time" becomes S7. When the "state at the current time" is S1, if the "input at the current time" is 11 then the "output at the current time" is given by 101 and the "state at the next time" becomes S2, or the "output at the current time" is given by 001 and the "state at the next time" becomes S16.

When the "state at the current time" is S2, if the "input at the current time" is 01 then the "output at the current time" is given by 010 and the "state at the next time" becomes S17, but if the "input at the current time" is 10 then the "output at the current time" is given by 001 and the "state at the next time" becomes S0. When the "state at the current time" is S2, if the "input at the current time" is 00 then the "output at the current time" is given by 000 and the "state at the next time" becomes S4, or the "output at the current time" is given by 010 and the "state at the next time" becomes S5, or the "output at the current time" is given by 010 and the "state at the next time" becomes S8, or the "output at the current time" is given by 010 and the "state at the next time" becomes S6, or the "output at the current time" is given by 000 and the "state at the next time" becomes S9, or the "output at the current time" is given by 000 and the "state at the next time" becomes S7. When the "state at the current time" is S2, if the "input at the current time" is 11 then the "output at the current time" is given by 000 and the "state at the next time" becomes S3, or the "output at the current time" is given by 001 and the "state at the next time" becomes S16.

In the example of the state transition table shown in FIG. 8, it is described that when the "state at the current time" is S3, if the "input at the current time" is 01 then the "output at the current time" is given by 010 and the "state at the next time" becomes S17, but if the "input at the current time" is 10 then the "output at the current time" is given by 001 and the "state at the next time" becomes S0. When the "state at the current time" is S3, if the "input at the current time" is 00 then the "output at the current time" is given by 000 and the "state at the next time" becomes S4, or the "output at the current time" is given by 010 and the "state at the next time" becomes S5, or the "output at the current time" is given by 010 and the "state at the next time" becomes S8, or the "output at the current time" is given by 010 and the "state at the next time" becomes S6, or the "output at the current time" is given by 000 and the "state at the next time" becomes S9, or the "output at the current time" is given by 000 and the "state at the next time" becomes S7. When the "state at the current time" is S3, if the "input at the current time" is 11 then the "output at the current time" is given by 101 and the "state at the next time" becomes S2, or the "output at the current time" is given by 001 and the "state at the next time" becomes S16.

When the "state at the current time" is S4, if the "input at the current time" is 01 then the "output at the current time" is given by 100 and the "state at the next time" becomes S1. When the "state at the current time" is S5, if the "input at the current time" is 10 then the "output at the current time" is given by 000 and the "state at the next time" becomes S1, but if the "input at the current time" is 11 then the "output at the current time" is given by 100 and the "state at the next time" becomes S1. When the "state at the current time" is S6, if the "input at the current time" is 00 then the "output at the current time" is given by 100 and the "state at the next time" becomes S10. When the "state at the current time" is S7, if the "input at the current time" is 00 then the "output at the current time" is given by 100 and the "state at the next time" becomes S11. When the "state at the current time" is S8, if the "input at the current time" is 00 then the "output at the current time" is given by 100 and the "state at the next time" becomes S12. When the "state at the current time" is S9, if the "input at the current time" is 00 then the "output at the current time" is given by 100 and the "state at the next time" becomes S13. When the "state at the current time" is S10, if the "input at the current time" is 01 then the "output at the current time" is given by 100 and the "state at the next time" becomes S1. When the "state at the current time" is S11, if the "input at the current time" is 11 then the "output at the current time" is given by 100 and the "state at the next time" becomes S1.

When the "state at the current time" is S12, if the "input at the current time" is 00 then the "output at the current time" is given by 100 and the "state at the next time" becomes S14, or the "output at the current time" is given by 000 and the "state at the next time" becomes S15. When the "state at the current time" is S13, if the "input at the current time" is 10 then the "output at the current time" is given by 100 and the "state at the next time" becomes S14, or the "output at the current time" is given by 000 and the "state at the next time" becomes S15. When the "state at the current time" is S14, if the "input at the current time" is 00 then the "output at the current time" is given by 100 and the "state at the next time" becomes S1. When the "state at the current time" is S15, if the "input at the current time" is 01 then the "output at the current time" is given by 010 and the "state at the next time" becomes S1. When the "state at the current time" is S15, if the "input at the current time" is 10 then the "output at the current time" is given by 001 and the "state at the next time" becomes S0. When the "state at the current time" is S15, if the "input at the current time" is 11 then the "output at the current time" is given by 101 and the "state at the next time" becomes S2, or the "output at the current time" is given by 001 and the "state at the next time" becomes S16. When the "state at the current time" is S16, if the "input at the current time" is 01 then the "output at the current time" is given by 000 and the "state at the next time" becomes S18.

In the example of the state transition table shown in FIG. 9, it is described that when the "state at the current time" is S17, if the "input at the current time" is 01 then the "output at the current time" is given by 010 and the "state at the next time"

becomes S1. When the "state at the current time" is S17, if the "input at the current time" is 10 then the "output at the current time" is given by 001 and the "state at the next time" becomes S0. When the "state at the current time" is S17, if the "input at the current time" is 11 then the "output at the current time" is given by 101 and the "state at the next time" becomes S19. When the "state at the current time" is S17, if the "input at the current time" is 00 then the "output at the current time" is given by 000 and the "state at the next time" becomes S4, or the "output at the current time" is given by 010 and the "state at the next time" becomes S5, or the "output at the current time" is given by 010 and the "state at the next time" becomes S8, or the "output at the current time" is given by 010 and the "state at the next time" becomes S6, or the "output at the current time" is given by 000 and the "state at the next time" becomes S9, or the "output at the current time" is given by 000 and the "state at the next time" becomes S7. When the "state at the current time" is S18, if the "input at the current time" is 11 then the "output at the current time" is given by 000 and the "state at the next time" becomes S20.

When the "state at the current time" is S19, if the "input at the current time" is 10 then the "output at the current time" is given by 001 and the "state at the next time" becomes S0. When the "state at the current time" is S19, if the "input at the current time" is 00 then the "output at the current time" is given by 000 and the "state at the next time" becomes S4, or the "output at the current time" is given by 000 and the "state at the next time" becomes S9, or the "output at the current time" is given by 000 and the "state at the next time" becomes S7. When the "state at the current time" is S19, if the "input at the current time" is 11 then the "output at the current time" is given by 000 and the "state at the next time" becomes S3, or the "output at the current time" is given by 001 and the "state at the next time" becomes S16. When the "state at the current time" is S20, if the "input at the current time" is 01 then the "output at the current time" is given by 010 and the "state at the next time" becomes S1. When the "state at the current time" is S20, if the "input at the current time" is 00 then the "output at the current time" is given by 010 and the "state at the next time" becomes S5, or the "output at the current time" is given by 010 and the "state at the next time" becomes S8, or the "output at the current time" is given by 010 and the "state at the next time" becomes S6.

In the trellis representation of the 17PP code shown in FIG. 10, circles denote states, single-dotted arrows denote state transitions that can occur when the input signal is "00", double-dotted arrows denote state transitions that can occur when the input signal is "01", long dashed arrows denote state transitions that can occur when the input signal is "10", and short dashed arrows denote state transitions that can occur when the input signal is "11". A label on each arrow indicates a bit string of an output signal.

As described above, in the state transition table of the 17PP code shown in FIGS. 7 to 9 and in the trellis representation of the 17PP code shown in FIG. 10, all possible inputs and outputs, which can occur in the encoding process at a time for each state, are described. For example, in the state of S0, there are six possible transitions from the "current-time input" of 00 (single-dotted arrows shown in FIG. 10), there is one possible transition from the "current-time input" of 01 (a double-dotted arrow shown in FIG. 10), there is one possible transition from the "current-time input" of 10 (a long dashed arrow shown in FIG. 10), and there are two possible transitions from the "current-time input" of 11 (short-dotted arrows shown in FIG. 10). In the state of S8, there is only one possible transition from the "current-time input" of 00 (a single-dotted arrow shown in FIG. 10), and there are no possible transitions from any of "current-time inputs" 01, 10, and 11. As described above, in a certain state, there can be a plurality of transitions (denoted by arrows in FIG. 10) from the same "input at the current time". This means that when the trellis representation indicates only transitions that can occur at a time such as that shown in FIG. 10, it is impossible to determine which arrow should be selected, and thus encoding is impossible by using only such a trellis representation. The above problem can be avoided by combining a plurality of trellis representations similar to that shown in FIG. 10 so that time-sequential transitions in the entire encoding process are fully represented.

Figure 11:
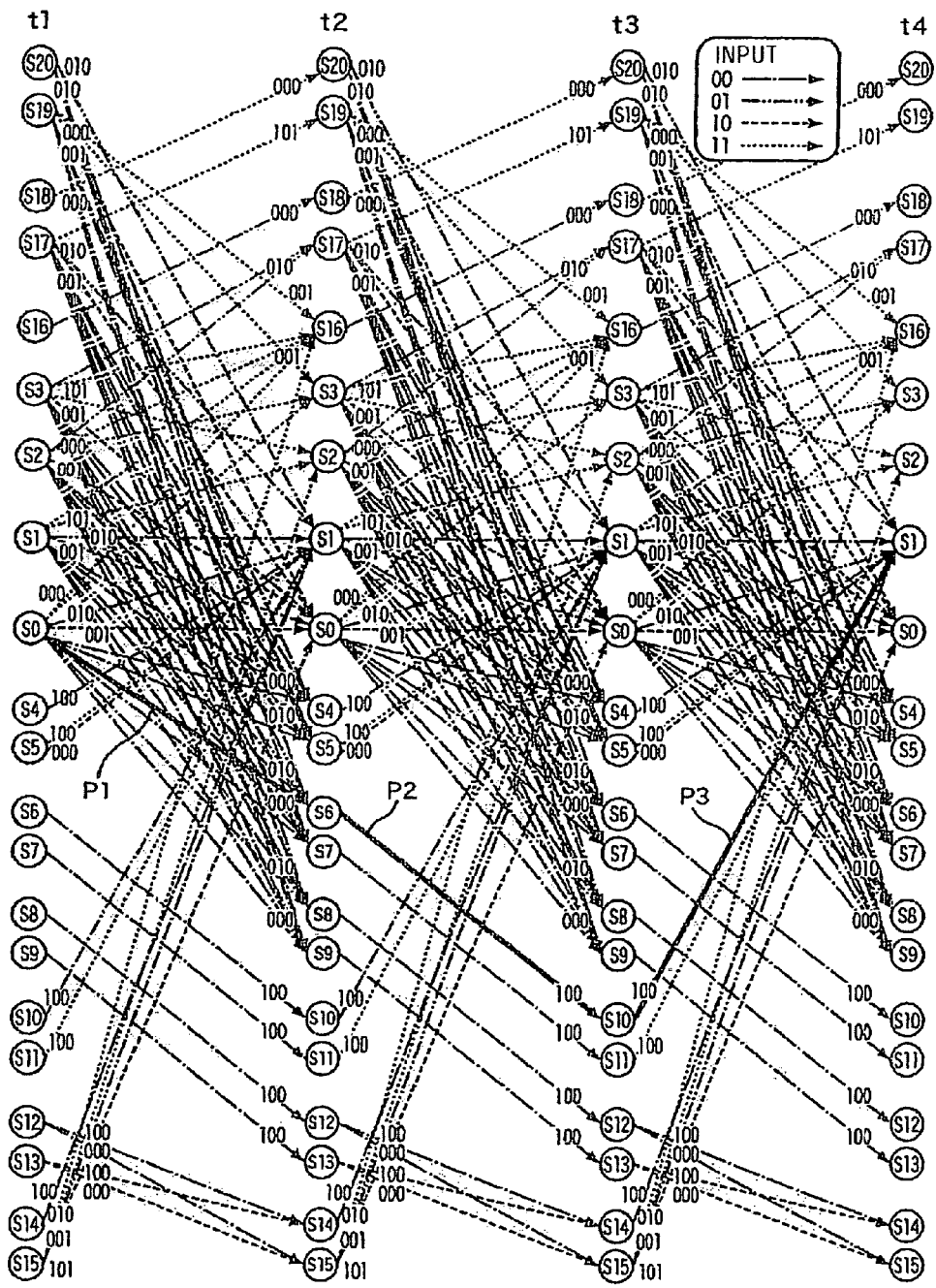
FIG. 11 is a diagram showing an example of a trellis representation based on the trellis representation shown in FIG. 10.

FIG. 11 shows another example of a trellis representation based on the trellis representation shown in FIG. 10. In this trellis representation shown in FIG. 11, unlike the trellis representation shown in FIG. 10 in which only the encoding process at one time is represented, three trellis representations shown in FIG. 10 are combined together such that a sequence of state transitions from time t1 to time t4 is represented. Note that although the state transitions represented in FIG. 11 include only those at sequential three times, the actually-used trellis representation includes all transitions from the beginning to the end of the encoding process.

In the example of the state transition table shown in FIG. 11, a bold arrow P1 indicates a transition that can occur when "00" is given as an input signal in a state of S0 at a time t1, a bold arrow P2 indicates a transition that can occur when "00" is given as an input signal in a state of S6 at a time t2, and a bold arrow P3 indicates a transition that can occur when "01" is given as an input signal in a state of S10 at a time t3, thereby indicating a sequence of state transitions.

That is, the bold arrows P1 to P3 indicate sequential state transitions that occur such that if 00 is input as the "current-time input" in the state of S0 at the time t1, 010 is output as the "current-time output" and a state transition occurs into the "next-time state" of S6 at the time t2, and then if 00 is input as the "current-time input" in the state of S6 at the time t2, 100 is output as the "current-time output" and a state transition occurs into the "next-time state" of S10 at the time t3, and furthermore if 01 is input as the "current-time input" in the state of S10 at the time t3, 100 is output as the "current-time output" and a state transition occurs into the "next-time state" of S1 at the time t4.

The transitions denoted by the respective arrows at respective times are discussed in further detail below. In the state of S0 at the time t1, possible transitions for the "current-time input" of 00 include those indicated by five single-dotted arrows in addition to the transition indicated by the bold arrow P1 (that is, there are a total of six possible transitions corresponding to single-dotted arrows shown in FIG. 10). However, if 00 is input as the "current-time input" in the state of S0 at the time t1, and if, in response, 010 is output as the "current-time output" and the state transition occurs into the "next-time state" of S6 at the time t2, then in the resultant state S6, there is only one possible transition for the "current-time input" of 00 as indicated by the bold arrow P2 (corresponding to a single-dotted arrow shown in FIG. 10). In this state S6, if 00 is input as the "current-time input" at the time t2, 100 is output as the "current-time output" and the state transition occurs into the "next-time state" of S10 at the time t3. Also in this resultant state S10, there is only one possible transition for the "current-time input" of 01 as indicated by the bold arrow P3 (corresponding to a double-dotted arrow shown in FIG. 10).

That is, only one transition is possible in the state of S6 at the time t2 and also in the state of S10 at the time t3, and thus, the output for the input "000001" given in the state S0 at the time t1 is uniquely determined as "010100100". That is, in this trellis representation, when an input is given, an output (codeword) corresponding to the given input is determined by a path (including a bold arrows P1 to P3).

As described above, even in a state in which there are two or more possible transitions from the time t1 to the time t2, it is possible to find a unique path in a longer period. Thus, in this trellis representation, each full path (such as a path including bold arrows P1 to P3 in FIG. 11) corresponds to one overall state transition in the entire encoding process, that is, there is a one-to-one correspondence between paths in the trellis representation and transitions from given input strings to outputs (codewords). Therefore, it is possible to determine an output for a given input using this trellis representation.

In the Viterbi decoding algorithm or the BCJR decoding algorithm, in general, a state transition table indicating a encoding process at a time is converted into the form of a trellis representing time-sequential transitions, and decoding is performed in accordance with the trellis, as described, for example, in "The Viterbi Algorithm" (G, D, Forney, Proc. IEEE, Vol. 61, No. 3, 1973) or "Optimal Decoding of Linear Codes for Minimizing Symbol Error Rate" (L. R. Bahl et al., IEEE Trans. Inform. Theory, Vol. IT-20, 1974). The present applicant has made a mathematical analysis on the decoding algorithms. The analysis has revealed that each algorithm can correctly work if there is a one-to-one correspondence between overall transitions in the encoding process and paths in the trellis representation, as described above. This means that the 17PP code can be decoded using the Viterbi decoding algorithm or the BCJR decoding algorithm in accordance with a trellis representation such as that shown in FIG. 11 (FIG. 10).

As described above, because the trellis representation can be produced such that there is a one-to-one correspondence between overall transitions in the encoding process and full paths in the trellis representation, and the 17PP code can be decoded using the Viterbi decoding algorithm or the BCJR decoding algorithm.

That is, the encoding process of the 17PP code can be represented by a trellis representation having 21 states as shown in FIG. 10. If a plurality of trellis representations shown in FIG. 10 are serially connected such that time-sequential transitions are represented as shown in FIG. 11, the Viterbi decoding or the BCJR decoding can be performed in accordance with the resultant trellis representation. Note that the trellis representation having 21 states has a size that can be handled by hardware or software.

Note that the trellis representation of the 17PP code is not limited to that shown in FIG. 11, but various representations are possible. For example, some states in the trellis representation shown in FIG. 10 may be eliminated and the total number of transitions from states may be reduced, as will be described later with reference to FIG. 14, and a plurality of resultant trellis representations may be serially connected into a single trellis representation as with the trellis representation shown in FIG. 11, thereby obtaining a trellis representation of the 17PP code.

Figure 14:
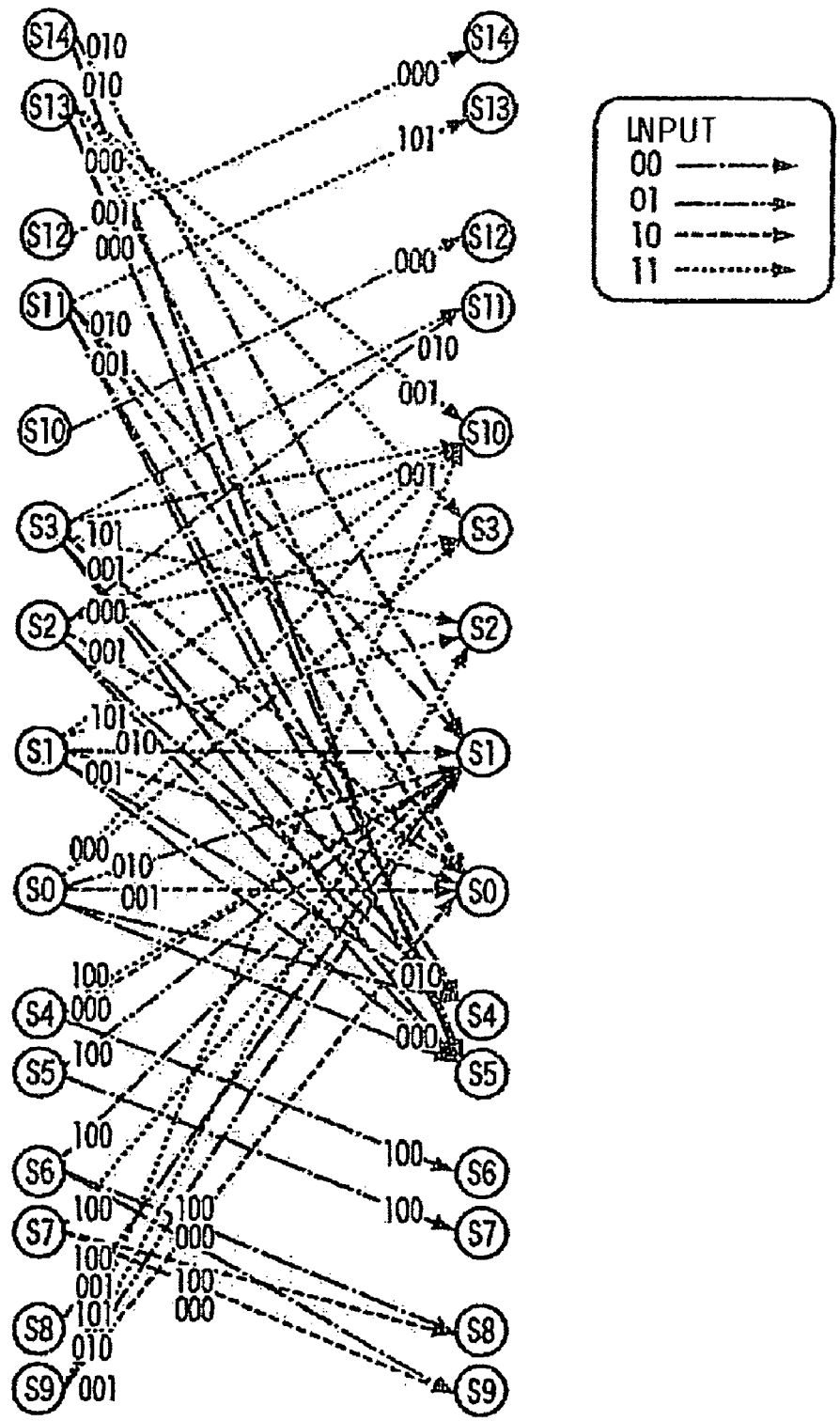
FIG. 14 is a diagram showing an example of a trellis representation of the state transition table shown, on a part-by-part basis, in FIGS. 12 and 13.

FIGS. 12 to 14 show another example of a set of trellis representations of the 17PP code. FIGS. 12 and 13 show an example of set of state transition tables obtained by rewriting the encoding table 201 of the 17PP code shown in FIG. 6 so as to clearly indicate state transitions which can occur in a period from a current time to a next time in the encoding process (note that, in contrast to the set of state transition tables shown in FIGS. 7 to 9 in which there are 21 states, the number of states is reduced to 15 in the present set of state transition tables). FIG. 14 shows an example of a trellis representation, that is, a representation of time-sequential transitions, of the set of state transition tables shown in FIGS. 12 and 13.

In FIGS. 12 and 13, current-time state", "current-time output", "next-time state", and "next-time state" are described from right to left in each row. In the state transition table shown in FIG. 12, state transitions are described for "current-time states" of S0 to S4 from the top row to the bottom row. In the state transition table shown in FIG. 13, state transitions are described for "current-time states" of S5 to S14 from the top row to the bottom row. In the set of transition state tables shown in FIGS. 12 and 13, 21 "current-time states" in the set of transition state tables shown in FIGS. 7 to 9 are reduced to 15 states from state S0 to state S14.

In the state transition table shown in FIG. 12, it is described that when the "state at the current time" is S0, if the "input at the current time" is 01 then the "output at the current time" is given by 010 and the "state at the next time" becomes S1, but if the "input at the current time" is 10 then the "output at the current time" is given by 001 and the "state at the next time" becomes S0. When the "state at the current time" is S0, if the "input at the current time" is 00 then the "output at the current time" is given by 000 and the "state at the next time" becomes S5, or the "output at the current time" is given by 010 and the "state at the next time" becomes S4. When the "state at the current time" is S0, if the "input at the current time" is 11 then the "output at the current time" is given by 000 and the "state at the next time" becomes S3, or the "output at the current time" is given by 001 and the "state at the next time" becomes S10.

When the "state at the current time" is S1, if the "input at the current time" is 01 then the "output at the current time" is given by 010 and the "state at the next time" becomes S1, but if the "input at the current time" is 10 then the "output at the current time" is given by 001 and the "state at the next time" becomes S0. When the "state at the current time" is S1, if the "input at the current time" is 00 then the "output at the current time" is given by 000 and the "state at the next time" becomes S5, or the "output at the current time" is given by 010 and the "state at the next time" becomes S4. When the "state at the current time" is S1, if the "input at the current time" is 11 then the "output at the current time" is given by 101 and the "state at the next time" becomes S2, or the "output at the current time" is given by 001 and the "state at the next time" becomes S10.

When the "state at the current time" is S2, if the "input at the current time" is 01 then the "output at the current time" is given by 010 and the "state at the next time" becomes S11, but if the "input at the current time" is 10 then the "output at the current time" is given by 001 and the "state at the next time" becomes S0. When the "state at the current time" is S2, if the "input at the current time" is 00 then the "output at the current time" is given by 000 and the "state at the next time" becomes S5, or the "output at the current time" is given by 010 and the "state at the next time" becomes S4. When the "state at the current time" is S2, if the "input at the current time" is 11 then the "output at the current time" is given by 000 and the "state at the next time" becomes S3, or the "output at the current time" is given by 001 and the "state at the next time" becomes S10.

When the "state at the current time" is S3, if the "input at the current time" is 01 then the "output at the current time" is given by 010 and the "state at the next time" becomes S11, but if the "input at the current time" is 10 then the "output at the current time" is given by 001 and the "state at the next time" becomes S0. When the "state at the current time" is S3, if the "input at the current time" is 00 then the "output at the current time" is given by 000 and the "state at the next time" becomes S5, or the "output at the current time" is given by 010 and the "state at the next time" becomes S4. When the "state at the current time" is S3, if the "input at the current time" is 11 then the "output at the current time" is given by 101 and the "state at the next time" becomes S2, or the "output at the current time" is given by 001 and the "state at the next time" becomes S10.

When the "state at the current time" is S4, if the "input at the current time" is 00 then the "output at the current time" is given by 100 and the "state at the next time" becomes S6. When the "state at the current time" is S4, if the "input at the current time" is 10 then the "output at the current time" is given by 000 and the "state at the next time" becomes S1. When the "state at the current time" is S4, if the "input at the current time" is 11 then the "output at the current time" is given by 100 and the "state at the next time" becomes S1.

In the state transition table shown in FIG. 13, it is described that when the "state at the current time" is S5, if the "input at the current time" is 00 then the output at the current time is given by 100 and the state at the next time becomes S7, but if the "input at the current time" is 01 then the "output at the current time" is given by 100 and the "state at the next time" becomes S1. When the "state at the current time" is S6, if the "input at the current time" is 01 then the "output at the current time" is given by 100 and the "state at the next time" becomes S1. When the "state at the current time" is S6, if the "input at the current time" is 00 then the "output at the current time" is given by 100 and the "state at the next time" becomes S8, or the "output at the current time" is given by 000 and the "state at the next time" becomes S9. When the "state at the current time" is S7, if the "input at the current time" is 11 then the "output at the current time" is given by 100 and the "state at the next time" becomes S1. When the "state at the current time" is S7, if the "input at the current time" is 10 then the "output at the current time" is given by 100 and the "state at the next time" becomes S8, or the "output at the current time" is given by 000 and the "state at the next time" becomes S9.

When the "state at the current time" is S8, if the "input at the current time" is 00 then the "output at the current time" is given by 100 and the "state at the next time" becomes S1. When the "state at the current time" is S9, if the "input at the current time" is 01 then the output at the current time is given by 010 and the state at the next time becomes S1. When the "state at the current time" is S9, if the "input at the current time" is 10 then the "output at the current time" is given by 001 and the "state at the next time" becomes S0. When the "state at the current time" is S9, if the "input at the current time" is 11 then the "output at the current time" is given by 101 and the "state at the next time" becomes S2, or the "output at the current time" is given by 001 and the "state at the next time" becomes S10.

When the "state at the current time" is S10, if the "input at the current time" is 01 then the "output at the current time" is given by 000 and the "state at the next time" becomes S12. When the "state at the current time" is S11, if the "input at the current time" is 01 then the "output at the current time" is given by 010 and the "state at the next time" becomes S1. When the "state at the current time" is S11, if the "input at the current time" is 10 then the "output at the current time" is given by 001 and the "state at the next time" becomes S0. When the "state at the current time" is S11, if the "input at the current time" is 11 then the "output at the current time" is given by 101 and the "state at the next time" becomes S13. When the "state at the current time" is S11, if the "input at the current time" is 00 then the "output at the current time" is given by 000 and the "state at the next time" becomes S5, or the "output at the current time" is given by 010 and the "state at the next time" becomes S4.

When the "state at the current time" is S12, if the "input at the current time" is 11 then the "output at the current time" is given by 000 and the "state at the next time" becomes S14. When the "state at the current time" is S13, if the "input at the current time" is 10 then the "output at the current time" is given by 001 and the "state at the next time" becomes S0. When the "state at the current time" is S13, if the "input at the current time" is 00 then the "output at the current time" is given by 000 and the "state at the next time" becomes S5. When the "state at the current time" is S13, if the "input at the current time" is 11 then the "output at the current time" is given by 000 and the "state at the next time" becomes S3, or the "output at the current time" is given by 001 and the "state at the next time" becomes S10. When the "state at the current time" is S14, if the "input at the current time" is 01 then the "output at the current time" is given by 010 and the "state at the next time" becomes S1. When the "state at the current time" is S14, if the "input at the current time" is 00 then the "output at the current time" is given by 010 and the "state at the next time" becomes S4.

In the trellis representation of the 17PP code shown in FIG. 14, as in the trellis representation shown in FIG. 10, circles denote states, single-dotted arrows denote state transitions that can occur when the input signal is "00", double-dotted arrows denote state transitions that can occur when the input signal is "01", long dashed arrows denote state transitions that can occur when the input signal is "10", and short dashed arrows denote state transitions that can occur when the input signal is "11". A label on each arrow indicates a bit string of an output signal.

As described above, the encoding process of the 17PP code can also be represented in the form of a trellis representation having 15 states. Note that plural sets of trellis representations having 15 states each similar to that described above can also be serially connected so as to represent time-sequential transitions in a similar manner as with the trellis representation having 21 states described above with reference to FIG. 10. In this serially connected form, as in the example shown in FIG. 11, there is a one-to-one correspondence between overall transitions in the encoding process and full paths in the trellis representation. Therefore, this trellis representation having 15 states can also be used in the Viterbi decoding or BCJR decoding. Because the trellis representation shown in FIG. 14 has a less number of states than the trellis representation having 21 states, this trellis representation can be handled more easily by hardware or software than the trellis representation having 21 states.

Figure 15:
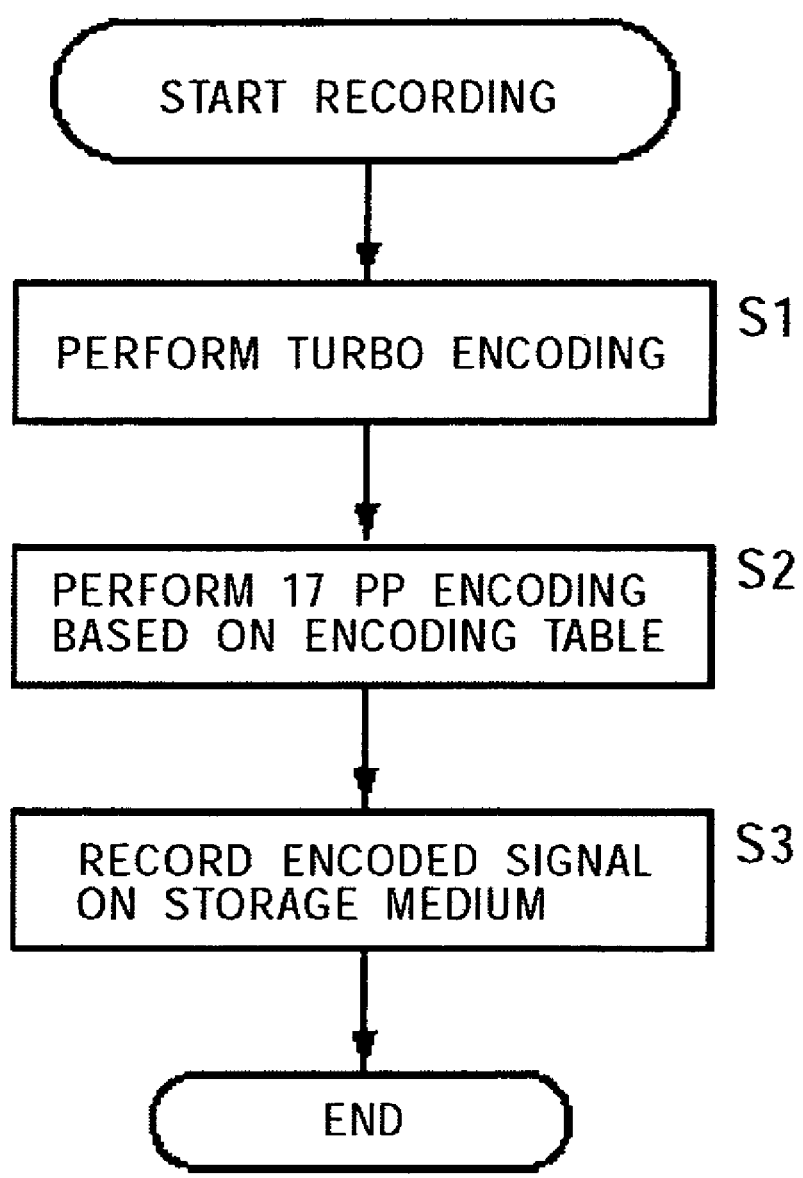
FIG. 15 is a flowchart showing a recording process performed by the recording/reproducing apparatus shown in FIG. 5.

Now, the recording process performed by the recording/reproducing apparatus 151 is described with reference to a flowchart shown in FIG. 15.

In step S1, the turbo encoder 71 performs the turbo encoding on an input signal and supplies the resultant turbo-coded signal to the 17PP encoder 171 via the interleaver 72. After completion of step S1, the process proceeds to step S2. The details of the turbo encoding process in step S1 are described below. A signal input from the outside is simultaneously applied to the element encoder 91 and the interleaver 92. The element encoder 91 generates a parity bit string 1 from the input signal and supplies the resultant parity bit string 1 to the decimator 94. The interleaver 92 interleaves the signal that was also input to the element encoder 91 and supplies the resultant interleaved signal to the element encoder 93. The element encoder 93 generates a parity bit string 2 from the interleaved signal supplied from the interleaver 92 and supplies the resultant parity bit string 2 to the decimator 94. The decimator 94 decimates the parity bit string 1 and the parity bit string 2 and multiplexes the resultant decimated parity string 1 and parity bit string 2. The multiplexed signal is supplied to the 17PP encoder 171 via the interleaver 72.

In step S2, the 17PP encoder 171 performs the 17PP encoding on the signal input via the interleaver 72 in accordance with the 17PP code encoding table 201, and outputs the resultant signal over the PR communication channel 12. After completion of step S2, the process proceeds to step S3.

In step S3, the recording/reproducing unit 21 converts the encoded signal received from the 17PP encoder 171 into a NRZI (non return to zero inverted) code and stores the resultant NRZI-coded signal on a storage medium mounted on or embedded in the recording/reproducing unit 21 by means of a mark edge recording method. After completion of step S3, the recording process is ended.

The reproducing process performed by the recording/reproducing apparatus 151 to reproduce the signal recorded in the above-described recording process is described below with reference to a flowchart shown in FIG. 16.

In step S21, the recording/reproducing unit 21 reads the encoded signal recorded on the storage medium via the PR-2 channel and supplies the read encoded signal to the equalizer 22. After completion of step S21, the process proceeds to step S22. In step S22, the equalizer 22 performs PR equalization using waveform interference on the supplied encoded signal so as to achieve a target equalization characteristic. The resultant PR-equalized signal is supplied to the decoder 162. After completion of step S22, the process proceeds to step S23.

In step S23, from the signal received from the PR communication channel 12, the PR-SISO decoder 81 determines, based on NRZI encoding and the PR-2 channel, the trellis representation indicating time-sequential state transitions in the time-to-time encoding process, and performs SISO decoding using the BCJR algorithm or the SOVA in accordance with the determined trellis representation of the NRZI encoding and the PR-2 channel. The resultant SISO-decoded signal (soft information) is supplied to the 17PP-SISO decoder 181. After completion of step S23, the process proceeds to step S24.

In step S24, the 17PP-SISO decoder 181 performs a 17PP-SISO decoding process. The 17PP-SISO decoding process is described in further detail with reference to a flowchart shown in FIG. 17. In step S41 shown in FIG. 17, the 17PP-SISO decoder 181 receives the SISO-decoded signal (soft signal) from the PR-SISO decoder 81. Then in the next step S42, the 17PP-SISO decoder 181 determines (generates) the trellis representation of the 17PP code based on the 17PP encoding table 201. In step S43, the 17PP-SISO decoder 181 performs the SISO decoding on the signal received from the PR-SISO decoder 81 by using the Viterbi decoding algorithm or the BCJR decoding algorithm in accordance with the determined 17PP trellis representation. After completion of step S43, the process proceeds to step S44. In step S44, the 17PP-SISO decoder 181 supplies the resultant SISO-decoded signal (soft information) to the turbo decoder 84 via the deinterleaver 83. After completion of step S44, the process returns to step S25 in FIG. 16.

Figure 16:
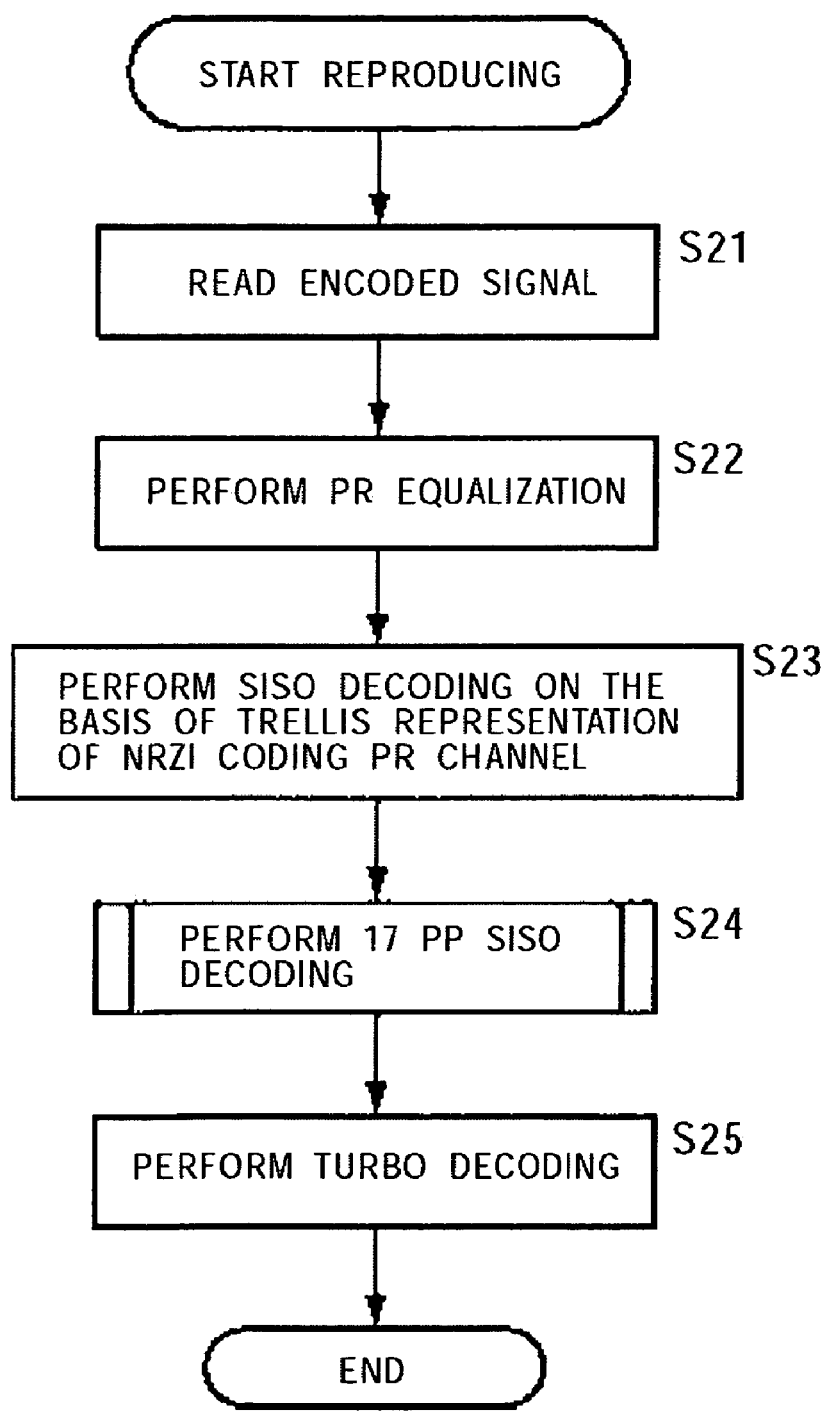
FIG. 16 is a flowchart showing a reproducing process performed by the recording/reproducing apparatus shown in FIG. 5.
Figure 17:
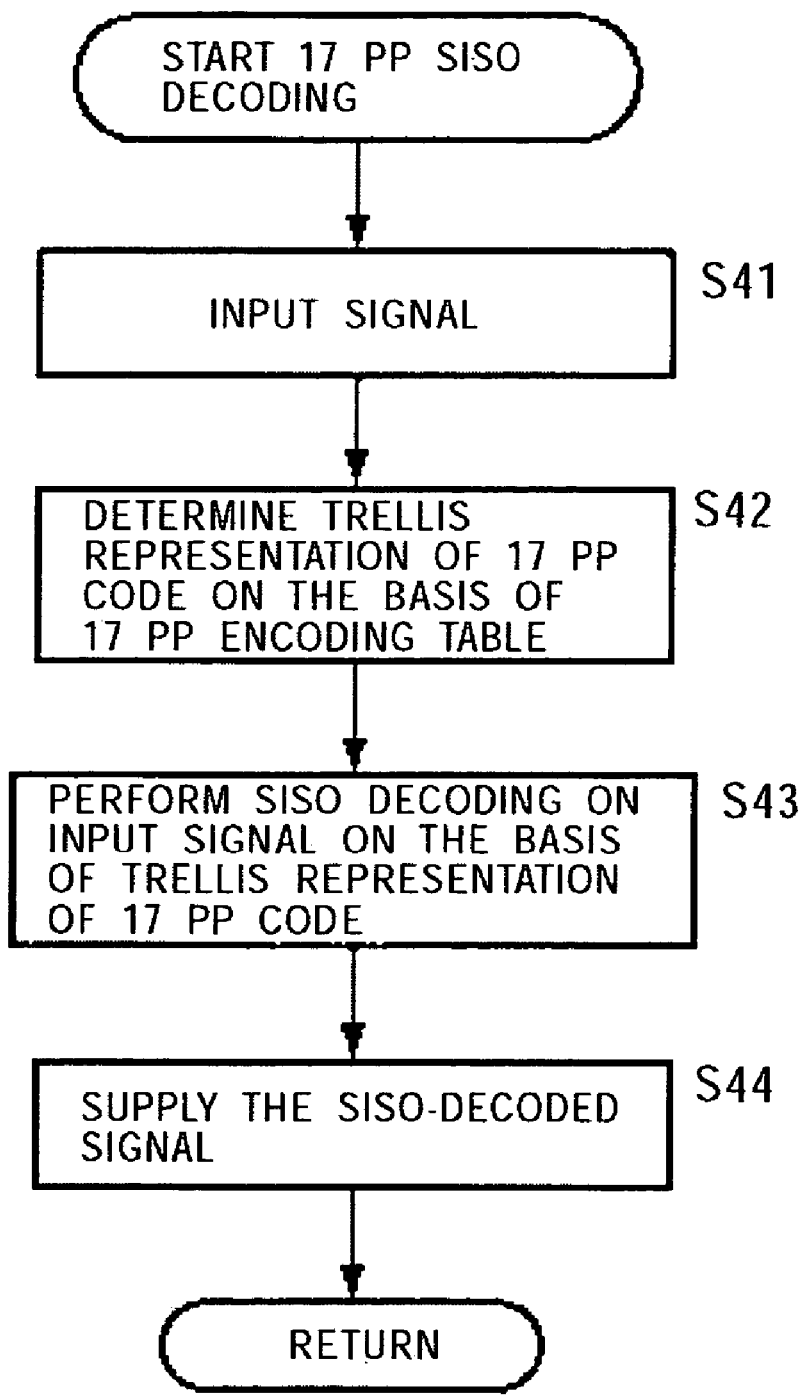
FIG. 17 is a flowchart showing a 17PP SISO decoding process in step S24 in FIG. 16.

In step S25 in FIG. 16, the turbo decoder 84 performs the turbo decoding process. More specifically, the interpolator 111 of the turbo decoder 84 performs interpolation on the signal (soft information) received from the deinterleaver 83 and supplies the resultant signal to the element decoder 112 and the element decoder 114. The element decoder 112 performs SISO decoding on the signal received from the interpolator 111 and supplies the resultant SISO-decoded signal together with reliability information to the element decoder 114 via the interleaver 113. The element decoder 114 performs SISO decoding on the signal received from the interpolator 111 by using the reliability information received from the element decoder 112. The resultant SISO-decoded signal and reliability information are supplied to the element decoder 112 via the deinterleaver 115. The above element decoding process is iterated several times. After the iteration of the element decoding process, the element decoder 114 performs a final decision and outputs a decision result to a following stage (not shown). Thus, the reproducing process is completed.

In the reproduction process, as described above, the trellis representation of the 17PP code is determined and the signal is SISO-decoded using the Viterbi decoding algorithm or the BCJR decoding algorithm in accordance with the trellis representation. Therefore, in the recording/reproducing apparatus 151, a combination of the 17PP code and the turbo code can be used. This allows an improvement in decoding performance as shown in FIG. 18.

Figure 18:
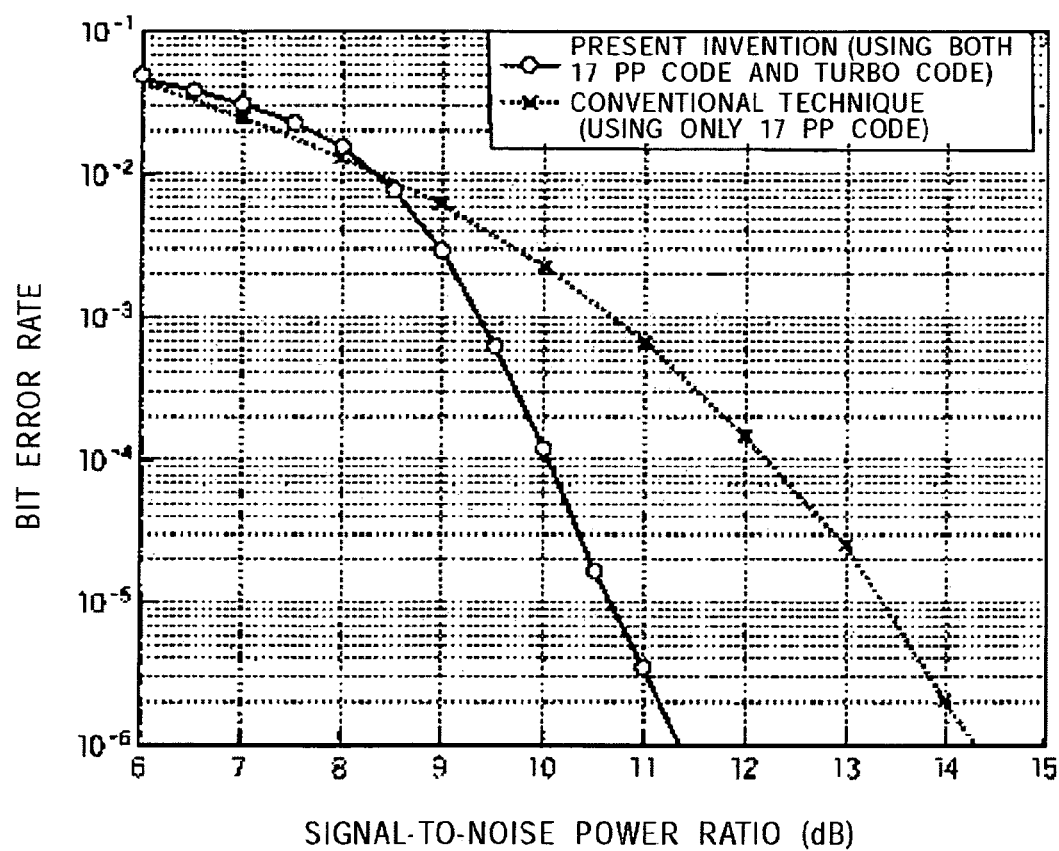
FIG. 18 is a diagram comparatively showing the bit error rate achieved in decoding based on the trellis representation shown in FIG. 11 and that achieved in decoding according to a conventional technique.

FIG. 18 comparatively shows the decoding performance of the recording/reproducing apparatus 151 according to the present invention and that of the recording/reproducing apparatus 1 according to the conventional technique. In the comparison in terms of decoding performance shown in FIG. 18, a combination of the 17PP code and the turbo code is used as a modulation code in the recording/reproducing apparatus 151 according to the present invention, while only the 17PP code is used as a modulation code in the recording/reproducing apparatus 1 according to the conventional technique.

In FIG. 18, the vertical axis represents the bit error rate, and the horizontal axis represents the signal-to-noise power ratio. A solid line indicates the bit error rate achieved by the present invention, and a dotted line indicates the bit error rate achieved by the conventional technique using only the 17PP code. In FIG. 18, the number of information bits per turbo code is 1174, the coding rate of the turbo code is 19/20, and the number of encoding iterations is 10.

It can be seen from FIG. 18 that the signal-to-noise power ratio allowed to obtain a bit error rate of $10^{-5}$ is about 13.4 (dB) in the recording/reproducing apparatus 1 according to the conventional technique, and about 10.6 (dB) in the recording/reproducing apparatus 151 according to the present invention. Thus, in the recording/reproducing apparatus 151, use of the combination of the 17PP code and the turbo code allows an encoding gain greater than 2.5 (dB) compared with that achieved by the conventional recording/reproducing apparatus 1 using only the 17PP code.

As described above, use of the combination of the 17PP code and the turbo code allows an improvement in decoding performance.

Figure 19:
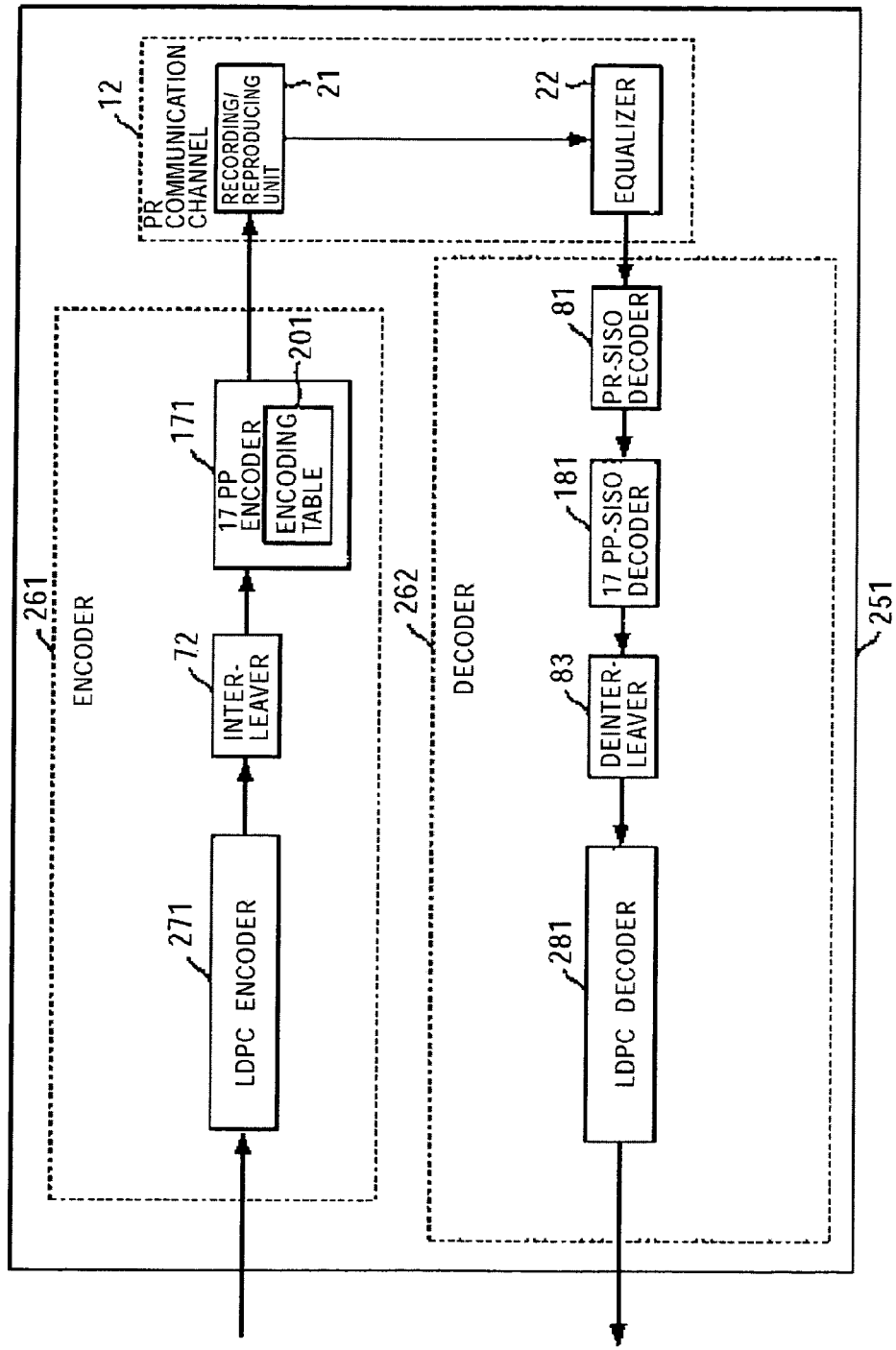
FIG. 19 is a block diagram showing another embodiment of a recording/reproducing apparatus according to the present invention.

FIG. 19 shows an embodiment of a recording/reproducing apparatus 251 according to the present invention. In FIG. 19, similar parts to those in FIG. 5 are denoted by similar reference symbols and a duplicate description thereof is omitted.

In FIG. 19, the recording/reproducing apparatus 251 includes an encoder 261 and an a decoder 262, which are similar to the encoder 161 and the decoder 162, respectively, of the recording/reproducing apparatus 151 described above with reference to FIG. 5 except that the encoder 261 has an LDPC (Low Density Parity Check) encoder 271 instead of the turbo encoder 71, and the decoder 262 has an LDPC decoder 281 instead of the turbo decoder 81.

That is, the encoder 261 includes the LDPC encoder 271, an interleaver 72, and a 17PP encoder 171. The LDPC encoder 271 performs LDPC encoding on an input signal and supplies a resultant LDPC-encoded signal to the 17PP encoder 171 via the interleaver 72. The 17PP encoder 171 has a encoding table 201 associated with the variable-length 17PP code. The 17PP encoder 171 performs 17PP encoding on a signal received from the interleaver 72 in accordance with the 17PP encoding table 201 and outputs the resultant signal over the PR communication channel 12.

The decoder 262 includes an RP-SISO decoder 81, a 17PP-SISO decoder 181, a deinterleaver 83, and the LDPC decoder 281. The 17PP-SISO decoder 181 determines the trellis representation of the 17PP code in accordance with the 17PP encoding table 201 disposed in the 17PP encoder 171 and performs the SISO decoding on the signal supplied from the PR-SISO decoder 81 using the BCJR algorithm or the SOVA in accordance with the determined trellis representation of the 17PP code. A resultant SISO-decoded signal (soft information) is supplied to the LDPC decoder 281 via the deinterleaver 83.

The LDPC decoder 281 performs iterative decoding on the signal (soft information) received from the 17PP-SISO decoder 181 according to the SPA (Sum-Product Algorithm). A resultant decoded signal is output to a following stage (not shown).

As described above, the 17PP-SISO decoder 181 determines the trellis representation of the 17PP code and performs SISO decoding using the BCJR algorithm or the SOVA in accordance with the determined trellis representation of the 17PP code, and thus an LDPC code can be concatenated instead of a turbo code. That is, the recording/reproducing process can be performed using the LDPC code instead of the turbo code. The recording/reproducing apparatus constructed as shown in FIG. 19 also has better decoding performance than can be achieved by using only the 17PP code.

Figure 20:
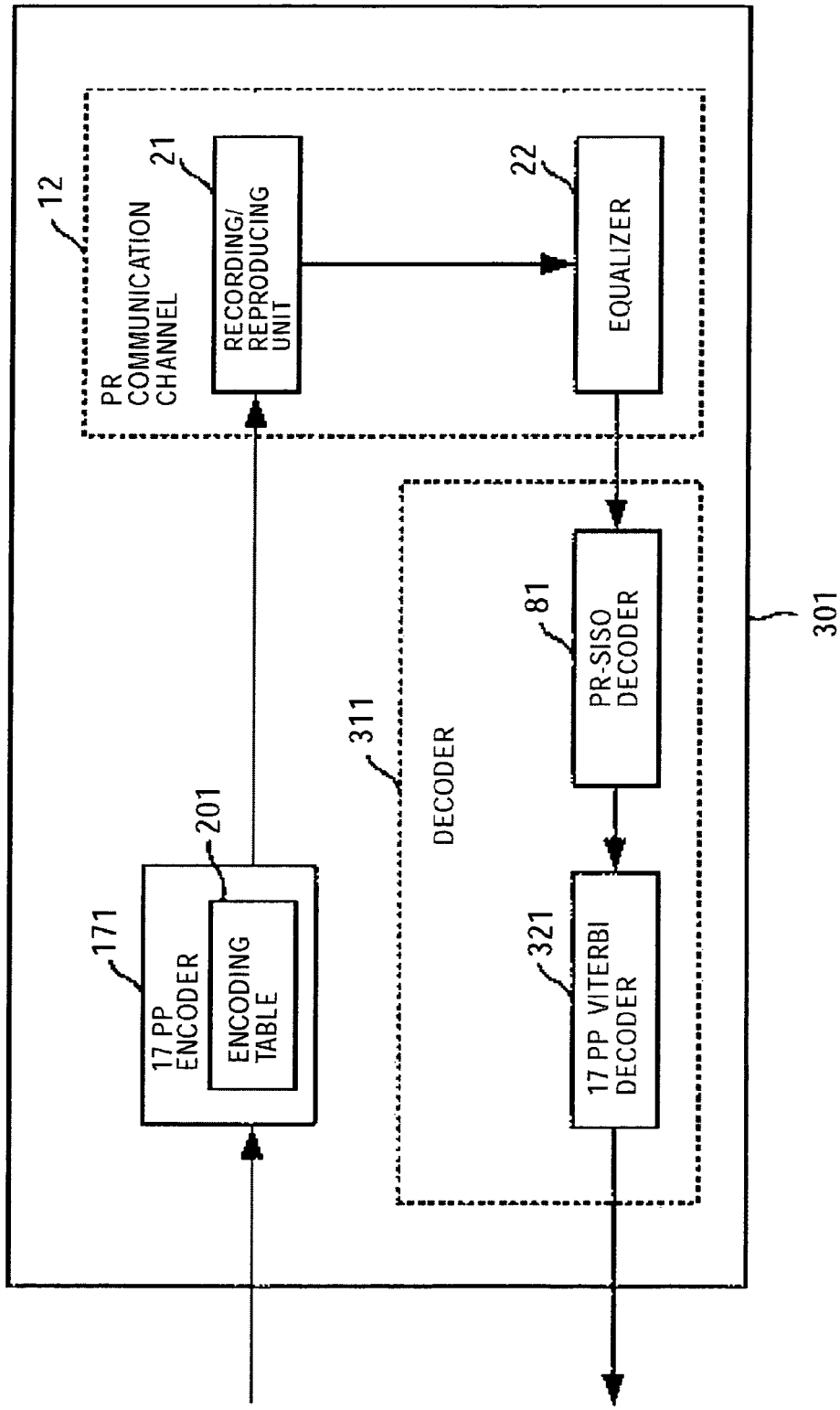
FIG. 20 is a block diagram showing still another embodiment of a recording/reproducing apparatus according to the present invention.

FIG. 20 shows another embodiment of a recording/reproducing apparatus 301 according to the present invention. The recording/reproducing apparatus 301 records and reproduces a signal on or from a storage medium such as an optical disk by using a 17PP code as a modulation code, as with the recording/reproducing apparatus 151. In FIG. 20, similar parts to those in FIG. 1 are denoted by similar reference symbols and a duplicate description thereof is omitted.

Figure 1:
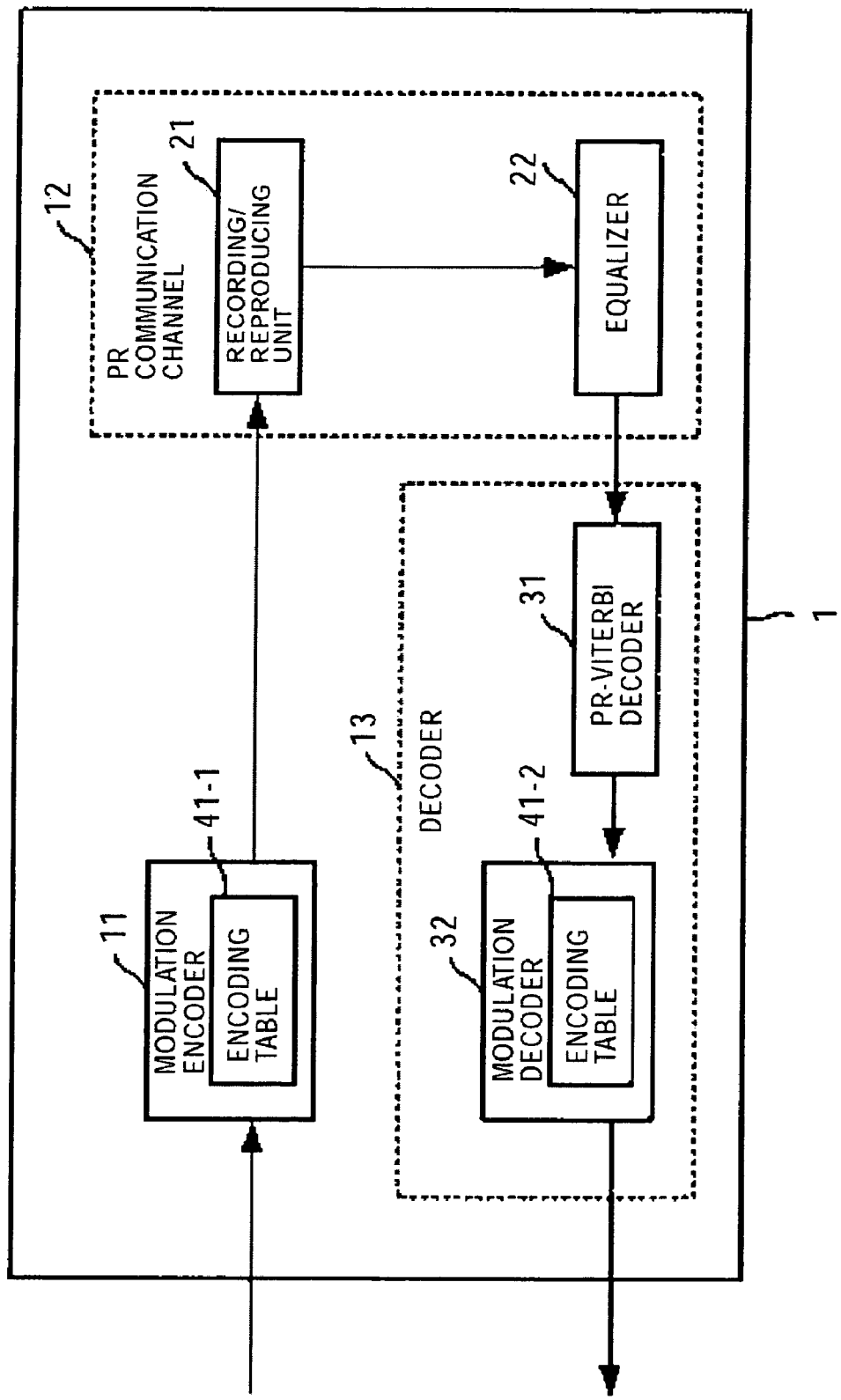
FIG. 1 is a block diagram showing an example of a conventional recording/reproducing apparatus.

That is, in the recording/reproducing apparatus 301 shown in FIG. 20 is similar to the recording/reproducing apparatus 1 shown in FIG. 1 except that the 17PP encoder 171 shown in FIG. 5 is used instead of the modulation encoder 11, and, in the decoder 311 of the recording/reproducing apparatus 301, the PR-SISO decoder 81 shown in FIG. 5 is used instead of the PR-Viterbi decoder 31 and the 17PP decoder 321 is used instead of the modulation decoder 32.

The 17PP encoder 171 has an encoding table 201 of the variable-length 17PP code. The 17PP encoder 171 performs 17PP encoding on a signal received from the interleaver 72 in accordance with the 17PP encoding table 201 and outputs the resultant signal over the PR communication channel 12.

The decoder 311 includes a PR-SISO decoder 81 and a 17PP Viterbi decoder 321. From the signal received from the PR communication channel 12, the PR-SISO decoder 81 determines, based on NRZI encoding and the PR-2 channel, the trellis representation indicating time-sequential state transitions in the time-to-time encoding process represented in the state transition table and then performs SISO decoding based on the determined trellis representation of the NRZI encoding and the PR-2 channel. The resultant SISO-decoded signal (soft information) is supplied to the 17PP-Viterbi decoder 321.

The 17PP Viterbi decoder 321 determines the trellis representation of the 17PP code based on the 17PP encoding table 201 disposed in the 17PP encoder 171 and performs soft-decision Viterbi decoding on the signal received from PR-SISO decoder 81 in accordance with the determined trellis representation of the 17PP code. A resultant soft-decision Viterbi-decoded signal is output to a following stage (not shown).

In the recording/reproducing apparatus 301, as described above, the 17PP code is used as the modulation code, and the trellis representation of the 17PP code is determined. Furthermore, based on the determined trellis representation of the 17PP code, soft-decision Viterbi decoding can be easily performed. Thus, the recording/reproducing apparatus 301 has better decoding performance than can be achieved by the recording/reproducing apparatus 1 shown in FIG. 1.

As described above, in a modulation code using a variable-length encoding table, the trellis representation is determined and used in soft-decision Viterbi decoding. This technique makes it possible to perform high-performance soft-decision Viterbi decoding by performing a realistic amount of calculation.

Furthermore, in a modulation code using a variable-length encoding table, the trellis representation is determined and used in SISO decoding using the BCJR decoding algorithm or the SOVA. This makes it possible to concatenate a code which needs soft information, such as a turbo code or an LDPC code, as an error correction code, and thus a further improvement in decoding performance can be achieved.

In the recording/reproducing apparatus 151 shown in FIG. 5 and also in the recording/reproducing apparatus 251 shown in FIG. 19, the trellis representations of state transitions of the 17PP code and the trellis representation of state transitions of the PR communication channel 12 may be combined into a single trellis representation, and decoding may be performed in accordance with the resultant trellis representation, in a similar manner as described in the Non-Patent Document 1. Soft information obtained as a result of the decoding may be supplied to the turbo code decoder or the LDPC code decoder located at the following stage. That is, in FIG. 5 or 19, the PR-SISO decoder 81 and the 17PP-SISO decoder 181 may be combined together into a single block as shown in FIG. 21.

Figure 21:
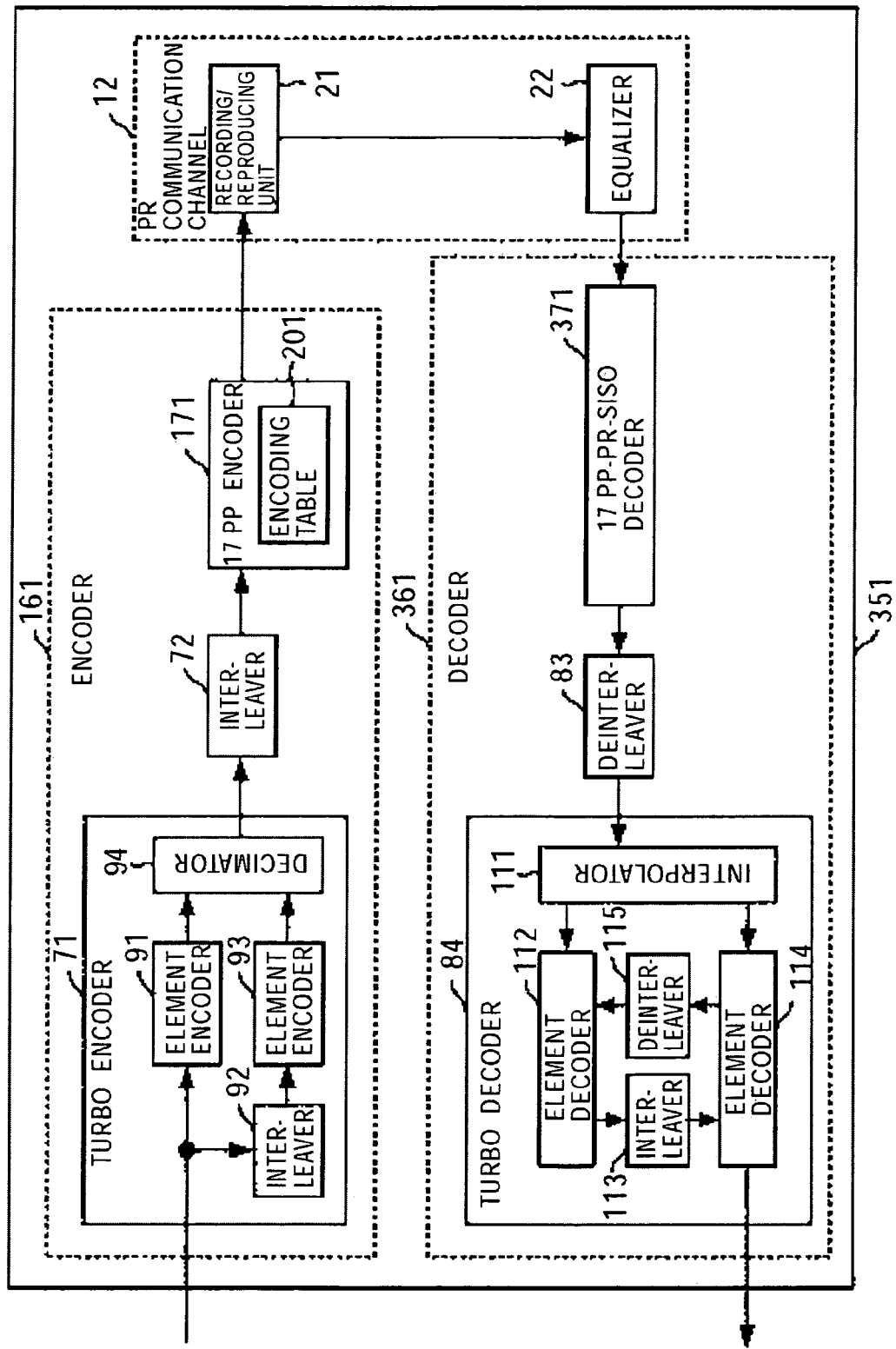
FIG. 21 is a block diagram showing an example of a modification of the recording/reproducing apparatus shown in FIG. 5.

FIG. 21 shows another embodiment of a recording/reproducing apparatus 351 according to the present invention. In FIG. 21, similar parts to those in FIG. 5 are denoted by similar reference symbols and a duplicate description thereof is omitted.

The recording/reproducing apparatus 351 shown in FIG. 21 has a decoder 361 that is similar to the decoder 162 of the recording/reproducing apparatus 151 described above with reference to FIG. 5 except that the PR-SISO decoder 81 and the 17PP-SISO decoder 181 are combined into a 17PP-PR-SISO decoder 371. Note that the PR communication channel 12 shown in FIG. 21 is not a PR2 (PR121) recording/reproducing channel but a PR1221 recording/reproducing channel.

As shown in FIG. 21, the PR communication channel 12 includes a recording/reproducing unit 21 and an equalizer 22, and performs a recording/reproducing process in the PR1221 recording/reproducing channel. The recording/reproducing unit 21 performs NRZI encoding on an encoded signal received from the 17PP encoder 171 and stores the resultant NRZI-coded signal on a storage medium mounted on or embedded in the recording/reproducing unit 21 by means of a mark edge recording method. On the other hand, in the reproduction operation, the recording/reproducing unit 21 reads the encoded signal from the storage medium via the PR1221 channel and supplies the read encoded signal to the equalizer 22. The equalizer 22 performs PR equalization using waveform interference on the supplied encoded signal so as to achieve a target equalization characteristic. The resultant equalized signal is supplied to the decoder 361.

The decoder 361 includes a 17PP-PR-SISO decoder 371, a deinterleaver 83, and a turbo decoder 84. The 17PP-PR-SISO decoder 371 performs SISO decoding on the signal supplied from the PR communication channel 12 using the BCJR algorithm or the SOVA in accordance with a combined trellis representation obtained by combining a trellis representation indicating time-sequential transitions in time-to-time encoding process of the NRZI encoding and the PR1221 channel and a trellis representation of the 17PP code determined on the basis of the 17PP code encoding table 201 disposed in the 17PP encoder 171 (hereinafter, this combined trellis representation will be referred to as the combined trellis representation of the 17PP code and the PR1221 channel (communication channel)). The resultant SISO-decoded signal (soft information) is supplied to the turbo decoder 84 via the deinterleaver 83.

The combined trellis representation of the 17PP code and the PR1221 channel is described in detail below with reference to FIGS. 22 to 25. This combined trellis representation is obtained by combining the trellis representation of the PP code having 15 states described earlier with reference to FIGS. 12 and 14 and the trellis representation of the PR1221 channel having 6 states (not shown) used by the PR-SISO decoder 81 to perform a recording/reproducing process in the PR1221 recording/reproducing channel in the PR communication channel 12 shown in FIG. 5.

Figure 24:
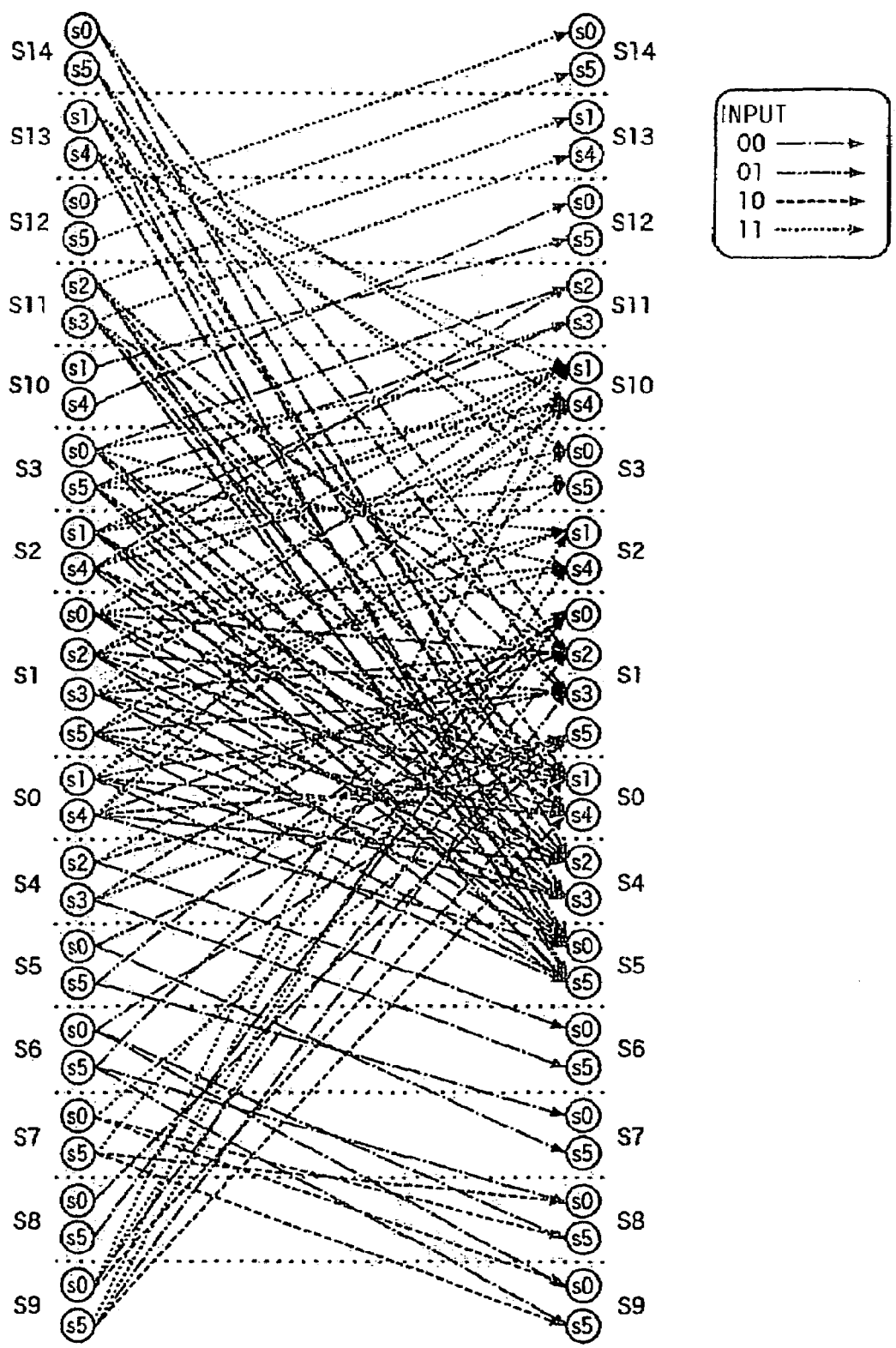
FIG. 24 is a diagram showing a combined trellis representation of state transition tables shown in FIGS. 22 and 23.
Figure 25:
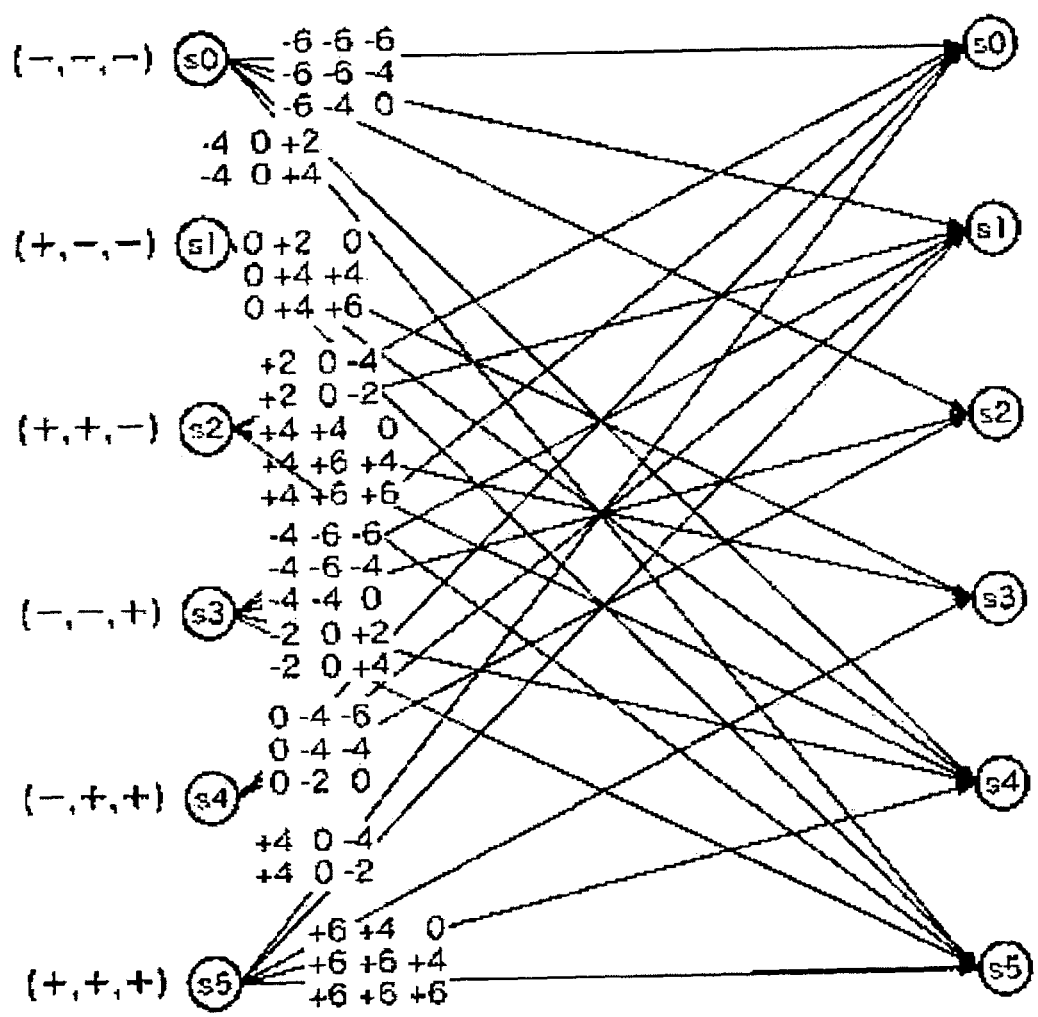
FIG. 25 is a diagram showing a summary of outputs in the combined trellis representation shown in FIG. 24.

FIGS. 22 and 23 shows an example of a set of state transition tables indicating an entire encoding process performed in a period from a current time to a next time. FIG. 24 shows an example of a trellis representation, that is, a representation of time-sequential transitions, of the set of state transition tables shown in FIGS. 22 and 23. FIG. 25 shows possible output signals in the combined trellis representation shown in FIG. 24.

In FIGS. 22 and 23, current-time state", "current-time output", "next-time state", and "next-time state" are described from right to left in each row. In each "current-time state" and also in each "next-time state", a numeral in a left-hand position indicates a state S of the 17PP code, and a numeral in a right-hand position indicates a state s of the PR1221 channel. In order to avoid a confusion between the state of the 17PP code and the state of the PR1221 channel, the state of the 17PP code is denoted by S (in upper case), and the state of the PR1221 channel is denoted by s (in lower case).

In the combined trellis representation shown in FIG. 24, states S of the 17PP code are described in outermost positions, states s of the PR1221 channel are described in respective circles, single-dotted arrows denote state transitions that can occur when the input signal is "00", double-dotted arrows denote state transitions that can occur when the input signal is "01", long dashed arrows denote state transitions that can occur when the input signal is "10", and short dashed arrows denote state transitions that can occur when the input signal is "11". For ease of illustration, signals output in the combined trellis representation in FIG. 24 are shown in FIG. 25.

FIG. 25 shows possible output signals in the combined trellis representation shown in FIG. 24. In FIG. 25, states s of the PR1221 channel are represented in respective circles, and a label on each arrow indicates a signal that is output when a transition occurs from one state of the PR1221 channel to another state in the combined trellis representation shown in FIG. 24. Symbols described in parentheses in the leftmost position indicate the states of three registers of the PR communication channel 12 in each state of the PR1221 channel. More specifically, the three registers of the PR communication channel 12 are in a state (−, −, −) when the PR1221 channel is in a state s0, a state (+, −, −) when the PR1221 channel is in a state s1, a state (+, +, −) when the PR1221 channel is in a state s2, a state (−, −, +) when the PR1221 channel is in a state s3, a state (−, +, +) when the PR1221 channel is in a state s4, and a state (+, +, +) when the PR1221 channel is in a state s5.

Each state transition shown in FIGS. 24 and 25 is described below in the same order as that described in the state transition table shown in FIG. 22. When the current state of the 17PP code is S0 and the current state of the PR1221 channel is s1 (that is, when the registers of the PR communication channel 12 are in a state (+, −, −)), if 01 is input, then 0, 2, 0 is output and the state of the 17PP code and the state of the PR1221 channel become S1 and s3, respectively, at the next time, but if 10 is input, then 0, 4, 4 is output and the state of the 17PP code and the state of the PR1221 channel become S0 and s4, respectively, at the next time. When the current state of the 17PP code is S0 and the current state of the PR1221 channel is s1, if 00 is input, 0, 4, 6 is output, and the state of the 17PP code and the state of the PR1221 channel become S5 and s5, respectively, at the next time, or 0, 2, 0 is output, and the state of the 17PP code and the state of the PR1221 channel become S4 and s3, respectively, at the next time. When the current state of the 17PP code is S0 and the current state of the PR1221 channel is s1, if 11 is input, then 0, 4, 6 is output, and the state of the 17PP code and the state of the PR1221 channel become S3 and s5, respectively, at the next time, or 0, 4, 4 is output, and the state of the 17PP code and the state of the PR1221 channel become S10 and s4, respectively, at the next time.

When the current state of the 17PP code is S0 and the current state of the PR1221 channel is s4 (that is, when the registers of the PR communication channel 12 are in a state (−, +, +)), if 01 is input, then 0, −2, 0 is output, and the state of the 17PP code and the state of the PR1221 channel become S1 and s2, respectively, at the next time, but if 10 is input, then 0, −4, −4 is output and the state of the 17PP code and the state of the PR1221 channel become S0 and s1, respectively, at the next time. When the current state of the 17PP code is S0 and the current state of the PR1221 channel is s4, if 00 is input, then 0, −4, −6 is output, and the state of the 17PP code and the state of the PR1221 channel become S5 and s0, respectively, at the next time, or 0, −2, 0 is output, and the state of the 17PP code and the state of the PR1221 channel become S4 and s2, respectively, at the next time. When the current state of the 17PP code is S0 and the current state of the PR1221 channel is s4, if 11 is input, then 0, −4, −6 is output, and the state of the 17PP code and the state of the PR1221 channel become S3 and s0, respectively, at the next time, or 0, −4, −4 is output, and the state of the 17PP code and the state of the PR1221 channel become S10 and s1, respectively, at the next time.

When the current state of the 17PP code is S1 and the current state of the PR1221 channel is s0 (that is, when the registers of the PR communication channel 12 are in a state (−, −, −)), if 01 is input, then −6, −4, 0 is output, and the state of the 17PP code and the state of the PR1221 channel become S1 and s2, respectively, at the next time, but if 10 is input, then −6, −6, −4 is output and the state of the 17PP code and the state of the PR1221 channel become S0 and s1, respectively, at the next time. When the current state of the 17PP code is S1 and the current state of the PR1221 channel is s0, if 00 is input, then −6, −6, −6 is output, and the state of the 17PP code and the state of the PR1221 channel become S5 and s0, respectively, at the next time, or −6, −4, 0 is output, and the state of the PR1221 channel become S4 and s2, respectively, at the next time. When the current state of the 17PP code is S1 and the current state of the PR1221 channel is s0, if 11 is input, then −4, 0, 2 is output, and the state of the 17PP code and the state of the PR1221 channel become S2 and s4, respectively, at the next time, or −6, −6, −4 is output, and the state of the 17PP code and the state of the PR1221 channel become S10 and s1, respectively, at the next time.

When the current state of the 17PP code is S1 and the current state of the PR1221 channel is s2 (that is, when the registers of the PR communication channel 12 are in a state (+, +, −)), if 01 is input, then 4, 4, 0 is output, and the state of the 17PP code and the state of the PR1221 channel become S1 and s3, respectively, at the next time, but if 10 is input, then 4, 6, 4 is output and the state of the 17PP code and the state of the PR1221 channel become S0 and s4, respectively, at the next time. When the current state of the 17PP code is S1 and the current state of the PR1221 channel is s2, if 00 is input, then 4, 6, 6 is output, and the state of the 17PP code and the state of the PR1221 channel become S5 and s5, respectively, at the next time, or 4, 4, 0 is output, and the state of the 17PP code and the state of the PR1221 channel become S4 and s3, respectively, at the next time. When the current state of the 17PP code is S1 and the current state of the PR1221 channel is s2, if 11 is input, then 2, 0, −2 is output, and the state of the 17PP code and the state of the PR1221 channel become S2 and s1, respectively, at the next time, or 4, 6, 4 is output, and the state of the 17PP code and the state of the PR1221 channel become S10 and s4, respectively, at the next time.

When the current state of the 17PP code is S1 and the current state of the PR1221 channel is s3 (that is, when the registers of the PR communication channel 12 are in a state (−, −, +)), if 01 is input, then −4, −4, 0 is output, and the state of the 17PP code and the state of the PR1221 channel become S1 and s2, respectively, at the next time, but if 10 is input, then −4, −6, −4 is output and the state of the 17PP code and the state of the PR1221 channel become S0 and s1, respectively, at the next time. When the current state of the 17PP code is S1 and the current state of the PR1221 channel is s3, if 00 is input, then −4, −6, −6 is output, and the state of the 17PP code and the state of the PR1221 channel become S5 and s0, respectively, at the next time, or −4, −4, 0 is output, and the state of the 17PP code and the state of the PR1221 channel become S4 and s2, respectively, at the next time. When the current state of the 17PP code is S1 and the current state of the PR1221 channel is s3, if 11 is input, then −2, 0, 2 is output, and the state of the 17PP code and the state of the PR1221 channel become S2 and s4, respectively, at the next time, or −4, −6, −4 is output, and the state of the 17PP code and the state of the PR1221 channel become S10 and s1, respectively, at the next time.

When the current state of the 17PP code is S1 and the current state of the PR1221 channel is s5 (that is, when the registers of the PR communication channel 12 are in a state (+, +, +)), if 01 is input, then 6, 4, 0 is output, and the state of the 17PP code and the state of the PR1221 channel become S1 and s3, respectively, at the next time, but if 10 is input, then 6, 6, 4 is output and the state of the 17PP code and the state of the PR1221 channel become S0 and s4, respectively, at the next time. When the current state of the 17PP code is S1 and the current state of the PR1221 channel is s5, if 00 is input, then 6, 6, 6 is output, and the state of the 17PP code and the state of the PR1221 channel become S5 and s5, respectively, at the next time, or 6, 4, 0 is output, and the state of the 17PP code and the state of the PR1221 channel become S4 and s3, respectively, at the next time. When the current state of the 17PP code is S1 and the current state of the PR1221 channel is s5, if 11 is input, then 4, 0, −2 is output, and the state of the 17PP code and the state of the PR1221 channel become S2 and s1, respectively, at the next time, or 6, 6, 4 is output, and the state of the 17PP code and the state of the PR1221 channel become S10 and s4, respectively, at the next time.

When the current state of the 17PP code is S2 and the current state of the PR1221 channel is s1 (that is, when the registers of the PR communication channel 12 are in a state (+, −, −)), if 01 is input, then 0, 2, 0 is output, and the state of the 17PP code and the state of the PR1221 channel become S11 and s3, respectively, at the next time, but if 10 is input, then 0, 4, 4 is output and the state of the 17PP code and the state of the PR1221 channel become S0 and s4, respectively, at the next time. When the current state of the 17PP code is S2 and the current state of the PR1221 channel is s1, if 00 is input, then 0, 4, 6 is output, and the state of the 17PP code and the state of the PR1221 channel become S5 and s5, respectively, at the next time, or 0, 2, 0 is output, and the state of the 17PP code and the state of the PR1221 channel become S4 and s3, respectively, at the next time. When the current state of the 17PP code is S2 and the current state of the PR1221 channel is s1, if 11 is input, then 0, 4, 6 is output, and the state of the 17PP code and the state of the PR1221 channel become S3 and s5, respectively, at the next time, or 0, 4, 4 is output, and the state of the 17PP code and the state of the PR1221 channel become S10 and s4, respectively, at the next time.

When the current state of the 17PP code is S2 and the current state of the PR1221 channel is s4 (that is, when the registers of the PR communication channel 12 are in a state (−, +, +)), if 01 is input, then 0, −2, 0 is output, and the state of the 17PP code and the state of the PR1221 channel become S11 and s2, respectively, at the next time, but if 10 is input, then 0, −4, −4 is output and the state of the 17PP code and the state of the PR1221 channel become S0 and s1, respectively, at the next time. When the current state of the 17PP code is S2 and the current state of the PR1221 channel is s4, if 00 is input, then 0, −4, −6 is output, and the state of the 17PP code and the state of the PR1221 channel become S5 and s0, respectively, at the next time, or 0, −2, 0 is output, and the state of the 17PP code and the state of the PR1221 channel become S4 and s2, respectively, at the next time. When the current state of the 17PP code is S2 and the current state of the PR1221 channel is s4, if 11 is input, then 0, −4, −6 is output, and the state of the 17PP code and the state of the PR1221 channel become S3 and s0, respectively, at the next time, or 0, −4, −4 is output, and the state of the 17PP code and the state of the PR1221 channel become S10 and s1, respectively, at the next time.

When the current state of the 17PP code is S3 and the current state of the PR1221 channel is s0 (that is, when the registers of the PR communication channel 12 are in a state (−, −, −)), if 01 is input, then −6, −4, 0 is output, and the state of the 17PP code and the state of the PR1221 channel become S11 and s2, respectively, at the next time, but if 10 is input, then −6, −6, −4 is output and the state of the 17PP code and the state of the PR1221 channel become S0 and s1, respectively, at the next time. When the current state of the 17PP code is S3 and the current state of the PR1221 channel is s0, if 00 is input, then −6, −6, −6 is output, and the state of the PR1221 channel become S5 and s0, respectively, at the next time, or −6, −4, 0 is output, and the state of the 17PP code and the state of the PR1221 channel become S4 and s2, respectively, at the next time. When the current state of the 17PP code is S3 and the current state of the PR1221 channel is s0, if 11 is input, then −4, 0, 2 is output, and the state of the 17PP code and the state of the PR1221 channel become S2 and s4, respectively, at the next time, or −6, −6, −4 is output, and the state of the 17PP code and the state of the PR1221 channel become S10 and s1, respectively, at the next time.

When the current state of the 17PP code is S3 and the current state of the PR1221 channel is s5 (that is, when the registers of the PR communication channel 12 are in a state (+, +, +)), if 01 is input, then 6, 4, 0 is output, and the state of the 17PP code and the state of the PR1221 channel become S11 and s3, respectively, at the next time, but if 10 is input, then 6, 6, 4 is output and the state of the 17PP code and the state of the PR1221 channel become S0 and s4, respectively, at the next time. When the current state of the 17PP code is S3 and the current state of the PR1221 channel is s5, if 00 is input, then 6, 6, 6 is output, and the state of the 17PP code and the state of the PR1221 channel become S5 and s5, respectively, at the next time, or 6, 4, 0 is output, and the state of the 17PP code and the state of the PR1221 channel become S4 and s3, respectively, at the next time. When the current state of the 17PP code is S3 and the current state of the PR1221 channel is s5, if 11 is input, then 4, 0, −2 is output, and the state of the 17PP code and the state of the PR1221 channel become S2 and s1, respectively, at the next time, or 6, 6, 4 is output, and the state of the 17PP code and the state of the PR1221 channel become S10 and s4, respectively, at the next time.

Each state transition shown in FIGS. 24 and 25 is further described below in the same order as that described in the state transition table shown in FIG. 23. When the current state of the 17PP code is S4 and the current state of the PR1221 channel is s2 (that is, when the registers of the PR communication channel 12 are in a state (+, +, −)), if 00 is input, then 2, 0, −4 is output, and the state of the 17PP code and the state of the PR1221 channel become S6 and s0, respectively, at the next time, but if 10 is input, then 4, 6, 6 is output and the state of the 17PP code and the state of the PR1221 channel become S1 and s5, respectively, at the next time. In the case in which 11 is input, 2, 0, −4 is output and the state of the 17PP code and the state of the PR1221 channel become S1 and s0, respectively, at the next time. When the current state of the 17PP code is S4 and the current state of the PR1221 channel is s3 (that is, when the registers of the PR communication channel 12 are in a state (−, −, +)), if 00 is input, then −2, 0, 4 is output, and the state of the 17PP code and the state of the PR1221 channel become S6 and s5, respectively, at the next time, but if 10 is input, then −4, −6, −6 is output and the state of the 17PP code and the state of the PR1221 channel become S1 and s0, respectively, at the next time. In the case in which 11 is input, −2, 0, 4 is output and the state of the 17PP code and the state of the PR1221 channel become S1 and s5, respectively, at the next time.

When the current state of the 17PP code is S5 and the current state of the PR1221 channel is s0 (that is, when the registers of the PR communication channel 12 are in a state (−, −, −)), if 00 is input, then −4, 0, 4 is output, and the state of the 17PP code and the state of the PR1221 channel become S7 and s5, respectively, at the next time, but if 01 is input, then −4, 0, 4 is output and the state of the 17PP code and the state of the PR1221 channel become S1 and s5, respectively, at the next time. When the current state of the 17PP code is S5 and the current state of the PR1221 channel is s5 (that is, when the registers of the PR communication channel 12 are in a state (+, +, +)), if 00 is input, then 4, 0, −4 is output, and the state of the 17PP code and the state of the PR1221 channel become S7 and s0, respectively, at the next time, but if 01 is input, then 4, 0, −4 is output and the state of the 17PP code and the state of the PR1221 channel become S1 and s0, respectively, at the next time.

When the current state of the 17PP code is S6 and the current state of the PR1221 channel is s0 (that is, when the registers of the PR communication channel 12 are in a state (−, −, −)), if 01 is input, then −4, 0, 4 is output, and the state of the 17PP code and the state of the PR1221 channel become S1 and s5, respectively, at the next time, but is 00 is input, then −4, 0, 4 is output, and the state of the 17PP code and the state of the PR1221 channel become S8 and s5, respectively, at the next time, or −6, −6, −6 is output, and the state of the 17PP code and the state of the PR1221 channel become S9 and s0, respectively, at the next time. When the current state of the 17PP code is S6 and the current state of the PR1221 channel is s5 (that is, when the registers of the PR communication channel 12 are in a state (+, +, +)), if 01 is input, then 4, 0, −4 is output, and the state of the 17PP code and the state of the PR1221 channel become S1 and s0, respectively, at the next time, but if 00 is input, then 4, 0, −4 is output, and the state of the 17PP code and the state of the PR1221 channel become S8 and s0, respectively, at the next time, or 6, 6, 6 is output, and the state of the 17PP code and the state of the PR1221 channel become S9 and s5, respectively, at the next time.

When the current state of the 17PP code is S7 and the current state of the PR1221 channel is s0 (that is, when the registers of the PR communication channel 12 are in a state (−, −, −)), if 11 is input, then −4, 0, 4 is output, and the state of the 17PP code and the state of the PR1221 channel become S1 and s5, respectively, at the next time, but if 10 is input, then −4, 0, 4 is output, and the state of the 17PP code and the state of the PR1221 channel become S8 and s5, respectively, at the next time, or −6, −6, −6 is output, and the state of the 17PP code and the state of the PR1221 channel become S9 and s0, respectively, at the next time. When the current state of the 17PP code is S7 and the current state of the PR1221 channel is s5 (that is, when the registers of the PR communication channel 12 are in a state (+, +, +)), if 11 is input, then 4, 0, −4 is output, and the state of the 17PP code and the state of the PR1221 channel become S1 and s0, respectively, at the next time, but if 10 is input, then 4, 0, −4 is output, and the state of the 17PP code and the state of the PR1221 channel become S8 and s0, respectively, at the next time, or 6, 6, 6 is output, and the state of the 17PP code and the state of the PR1221 channel become S9 and s5, respectively, at the next time.

When the current state of the 17PP code is S8 and the current state of the PR1221 channel is s0 (that is, when the registers of the PR communication channel 12 are in a state (−, −, −)), if 00 is input, then −4, 0, 4 is output, and the state of the 17PP code and the state of the PR1221 channel become S1 and s5, respectively, at the next time. When the current state of the 17PP code is S8 and the current state of the PR1221 channel is s5 (that is, when the registers of the PR communication channel 12 are in a state (+, +, +)), if 00 is input, then 4, 0, −4 is output, and the state of the 17PP code and the state of the PR1221 channel become S2 and s0, respectively, at the next time.

When the current state of the 17PP code is S9 and the current state of the PR1221 channel is s0 (that is, when the registers of the PR communication channel 12 are in a state (−, −, −)), if 01 is input, then −6, −4, 0 is output, and the state of the 17PP code and the state of the PR1221 channel become S1 and s2, respectively, at the next time, but if 10 is input, then −6, −6, −4 is output, and the state of the 17PP code and the state of the PR1221 channel become S0 and s1, respectively, at the next time. When the current state of the 17PP code is S9 and the current state of the PR1221 channel is s0, if 11 is input, then −4, 0, 2 is output, and the state of the 17PP code and the state of the PR1221 channel become S2 and s4, respectively, at the next time, or −6, −6, −4 is output, and the state of the 17PP code and the state of the PR1221 channel become S10 and s1, respectively, at the next time.

When the current state of the 17PP code is S9 and the current state of the PR1221 channel is s5 (that is, when the registers of the PR communication channel 12 are in a state (+, +, +)), if 01 is input, then 6, 4, 0 is output, and the state of the 17PP code and the state of the PR1221 channel become S1 and s3, respectively, at the next time, but if 10 is input, then 6, 6, 4 is output, and the state of the 17PP code and the state of the PR1221 channel become S0 and s4, respectively, at the next time. When the current state of the 17PP code is S9 and the current state of the PR1221 channel is s5, if 11 is input, then 4, 0, −2 is output, and the state of the 17PP code and the state of the PR1221 channel become S2 and s1, respectively, at the next time, or 6, 6, 4 is output, and the state of the 17PP code and the state of the PR1221 channel become S10 and s4, respectively, at the next time.

When the current state of the 17PP code is S10 and the current state of the PR1221 channel is s1 (that is, when the registers of the PR communication channel 12 are in a state (+, −, −)), if 01 is input, then 0, 4, 6 is output, and the state of the 17PP code and the state of the PR1221 channel become S12 and s5, respectively, at the next time. When the current state of the 17PP code is S10 and the current state of the PR1221 channel is s4 (that is, when the registers of the PR communication channel 12 are in a state (+, −, −)), if 01 is input, then 0, −4, −6 is output, and the state of the 17PP code and the state of the PR1221 channel become S12 and s0, respectively, at the next time.

When the current state of the 17PP code is S11 and the current state of the PR1221 channel is s2 (that is, when the registers of the PR communication channel 12 are in a state (+, +, −)), if 01 is input, then 4, 4, 0 is output, and the state of the 17PP code and the state of the PR1221 channel become S1 and s3, respectively, at the next time, but if 10 is input, then 4, 6, 4 is output and the state of the 17PP code and the state of the PR1221 channel become S0 and s4, respectively, at the next time. In the case in which 11 is input, 2, 0, −2 is output and the state of the 17PP code and the state of the PR1221 channel become S13 and s1, respectively, at the next time. When the current state of the 17PP code is S11 and the current state of the PR1221 channel is s2, if 00 is input, then 4, 6, 6 is output, and the state of the 17PP code and the state of the PR1221 channel become S5 and s5, respectively, at the next time, or 4, 4, 0 is output, and the state of the 17PP code and the state of the PR1221 channel become S4 and s3, respectively, at the next time.

When the current state of the 17PP code is S11 and the current state of the PR1221 channel is s3 (that is, when the registers of the PR communication channel 12 are in a state (−, −, +)), if 01 is input, then −4, −4, 0 is output, and the state of the 17PP code and the state of the PR1221 channel become S1 and s2, respectively, at the next time, but if 10 is input, then −4, −6, −4 is output and the state of the 17PP code and the state of the PR1221 channel become S0 and s1, respectively, at the next time. In the case in which 11 is input, −2, 0, 2 is output and the state of the 17PP code and the state of the PR1221 channel become S13 and s4, respectively, at the next time. When the current state of the 17PP code is S11 and the current state of the PR1221 channel is s3, if 00 is input, then −4, −6, −6 is output, and the state of the 17PP code and the state of the PR1221 channel become S5 and s0, respectively, at the next time, or −4, −4, 0 is output, and the state of the 17PP code and the state of the PR1221 channel become S4 and s2, respectively, at the next time.

When the current state of the 17PP code is S12 and the current state of the PR1221 channel is s0 (that is, when the registers of the PR communication channel 12 are in a state (−, −, −)), if 11 is input, then −6, −6, −6 is output, and the state of the 17PP code and the state of the PR1221 channel become S14 and s0, respectively, at the next time. When the current state of the 17PP code is S12 and the current state of the PR1221 channel is s5 (that is, when the registers of the PR communication channel 12 are in a state (+, +, +)), if 11 is input, then 6, 6, 6 is output, and the state of the 17PP code and the state of the PR1221 channel become S14 and s5, respectively, at the next time.

When the current state of the 17PP code is S13 and the current state of the PR1221 channel is s1 (that is, when the registers of the PR communication channel 12 are in a state (+, −, −)), if 10 is input, then 0, 4, 4 is output and the state of the 17PP code and the state of the PR1221 channel become S0 and s4, respectively, at the next time, but if 00 is input, then 0, 4, 6 is output and the state of the 17PP code and the state of the PR1221 channel become S5 and s5, respectively, at the next time. When the current state of the 17PP code is S13 and the current state of the PR1221 channel is s1, if 11 is input, then 0, 4, 6 is output, and the state of the 17PP code and the state of the PR1221 channel become S3 and s5, respectively, at the next time, or 0, 4, 4 is output, and the state of the 17PP code and the state of the PR1221 channel become S10 and s4, respectively, at the next time.

When the current state of the 17PP code is S13 and the current state of the PR1221 channel is s4 (that is, when the registers of the PR communication channel 12 are in a state (−, +, +)), if 10 is input, then 0, −4, −4 is output and the state of the 17PP code and the state of the PR1221 channel become S0 and s1, respectively, at the next time, but if 00 is input, then 0, −4, −6 is output and the state of the 17PP code and the state of the PR1221 channel become S5 and s0, respectively, at the next time. When the current state of the 17PP code is S13 and the current state of the PR1221 channel is s4, if 11 is input, then 0, −4, −6 is output, and the state of the 17PP code and the state of the PR1221 channel become S3 and s0, respectively, at the next time, or 0, −4, −4 is output, and the state of the 17PP code and the state of the PR1221 channel become S10 and s1, respectively, at the next time.

When the current state of the 17PP code is S14 and the current state of the PR1221 channel is s0 (that is, when the registers of the PR communication channel 12 are in a state (−, −, −)), if 01 is input, then −6, −4, 0 is output and the state of the 17PP code and the state of the PR1221 channel become S1 and s2, respectively, at the next time, but if 00 is input, then −6, −4, 0 is output and the state of the 17PP code and the state of the PR1221 channel become S4 and s2, respectively, at the next time. When the current state of the 17PP code is S14 and the current state of the PR1221 channel is s5 (that is, when the registers of the PR communication channel 12 are in a state (+, +, +)), if 01 is input, then 6, 4, 0 is output and the state of the 17PP code and the state of the PR1221 channel become S1 and s3, respectively, at the next time, but if 00 is input, then 6, 4, 0 is output and the state of the 17PP code and the state of the PR1221 channel become S4 and s3, respectively, at the next time.

As described above, the combined trellis of the 17PP code and the PR1221 channel can be represented in the form including 32 sets of states. If each set of states is represented by (state of 17PP code, state of PR 1221 channel), the 32 sets of states appear in the state transition tables shown in FIG. 22 and 23 in the order described below; (S0, s1), (S0, s4), (S1, s0), (S1, s2), (S1, s3), (S1, s5), (S2, s1), (S2, s4), (S3, s0), (S3, s5), (S4, s2), (S4, s3), (S5, s0), (S5, s5), (S6, s0), (S6, s5), (S7, s0), (S7, s5), (S8, s0), (S8, s5), (S9, s0), (S9, s5), (S10, s1), (S10, s4), (S11, s2), (S11, s3), (S12, s0), (S12, s5), (S13, s1), (S13, s4), (S14, s0), and (S14, s5). Note that a plurality of trellis representations, each of which is similar to that described above, can be serially connected in a similar manner to the manner in which a plurality of trellis representations having 21 states shown in FIG. 10 are serially connected, such that there is a one-to-one correspondence between overall transitions in the encoding process and full paths in the trellis representation, as in the combined trellis representation shown in FIG. 11. The Viterbi decoding or the BCJR decoding can be easily performed in accordance with the resultant serially connected trellis representation.

The trellis representation of the 17PP code has 15 states, while the trellis representation of the NRZI encoding and the PR1221 channel has 6 states. If the trellis representation of the 17PP code and the trellis representation of the PR1221 channel are simply combined together, the resultant trellis representation has 90 states. However, when the trellis representation of the 17PP code and the trellis representation of the NRZI encoding and the PR1221 channel are combined, the number of states can be reduced to 32. In the case of the PR-decoder 81 shown in FIG. 5, all state transitions are calculated. In contrast, in the present trellis representation, state transitions that are not allowed in the 17PP code are not calculated and state transitions that are equivalent to each other are not calculated in a duplicated manner. As a result, a less amount of calculation is required, and the calculation can be performed more easily by hardware or software. Furthermore, an improvement in decoding performance is achieved.

Figure 26:
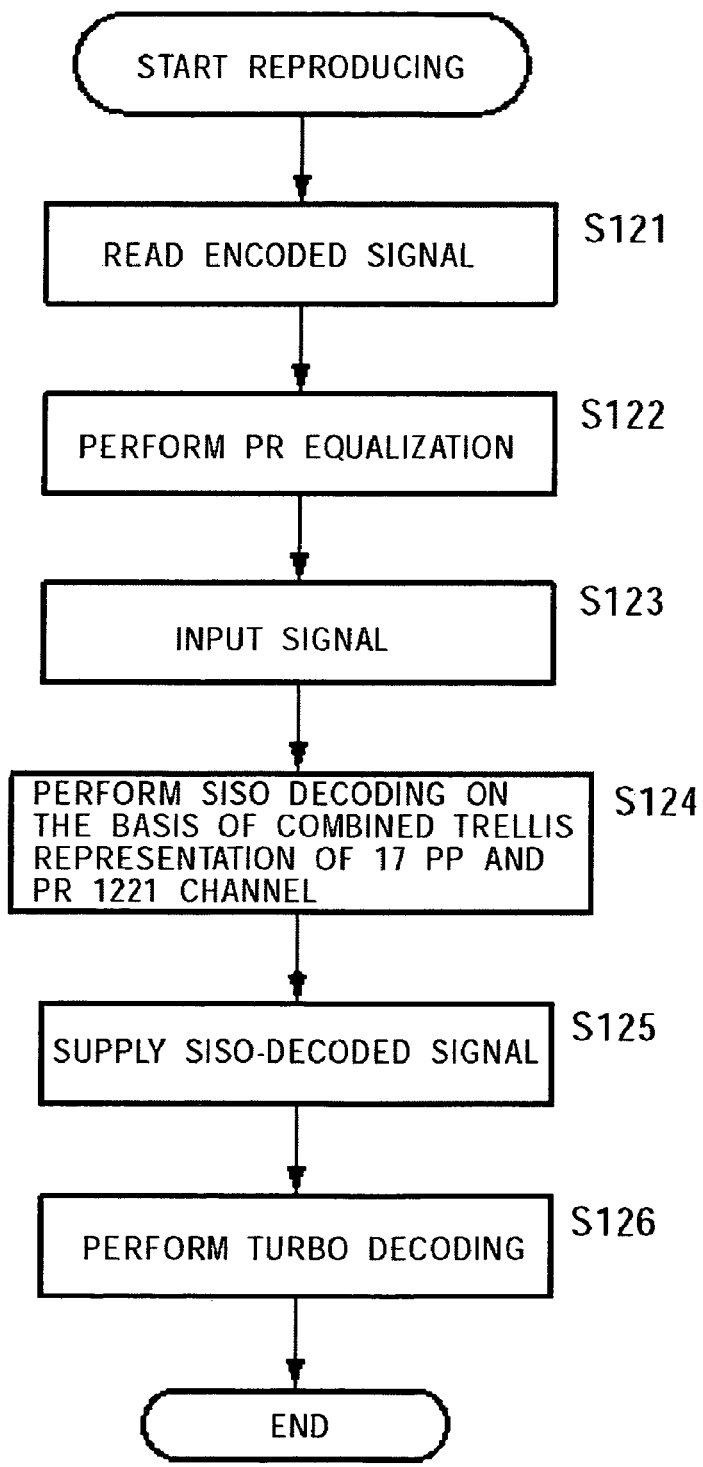
FIG. 26 is a flowchart showing a reproducing process performed by the recording/reproducing apparatus shown in FIG. 21.

Now, the reproducing process performed by the recording/reproducing apparatus 351 is described with reference to a flowchart shown in FIG. 26.

In step S121, the recording/reproducing unit 21 reads the encoded signal from the storage medium via the PR1221 channel and supplies the read encoded signal to the equalizer 22. After completion of step S121, the process proceeds to step S122. In step S122, the equalizer 22 performs PR equalization using waveform interference on the supplied encoded signal so as to achieve a target equalization characteristic. The resultant equalized signal is supplied to the decoder 361. Thereafter, the process proceeds to step S123.

In step S123, the 17PP-PR-SISO decoder 371 receives a signal form the PR communication channel 12. In the next step S124, the 17PP-PR-SISO decoder 371 determines the combined trellis representation of the 17PP code and the PR1221 channel, which is obtained by combining a trellis representation indicating time-sequential transitions in time-to-time encoding process of the NRZI encoding and the PR1221 channel and a trellis representation of the 17PP code determined on the basis of the 17PP code encoding table 201 disposed in the 17PP encoder 171, and the 17PP-PR-SISO decoder 371 performs SISO decoding on the signal received from the PR communication channel 12 by using the Viterbi decoding algorithm or the BCJR decoding algorithm in accordance with the determined combined trellis representation. In step S125, the 17PP-PR-SISO decoder 371 supplies the resultant SISO-decoded signal (soft information) to the turbo decoder 84 via the deinterleaver 83. After completion of step S125, the process proceeds to step S126.

In step S126, the turbo decoder 84 performs the turbo decoding process. This turbo decoding process is performed in a similar manner as in step S25 shown in FIG. 16, and thus a duplicate description thereof is omitted.

As described above, the combined trellis representation of the 17PP code and the PR-1221 channel, and the signal is SISO-decoded using the Viterbi decoding algorithm or the BCJR decoding algorithm in accordance with the combined trellis representation of the 17PP code and the PR1221 channel. This allows an improvement in decoding performance as shown in FIG. 27.

Figure 27:
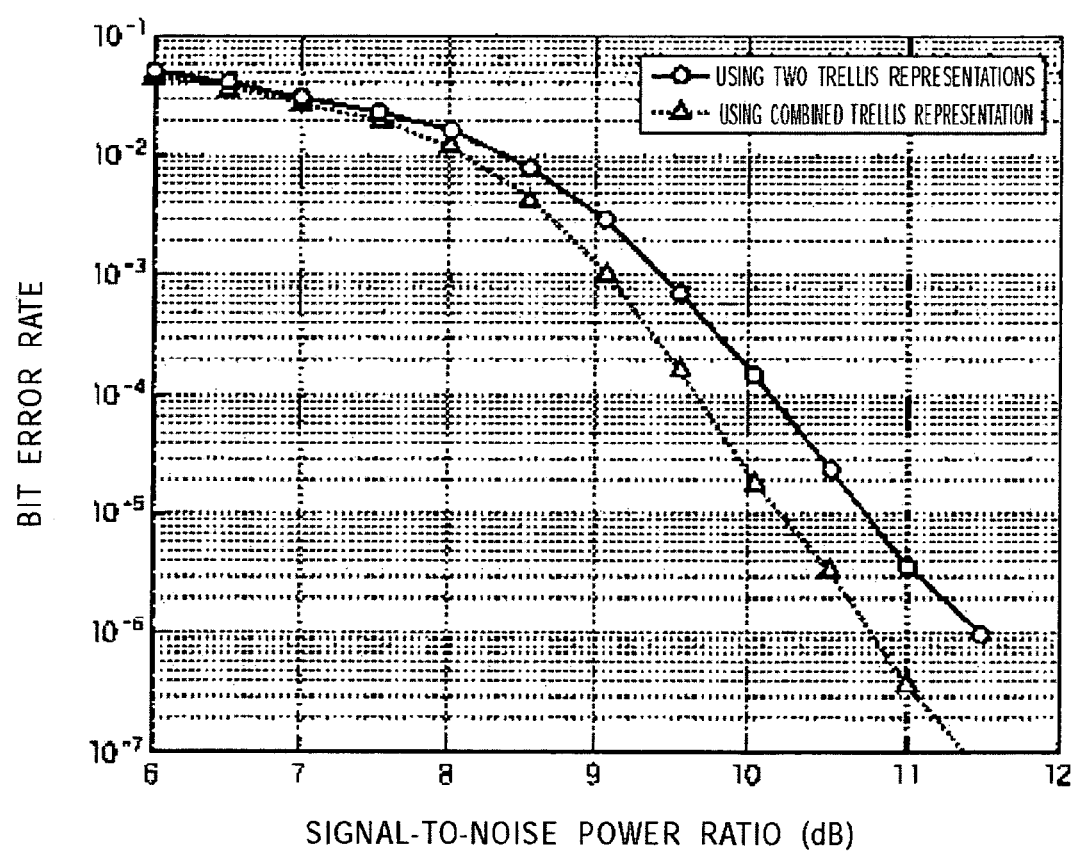
FIG. 27 is a diagram comparatively showing the bit error rate achieved in decoding by the recording/reproducing apparatus shown in FIG. 5 and that achieved in decoding by the recording/reproducing apparatus shown in FIG. 21.

FIG. 27 comparatively shows the decoding performance of the recording/reproducing apparatus 151 shown in FIG. 5 and that of the recording/reproducing apparatus 351 shown in FIG. 21. As described above, the recording/reproducing apparatus 151 performs the decoding process in accordance with the trellis representation of the NRZI encoding and the PR1221 channel and the trellis representation of the 17PP code. On the other hand, the recording/reproducing apparatus 351 performs the decoding process in accordance with the combined trellis representation of the 17PP code and the PR1221 channel.

In FIG. 27, the vertical axis represents the bit error rate, and the horizontal axis represents the signal-to-noise power ratio. A solid line represents the bit error rate indicating the decoding performance of the recording/reproducing apparatus 151 that performs the decoding process in accordance with the trellis representation of the NRZI encoding and the PR1221 channel and the trellis representation of the 17PP code. A dotted line represents the bit error rate indicating the decoding performance of the recording/reproducing apparatus 351 that performs the decoding process in accordance with the combined trellis representation of the 17PP code and the PR1221 channel. In FIG. 27, the number of information bits per turbo code is 1174, the encoding rate of the turbo code is 19/20, and the number of encoding iterations is 10.

It can be seen from FIG. 27 that the signal-to-noise power ratio allowed to obtain a bit error rate of $10^{-5}$ is about 10.7 (dB) in the recording/reproducing apparatus 151 shown in FIG. 5 and about 10.2 (dB) in the recording/reproducing apparatus 351 shown in FIG. 21. Thus, in the recording/reproducing apparatus 351 user of the combined trellis representation of the 17PP code and the PR1221 channel allows an encoding gain greater than about 0.5 (dB) than is achieved by the recording/reproducing apparatus 151 using the trellis representation of the NRZI encoding and the PR1221 channel and the trellis representation of the 17PP code.

In the present embodiment, as described above, the PR-SISO decoder 81 and the 17PP-SISO decoder 181 are combined into the signal block (17PP-PR-SISO decoder 371) as shown in FIG. 21, and the decoding process is performed in accordance with the combined trellis representation of the 17PP code and the PR1221 channel. In this decoding process, state transitions that are not allowed in the 17PP code are not calculated, and state transitions that are equivalent to each other are not calculated in a duplicated manner. As a result, decoding is performed in an optimum manner with a less amount of calculation, and the calculation can be performed more easily by hardware or software. Thus, better decoding performance is achieved than can be achieved by using the trellis representation of the PR1221 channel and the trellis representation of the 17PP code.

Although the combination of the 17PP code and the turbo code is used in the recording/reproducing apparatus 351 shown in FIG. 21, the combined trellis representation of the 17PP code and the PR1221 channel may also be used when the combination of the 17PP code and the LDPC code is used as in the recording/reproducing apparatus 251 shown in FIG. 19.

In the recording/reproducing apparatus 351 described above with reference to FIG. 21, the recording/reproducing process using the PR1221 recording/reproducing channel is performed in the PR communication channel 12, and the 17PP-PR-SISO decoder 371 performs the SISO decoding in accordance with the combined trellis representation of the 17PP code and the PR1221 channel. However, the recording/reproducing channel of the PR communication channel 12 is not limited to the PR1221 channel. For example, the PR communication channel 12 may perform a recording/reproducing process using a PR1221 (PR2) recording/reproducing channel. In this case, the 17PP-PR-SISO decoder 371 performs SISO decoding in accordance with the combined trellis representation of the 17PP code and the PR1221 channel.

The combined trellis representation of the 17PP code and the PR1221 channel is described in detail below with reference to FIGS. 28 and 29. The combined trellis representation of the 17PP code and the PR1221 channel is obtained by combining the trellis representation of the PP code having 15 states described earlier with reference to FIGS. 12 and 14 and the trellis representation of the PR121 channel having 4 states (not shown) used by the PR-SISO decoder 81 to perform a recording/reproducing process in the PR1221 recording/reproducing channel in the PR communication channel 12 shown in FIG. 5.

FIGS. 28 and 29 show state transition tables indicating, in the form of a set of tables, the combined trellis representation of the 17PP code and the PR1221 channel. The combined trellis representations of the 17PP code and the PR1221 channel can also be represented in a similar form to that in which the combined trellis of the 17PP code and the PR1221 is represented, as shown in FIGS. 24 and 25, although a further description of this form is not given herein.

In FIGS. 28 and 29, current-time state", "current-time output", "next-time state", and "next-time state" are described from right to left in each row. In each "current-time state" and also in each "next-time state", a numeral in a left-hand position indicates a state S of the 17PP code, and a numeral in a right-hand position indicates a state s of the PR1221 channel. In order to avoid a confusion between the state of the 17PP code and the state of the PR1221 channel, the state of the 17PP code is denoted by S (in upper case), and the state of the PR1221 channel is denoted by s (in lower case).

More specifically, in the state transition tables shown in FIGS. 28 and 29, it is described that when the current state of the 17PP code is S0 and the state of the PR121 channel is s1, if 01 is input, then 2, 2, −2 is output and the state of the 17PP code and the state of the PR121 channel become S1 and s0, respectively, at the next time, but if 10 is input, then 2, 4, 2 is output and the state of the 17PP code and the state of the PR1221 channel become S0 and s2, respectively, at the next time. When the current state of the 17PP code is S0 and the state of the PR121 channel is s1, if 00 is input, then 2, 4, 4 is output, and the state of the 17PP code and the state of the PR121 channel become S5 and s3, respectively, at the next time, or 2, 2, −2 is output, and the state of the 17PP code and the state of the PR121 channel become S4 and s0, respectively, at the next time. When the current state of the 17PP code is S0 and the state of the PR121 channel is s1, if 11 is input, then 2, 4, 4 is output, and the state of the 17PP code and the state of the PR1221 channel become S3 and s3, respectively, at the next time, or 2, 4, 2 is output, and the state of the 17PP code and the state of the PR121 channel become S10 and s2, respectively, at the next time.

When the current state of the 17PP code is S0 and the state of the PR121 channel is s2, if 01 is input, then −2, −2, 2 is output and the state of the 17PP code and the state of the PR1221 channel become S1 and s3, respectively, at the next time, but if 10 is input, then −2, −4, −2 is output, and the state of the 17PP code and the state of the PR121 channel become S0 and s1, respectively, at the next time. When the current state of the 17PP code is S0 and the state of the PR121 channel is s2, if 00 is input, then −2, −4, −4 is output, and the state of the 17PP code and the state of the PR121 channel become S5 and s0, respectively, at the next time, or −2, −2, 2 is output, and the state of the 17PP code and the state of the PR121 channel become S4 and s3, respectively, at the next time. When the current state of the 17PP code is S0 and the state of the PR121 channel is s2, if 11 is input, then −2, −4, −4 is output, and the state of the 17PP code and the state of the PR121 channel become S3 and s0, respectively, at the next time, or −2, −4, −2 is output, and the state of the 17PP code and the state of the PR121 channel become S10 and s1, respectively, at the next time.

When the current state of the 17PP code is S1 and the state of the PR121 channel is s0, if 01 is input, then −4, −2, 2 is output, and the state of the 17PP code and the state of the PR121 channel become S1 and s3, respectively, at the next time, but if 10 is input, then −4, −4, −2 is output and the state of the 17PP code and the state of the PR121 channel become S0 and s1, respectively, at the next time. When the current state of the 17PP code is S1 and the state of the PR121 channel is s0, if 00 is input, then −4, −4, −4 is output, and the state of the 17PP code and the state of the PR121 channel become S5 and s0, respectively, at the next time, or −4, −2, 2 is output, and the state of the 17PP code and the state of the PR121 channel become S4 and s3, respectively, at the next time. When the current state of the 17PP code is S1 and the state of the PR121 channel is s0, if 11 is input, then −2, 2, 2 is output, and the state of the 17PP code and the state of the PR121 channel become S2 and s2, respectively, at the next time, or −4, −4, −2 is output, and the state of the 17PP code and the state of the PR121 channel become S10 and s1, respectively, at the next time.

When the current state of the 17PP code is S1 and the state of the PR121 channel is s3, if 01 is input, then 4, 2, −2 is output, and the state of the 17PP code and the state of the PR121 channel become S1 and s0, respectively, at the next time, but if 10 is input, then 4, 4, 2 is output, and the state of the 17PP code and the state of the PR121 channel become S0 and s2, respectively, at the next time. When the current state of the 17PP code is S1 and the state of the PR121 channel is s3, if 00 is input, then 4, 4, 4 is output, and the state of the 17PP code and the state of the PR121 channel become S5 and s3, respectively, at the next time, or 4, 2, −2 is output, and the state of the 17PP code and the state of the PR121 channel become S4 and s0, respectively, at the next time. When the current state of the 17PP code is S1 and the state of the PR121 channel is s3, if 11 is input, then 2, −2, −2 is output, and the state of the 17PP code and the state of the PR121 channel become S2 and s1, respectively, at the next time, or 4, 4, 2 is output, and the state of the 17PP code and the state of the PR121 channel become S10 and s2, respectively, at the next time.

When the current state of the 17PP code is S2 and the state of the PR121 channel is s1, if 01 is input, then 2, 2, −2 is output and the state of the 17PP code and the state of the PR121 channel become S11 and s0, respectively, at the next time, but if 10 is input, then 2, 4, 2 is output, and the state of the 17PP code and the state of the PR121 channel become S0 and s2, respectively, at the next time. When the current state of the 17PP code is S2 and the state of the PR121 channel is s1, if 00 is input, then 2, 4, 4 is output, and the state of the 17PP code and the state of the PR121 channel become S5 and s3, respectively, at the next time, or 2, 2, −2 is output, and the state of the 17PP code and the state of the PR121 channel become S4 and s0, respectively, at the next time. When the current state of the 17PP code is S2 and the state of the PR121 channel is s1, if 11 is input, then 2, 4, 4 is output, and the state of the 17PP code and the state of the PR121 channel become S3 and s3, respectively, at the next time, or 2, 4, 2 is output, and the state of the 17PP code and the state of the PR121 channel become S10 and s2, respectively, at the next time.

When the current state of the 17PP code is S2 and the state of the PR121 channel is s2, if 01 is input, then −2, −2, 2 is output and the state of the 17PP code and the state of the PR121 channel become S1 and s3, respectively, at the next time, but if 10 is input, then −2, −4, −2 is output, and the state of the 17PP code and the state of the PR121 channel become S0 and s1, respectively, at the next time. When the current state of the 17PP code is S2 and the state of the PR221 channel is s2, if 00 is input, then −2, −4, −4 is output, and the state of the 17PP code and the state of the PR121 channel become S5 and s0, respectively, at the next time, or −2, −2, 2 is output, and the state of the 17PP code and the state of the PR121 channel become S4 and s3, respectively, at the next time. When the current state of the 17PP code is S2 and the state of the PR121 channel is s2, if 11 is input, then −2, −4, −4 is output, and the state of the 17PP code and the state of the PR121 channel become S3 and s0, respectively, at the next time, or −2, −4, −2 is output, and the state of the 17PP code and the state of the PR121 channel become S10 and s1, respectively, at the next time.

When the current state of the 17PP code is S3 and the state of the PR121 channel is s0, if 01 is input, then −4, −2, 2 is output, and the state of the 17PP code and the state of the PR121 channel become S1 and s3, respectively, at the next time, but if 10 is input, then −4, −4, −2 is output and the state of the 17PP code and the state of the PR121 channel become S0 and s1, respectively, at the next time. When the current state of the 17PP code is S3 and the state of the PR121 channel is s0, if 00 is input, then −4, −4, −4 is output, and the state of the 17PP code and the state of the PR121 channel become S5 and s0, respectively, at the next time, or −4, −2, 2 is output, and the state of the 17PP code and the state of the PR121 channel become S4 and s3, respectively, at the next time. When the current state of the 17PP code is S3 and the state of the PR121 channel is s0, if 11 is input, then −2, 2, 2 is output, and the state of the 17PP code and the state of the PR121 channel become S2 and s2, respectively, at the next time, or −4, −4, −2 is output, and the state of the 17PP code and the state of the PR121 channel become S10 and s1, respectively, at the next time.

When the current state of the 17PP code is S3 and the state of the PR121 channel is s3, if 01 is input, then 4, 2, −2 is output, and the state of the 17PP code and the state of the PR121 channel become S11 and s0, respectively, at the next time, but if 10 is input, then 4, 4, 2 is output and the state of the 17PP code and the state of the PR121 channel become S0 and s2, respectively, at the next time. When the current state of the 17PP code is S3 and the state of the PR121 channel is s3, if 00 is input, then 4, 4, 4 is output, and the state of the 17PP code and the state of the PR121 channel become S5 and s3, respectively, at the next time, or 4, 2, −2 is output, and the state of the 17PP code and the state of the PR121 channel become S4 and s0, respectively, at the next time. When the current state of the 17PP code is S3 and the state of the PR121 channel is s3, if 11 is input, then 2, −2, −2 is output, and the state of the 17PP code and the state of the PR121 channel become S2 and s1, respectively, at the next time, or 4, 4, 2 is output, and the state of the 17PP code and the state of the PR121 channel become S10 and s2, respectively, at the next time.

When the current state of the 17PP code is S4 and the state of the PR121 channel is s0, a transition occurs depending on the given input as follows. If 00 is input, then −2, 2, 4 is output, and the state of the 17PP code and the state of the PR121 channel become S6 and s3, respectively, at the next time. If 10 is input, then −4, −4, −4 is output and the state of the 17PP code and the state of the PR121 channel become S1 and s0, respectively, at the next time. If 11 is input, then −2, 2, 4 is output and the state of the 17PP code and the state of the PR121 channel become S1 and s3, respectively, at the next time.

When the current state of the 17PP code is S4 and the state of the PR121 channel is s3, a transition occurs depending on the given input as follows. If 00 is input, then 2, −2, −4 is output, and the state of the 17PP code and the state of the PR121 channel become S6 and s0, respectively, at the next time, If 10 is input, then 4, 4, 4 is output and the state of the 17PP code and the state of the PR121 channel become S1 and s3, respectively, at the next time. If 11 is input, then 2, −2, −4 is output and the state of the 17PP code and the state of the PR121 channel become S1 and s0, respectively, at the next time.

When the current state of the 17PP code is S5 and the state of the PR121 channel is s0, if 00 is input, then −2, 2, 4 is output, and the state of the 17PP code and the state of the PR121 channel become S7 and s3, respectively, at the next time, but if 01 is input, then −2, 2, 4 is output and the state of the 17PP code and the state of the PR121 channel become S1 and s3, respectively, at the next time.

When the current state of the 17PP code is S5 and the state of the PR121 channel is s3, if 00 is input, then 2, −2, −4 is output, and the state of the 17PP code and the state of the PR121 channel become S7 and s0, respectively, at the next time, but if 01 is input, then 2, −2, −4 is output and the state of the 17PP code and the state of the PR121 channel become S1 and s0, respectively, at the next time.

When the current state of the 17PP code is S6 and the state of the PR121 channel is s0, if 01 is input, then −2, 2, 4 is output, and the state of the 17PP code and the state of the PR121 channel become S1 and s3, respectively, at the next time, but if 00 is input, then −2, 2, 4 is output, and the state of the 17PP code and the state of the PR121 channel become S8 and s3, respectively, at the next time, or −4, −4, −4 is output, and the state of the 17PP code and the state of the PR121 channel become S9 and s0, respectively, at the next time.

When the current state of the 17PP code is S6 and the state of the PR121 channel is s3, if 01 is input, then 2, −2, −4 is output, and the state of the 17PP code and the state of the PR121 channel become S1 and s0, respectively, at the next time, but if 00 is input, then 2, −2, −4 is output, and the state of the 17PP code and the state of the PR121 channel become S8 and s0, respectively, at the next time, or 4, 4, 4 is output, and the state of the 17PP code and the state of the PR121 channel become S9 and s3, respectively, at the next time.

When the current state of the 17PP code is S7 and the state of the PR121 channel is s0, if 11 is input, then −2, 2, 4 is output and the state of the 17PP code and the state of the PR121 channel become S1 and s3, respectively, at the next time, but if 10 is input, then −2, 2, 4 is output, and the state of the 17PP code and the state of the PR121 channel become S8 and s3, respectively, at the next time, or −4, −4, −4 is output, and the state of the 17PP code and the state of the PR121 channel become S9 and s0, respectively, at the next time.

When the current state of the 17PP code is S7 and the state of the PR121 channel is s3, if 11 is input, then 2, −2, −4 is output, and the state of the 17PP code and the state of the PR121 channel become S1 and s0, respectively, at the next time, but if 10 is input, then 2, −2, −4 is output, and the state of the 17PP code and the state of the PR121 channel become S8 and s0, respectively, at the next time, or 4, 4, 4 is output, and the state of the 17PP code and the state of the PR121 channel become S9 and s3, respectively, at the next time.

When the current state of the 17PP code is S8 and the state of the PR121 channel is s0, if 00 is input, then −2, 2, 4 is output, and the state of the 17PP code and the state of the PR121 channel become S1 and s3, respectively, at the next time. When the current state of the 17PP code is S8 and the state of the PR121 channel is s3, if 00 is input, then 2, −2, −4 is output, and the state of the 17PP code and the state of the PR121 channel become S1 and s0, respectively, at the next time.

When the current state of the 17PP code is S9 and the state of the PR121 channel is s0, if 01 is input, then −4, −2, 2 is output, and the state of the 17PP code and the state of the PR121 channel become S1 and s3, respectively, at the next time, but if 10 is input, then −4, −4, −2 is output and the state of the 17PP code and the state of the PR121 channel become S0 and s1, respectively, at the next time. When the current state of the 17PP code is S9 and the state of the PR121 channel is s0, if 11 is input, then −2, 2, 2 is output, and the state of the 17PP code and the state of the PR121 channel become S2 and s2, respectively, at the next time, or −4, −4, −2 is output, and the state of the 17PP code and the state of the PR121 channel become S10 and s1, respectively, at the next time.

When the current state of the 17PP code is S9 and the state of the PR121 channel is s3, if 01 is input, then 4, 2, −2 is output, and the state of the 17PP code and the state of the PR121 channel become S1 and s0, respectively, at the next time, but if 10 is input, then 4, 4, 2 is output and the state of the 17PP code and the state of the PR121 channel become S0 and s2, respectively, at the next time. When the current state of the 17PP code is S9 and the state of the PR121 channel is s3, if 11 is input, then 2, −2, −2 is output, and the state of the 17PP code and the state of the PR121 channel become S2 and s1, respectively, at the next time, or 4, 4, 2 is output, and the state of the 17PP code and the state of the PR121 channel become S10 and s2, respectively, at the next time.

When the current state of the 17PP code is S10 and the state of the PR121 channel is s1, if 01 is input, then 2, 2, 4 is output, and the state of the 17PP code and the state of the PR121 channel become S12 and s3, respectively, at the next time. When the current state of the 17PP code is S10 and the state of the PR121 channel is s2, if 01 is input, then −2, −4, −4 is output, and the state of the 17PP code and the state of the PR121 channel become S12 and s0, respectively, at the next time.

When the current state of the 17PP code is S11 and the state of the PR121 channel is s0, if 01 is input, then −4, −2, 2 is output, and the state of the 17PP code and the state of the PR121 channel become S1 and s3, respectively, at the next time, but if 10 is input, then −4, −4, −2 is output and the state of the 17PP code and the state of the PR121 channel become S0 and s1, respectively, at the next time. When the current state of the 17PP code is S11 and the state of the PR121 channel is s0, if 11 is input, then −2, 2, 2 is output, and the state of the 17PP code and the state of the PR121 channel become S13 and s2, respectively, at the next time. When the current state of the 17PP code is S11 and the state of the PR121 channel is s0, if 00 is input, then −4, −4, −4 is output, and the state of the 17PP code and the state of the PR121 channel become S5 and s0, respectively, at the next time, or −4, −2, 2 is output, and the state of the 17PP code and the state of the PR121 channel become S4 and s3, respectively, at the next time.

When the current state of the 17PP code is S11 and the state of the PR121 channel is s3, if 01 is input, then 4, 2, −2 is output, and the state of the 17PP code and the state of the PR121 channel become S1 and s0, respectively, at the next time, but if 10 is input, then 4, 4, 2 is output and the state of the 17PP code and the state of the PR121 channel become S0 and s2, respectively, at the next time. When the current state of the 17PP code is S11 and the state of the PR121 channel is s3, if 11 is input, then 2, −2, −2 is output, and the state of the 17PP code and the state of the PR121 channel become S13 and s1, respectively, at the next time. When the current state of the 17PP code is S11 and the state of the PR121 channel is s3, if 00 is input, then 4, 4, 4 is output, and the state of the 17PP code and the state of the PR121 channel become S5 and s3, respectively, at the next time, or 4, 2, −2 is output, and the state of the 17PP code and the state of the PR121 channel become S4 and s0, respectively, at the next time.

When the current state of the 17PP code is S12 and the state of the PR121 channel is s0, if 11 is input, then −4, −4, −4 is output, and the state of the 17PP code and the state of the PR121 channel become S14 and s0, respectively, at the next time. When the current state of the 17PP code is S12 and the state of the PR121 channel is s3, if 11 is input, then 4, 4, 4 is output, and the state of the 17PP code and the state of the PR121 channel become S14 and s3, respectively, at the next time.

When the current state of the 17PP code is S13 and the state of the PR121 channel is s1, if 10 is input, then 2, 4, 2 is output, and the state of the 17PP code and the state of the PR121 channel become S0 and s2, respectively, at the next time, but if 00 is input, then 2, 4, 4 is output and the state of the 17PP code and the state of the PR121 channel become S5 and s3, respectively, at the next time. When the current state of the 17PP code is S13 and the state of the PR121 channel is s1, if 11 is input, then 2, 4, 4 is output, and the state of the 17PP code and the state of the PR121 channel become S3 and s3, respectively, at the next time, or 2, 4, 2 is output, and the state of the 17PP code and the state of the PR121 channel become S10 and s2, respectively, at the next time.

When the current state of the 17PP code is S13 and the state of the PR121 channel is s2, if 10 is input, then −2, −4, −2 is output, and the state of the 17PP code and the state of the PR121 channel become S0 and s1, respectively, at the next time, but if 00 is input, then −2, −4, −4 is output and the state of the 17PP code and the state of the PR121 channel become S5 and s0, respectively, at the next time. When the current state of the 17PP code is S13 and the state of the PR121 channel is s2, if 11 is input, then −2, −4, −4 is output, and the state of the 17PP code and the state of the PR121 channel become S3 and s0, respectively, at the next time, or −2, −4, −2 is output, and the state of the 17PP code and the state of the PR121 channel become S10 and s1, respectively, at the next time.

When the current state of the 17PP code is S14 and the state of the PR121 channel is s0, if 01 is input, then −4, −2, 2 is output, and the state of the 17PP code and the state of the PR121 channel become S1 and s3, respectively, at the next time, but if 00 is input, then −4, −2, 2 is output and the state of the 17PP code and the state of the PR121 channel become S4 and s3, respectively, at the next time.

When the current state of the 17PP code is S14 and the state of the PR121 channel is s3, if 01 is input, then 4, 2, −2 is output, and the state of the 17PP code and the state of the PR121 channel become S1 and s0, respectively, at the next time, but if 00 is input, then 4, 2, −2 is output and the state of the 17PP code and the state of the PR121 channel become S4 and s0, respectively, at the next time.

As described above, the combined trellis of the 17PP code and the PR121 channel can be represented in the form including 30 sets of states. If each set of states is represented by (state of 17PP code, state of PR 121 channel), the 30 sets of states appear in the state transition tables shown in FIG. 28 and 29 in the order described below: (S0, s1), (S0, s2), (S1, s0), (S1, s3), (S2, s1), (S2, s2), (S3, s0), (S3, s3), (S4, s0), (S4, s3), (S5, s0), (S5, s3), (S6, s0), (S6, s3), (S7, s0), (S7, s3), (S8, s0), (S8, s3), (S9, s0), (S9, s3), (S10, s1), (S10, s2), (S1, s0), (S11, s3), (S12, s0), (S12, s3), (S13, s1), (S13, s2), (S14, s0), and (S14, s3). Note that a plurality of trellis representations, each of which is similar to that described above, can be serially connected in a similar manner to the manner in which a plurality of trellis representations having 21 states shown in FIG. 10 are serially connected, such that there is a one-to-one correspondence between overall transitions in the encoding process and full paths in the trellis representation, as in the combined trellis representation shown in FIG. 11. The Viterbi decoding or the BCJR decoding can be easily performed in accordance with the resultant serially connected trellis representation.

The trellis representation of the 17PP code has 15 states, while the trellis representation of the NRZI encoding and the PR1221 channel has 4 states. If the trellis representation of the 17PP code and the trellis representation of the PR1221 channel are simply combined together, the resultant trellis representation has 60 states. However, when the trellis representation of the 17PP code and the trellis representation of the NRZI encoding and the PR121 channel are combined, the number of states can be reduced to 30. Therefore, in this decoding process, as with the combined trellis representation of the 17PP code and the PR1221 channel, a large reduction in amount of calculation is achieved. That is, in the present decoding process, state transitions that are not allowed in the 17PP code are not calculated, although those state transitions are calculated by PR-SISO decoder 81 of the recording/reproducing apparatus 151 shown in FIG. 5. Furthermore, duplicated calculations of state transitions that are equivalent to each other are avoided. As a result, decoding is performed in an optimum manner with a less amount of calculation, and the calculation can be performed more easily by hardware or software. Furthermore, an improvement in decoding performance is achieved.

In the embodiments described above, each decoder determines a trellis representation when SISO decoding is performed. Alternatively, the trellis representation may be determined in advance, and SISO decoding may be performed using the predetermined trellis representation.

In the embodiments described above, it is assumed that encoding and decoding are performed in a recording/reproducing apparatus. However, the encoding and decoding according to the present invention is not limited to the recording/reproducing process. The present invention can also be applied to encoding and decoding performed in a transmission system in which an encoded signal is transmitted via a network.

The above-described processes may be performed by hardware or software. In the case in which the process is performed by software, the recording/reproducing apparatus 151 shown in FIG. 5, the recording/reproducing apparatus 251 shown in FIG. 19, the recording/reproducing apparatus 301 shown in FIG. 20, and the recording/reproducing apparatus 351 shown in FIG. 21 each may be realized, for example, in the form of a recording/reproducing apparatus 401 such as that shown in FIG. 30.

Figure 30:
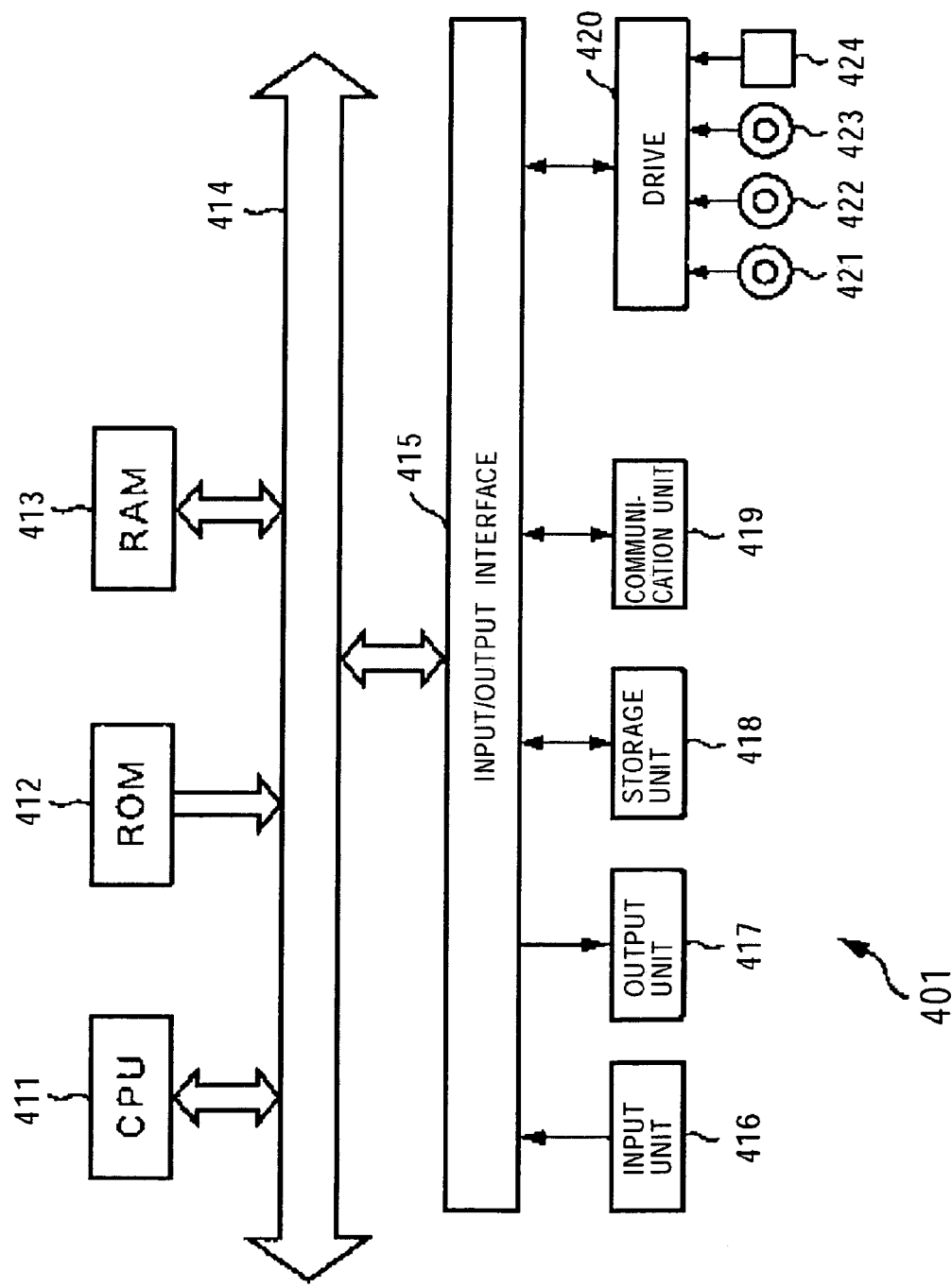
FIG. 30 is a block diagram showing another embodiment of a recording/reproducing apparatus according to the present invention.

As shown in FIG. 30, a CPU (Central Processing Unit) 411 performs various processes in accordance with a program stored in a ROM (Read Only Memory) 412 or in accordance with a program loaded into a RAM (Random Access Memory) 413 from a storage unit 418. The RAM 413 is also used to store data necessary for the CPU 411 to perform the processes.

The CPU 411, the ROM 412, and the RAM 413 are connected to each other via a bus 414. The bus 414 is also connected to an input/output interface 415.

The input/output interface 415 is connected to an input unit 416 including a keyboard, a mouse, and/or the like, an output unit 417 including a display such as a CRT (Cathode Ray Tube) or an LCD (Liquid Crystal Display), a loudspeaker, and/or the like, the storage unit 418 such as a hard disk, and a communication unit 419 including a modem, a terminal adapter, and/or the like. The communication unit 419 allows communication via networks (not shown).

The input/output interface 415 is also connected to a drive 420, as required. A storage medium such as a magnetic disk 421, an optical disk 422, a magnetooptical disk 423, or a semiconductor memory 424 is mounted on the drive 420 as required, and a computer program is read from the storage medium and installed into the storage unit 418, as required.

When the processing sequence is executed by software, a program forming the software may be installed from a storage medium or via a network onto a computer which is provided as dedicated hardware or may be installed onto a general-purpose computer capable of performing various processes in accordance with various programs installed thereon.

Specific examples of storage media usable for the above purpose include, as shown in FIG. 30, a magnetic disk 421 (such as a floppy disk), an optical disk 422 (such as a CD-ROM (Compact Disk-Read Only Memory) and a DVD (Digital Versatile Disk)), a magnetooptical disk 423 (such as an MD (Mini-Disk, trademark)), and a semiconductor memory 424, in the form of a package medium in which a program is stored and which is supplied to a user separately from a computer. A program may also be supplied to a user by preinstalling it on a built-in ROM 412 or a storage unit 418 such as a hard disk disposed in the computer.

A sequence of processing steps described above may or may not be performed time-sequentially in the same order as the order in which steps are described above. For example, steps may be performed in a parallel fashion or a separate fashion.

INDUSTRIAL APPLICABILITY

According to the present invention, it is possible to perform SISO decoding on a modulation code encoded in accordance with a variable-length table, and an improvement in decoding performance is achieved. Furthermore, according to the present invention, it is possible to use a combination of a modulation code based on a variable-length table and a turbo code or an LDPC code, which allows an improvement in decoding performance.

The invention claimed is:

1. A decoding apparatus for decoding a modulation code encoded in accordance with a variable-length table in which input bit lengths are variable, comprising:
    code input means for inputting the modulation code; and
    decoding means for decoding the modulation code input via the code input means; wherein
    the decoding means decodes the modulation code on the basis of a modulation code trellis represented by paths corresponding in a one-to-one fashion to overall state transitions in the encoding process of the modulation code in accordance with the variable-length table.

2. A decoding apparatus according to claim 1, wherein the modulation code is a 17PP (Parity Preserve/Prohibit Repeated Minimum Transition Runlength) modulation code.

3. A decoding apparatus according to claim 1, wherein the decoding means performs the decoding using a soft input.

4. A decoding apparatus according to claim 3, wherein the decoding means performs the decoding using a soft-decision Viterbi algorithm.

5. A decoding apparatus according to claim 3, wherein the decoding means performs soft output decoding.

6. A decoding apparatus according to claim 5, wherein the decoding means performs the decoding using a BCJR (Bahl-Cocke-Jeinek-Raviv) algorithm.

7. A decoding apparatus according to claim 5, wherein the decoding means performs the decoding using a SOVA (Soft-Output Viterbi Algorithm).

8. A decoding apparatus according to claim 1, wherein
the code input means inputs a PR (Partial Response)-equalized modulation code; and
the decoding means decodes the modulation code in accordance with a combined trellis obtained by combining a PR trellis and a modulation code trellis.

9. A decoding method for decoding a modulation code encoded in accordance with a variable-length table in which input bit lengths are variable, comprising the steps of:
inputting the modulation code; and
decoding the modulation code input in the code input step, wherein
in the decoding step, the modulation code is decoded based on a modulation code trellis represented by paths corresponding in a one-to-one fashion to overall state transitions in the encoding process of the modulation code in accordance with the variable-length table.

10. A computer readable medium including a program stored therein for causing a computer to perform a decoding process on a modulation code encoded in accordance with a variable-length table in which input bit lengths are variable, the program comprising the steps of:
inputting the modulation code; and
decoding the modulation code input in the code input step, wherein
in the decoding step, the modulation code is decoded based on a modulation code trellis represented by paths corresponding in a one-to-one fashion to overall state transitions in the encoding process of the modulation code in accordance with the variable-length table.

11. A program storing on computer readable medium for causing a computer to perform a decoding process on a modulation code encoded in accordance with a variable-length table in which input bit lengths are variable, comprising the steps of:
inputting the modulation code; and
decoding the modulation code input in the code input step, wherein
in the decoding step, the modulation code is decoded based on a modulation code trellis represented by paths corresponding in a one-to-one fashion to overall state transitions in the encoding process of the modulation code in accordance with the variable-length table.

* * * * *